US009735127B2

(12) United States Patent
Danno et al.

(10) Patent No.: US 9,735,127 B2
(45) Date of Patent: Aug. 15, 2017

(54) SEMICONDUCTOR DEVICE AND ELECTRONIC DEVICE

(71) Applicant: Renesas Electronics Corporation, Koutou-ku, Tokyo (JP)

(72) Inventors: Tadatoshi Danno, Tokyo (JP); Atsushi Nishikizawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/211,421

(22) Filed: Jul. 15, 2016

(65) Prior Publication Data
US 2017/0077069 A1    Mar. 16, 2017

(30) Foreign Application Priority Data
Sep. 11, 2015  (JP) ................ 2015-179483

(51) Int. Cl.
*H01L 21/48*    (2006.01)
*H01L 23/00*    (2006.01)
(Continued)

(52) U.S. Cl.
CPC .......... *H01L 24/73* (2013.01); *H01L 21/4853* (2013.01); *H01L 23/047* (2013.01); *H01L 23/3675* (2013.01); *H01L 23/49575* (2013.01); *H01L 23/49827* (2013.01); *H01L 23/49844* (2013.01); *H01L 24/09* (2013.01); *H01L 24/33* (2013.01); *H01L 24/45* (2013.01); *H01L 24/49* (2013.01); *H01L 23/3121* (2013.01);
(Continued)

(58) Field of Classification Search
CPC . H01L 25/072; H01L 25/0652; H01L 25/065; H01L 25/0655; H01L 25/0657; H01L 25/071; H01L 25/115; H01L 2225/04; H01L 2225/06565; H01L 2225/06582; H01L 2224/06803; H01L 2224/97; H01L 23/49541; H01L 23/49548; H01L 23/49503; H01L 23/3107; H01L 2224/48257; H01L 2224/48137; H01L 24/06; H01L 23/49575; H01L 24/49; H01L 23/49562
See application file for complete search history.

(56) References Cited

U.S. PATENT DOCUMENTS 7,042,085 B2    5/2006  Wolf et al.
7,982,293 B2 *  7/2011  Chan ................ H01L 23/49503
                                                    257/670
(Continued)

FOREIGN PATENT DOCUMENTS

JP    2005-506702 T    3/2005

*Primary Examiner* — Jasmine Clark
(74) *Attorney, Agent, or Firm* — Shapiro, Gabor and Rosenberger, PLLC

(57) ABSTRACT

An improvement is achieved in the reliability of a semiconductor device. Over a die pad, first and second semiconductor chips are mounted. The first and second semiconductor chips and a part of the die pad are sealed in a sealing portion. The first semiconductor chip includes a power transistor. The second semiconductor chip controls the first semiconductor chip. The thickness of the portion of the die pad over which the first semiconductor chip is mounted is smaller than the thickness of the portion of the die pad over which the second semiconductor chip is mounted.

20 Claims, 35 Drawing Sheets

(51) Int. Cl.
*H01L 23/29* (2006.01)
*H01L 23/495* (2006.01)
*H01L 25/00* (2006.01)
*H01L 25/07* (2006.01)
*H01L 23/047* (2006.01)
*H01L 23/367* (2006.01)
*H01L 23/498* (2006.01)
*H01L 23/31* (2006.01)

(52) U.S. Cl.
CPC ............... *H01L 2224/04042* (2013.01); *H01L 2224/32245* (2013.01); *H01L 2224/48091* (2013.01); *H01L 2224/48137* (2013.01); *H01L 2224/48247* (2013.01); *H01L 2224/49107* (2013.01); *H01L 2224/49171* (2013.01); *H01L 2924/13091* (2013.01); *H01L 2924/15153* (2013.01); *H01L 2924/15159* (2013.01)

(56) References Cited

U.S. PATENT DOCUMENTS

| | | | | |
|---|---|---|---|---|
| 8,299,588 B1* | 10/2012 | Tateishi | ............ | H01L 23/49562 257/676 |
| 2013/0043576 A1* | 2/2013 | Nakamura | .............. | H01L 24/40 257/676 |

* cited by examiner

SEMICONDUCTOR DEVICE AND ELECTRONIC DEVICE

CROSS-REFERENCE TO RELATED APPLICATIONS

The disclosure of Japanese Patent Application No. 2015-179483 filed on Sep. 11, 2015 including the specification, drawings and abstract is incorporated herein by reference in its entirety.

BACKGROUND

The present invention relates to a semiconductor device and an electronic device, which can be used appropriately as, e.g., a semiconductor device in which a plurality of semiconductor chips are arranged in juxtaposition over a chip mounting portion and packaged and an electronic device in which the semiconductor device is mounted over a wiring substrate.

By mounting the semiconductor chips over a die pad, electrically coupling the pad electrodes of the semiconductor chips to leads via wires, and sealing the semiconductor chips including the pad electrodes, the leads, and the wires in a resin, the semiconductor device in the form of a semiconductor package can be manufactured.

Japanese Translation of PCT Application No. 2005-506702 (Patent Document 1) describes a technique related to a multi-chip package in which a power semiconductor chip and a logic chip are mounted over a substrate.

RELATED ART DOCUMENT

Patent Document

[Patent Document 1]
Japanese Translation of PCT Application No. 2005-506702

SUMMARY

A semiconductor device in which a plurality of semiconductor chips are arranged in juxtaposition and packaged is required to have improved reliability.

Other problems and novel features of the present invention will become apparent from a statement in the present specification and the accompanying drawings.

According to an embodiment, in a semiconductor device, over a chip mounting portion, a first semiconductor chip which includes a power transistor and a second semiconductor chip which controls the first semiconductor chip are mounted. The thickness of the portion of the chip mounting portion over which the first semiconductor chip is mounted is smaller than the thickness of the portion of the chip mounting portion over which the second semiconductor chip is mounted.

Also, according to another embodiment, in a semiconductor device, over a chip mounting portion, a first semiconductor chip and a second semiconductor chip which generates heat smaller in amount than the heat generated by the first semiconductor chip are mounted. The thickness of the portion of the chip mounting portion over which the first semiconductor chip is mounted is smaller than the thickness of the portion of the chip mounting portion over which the second semiconductor chip is mounted.

According to each of the embodiments, the reliability of the semiconductor device can be improved.

DETAILED DESCRIPTION

Figure 1:
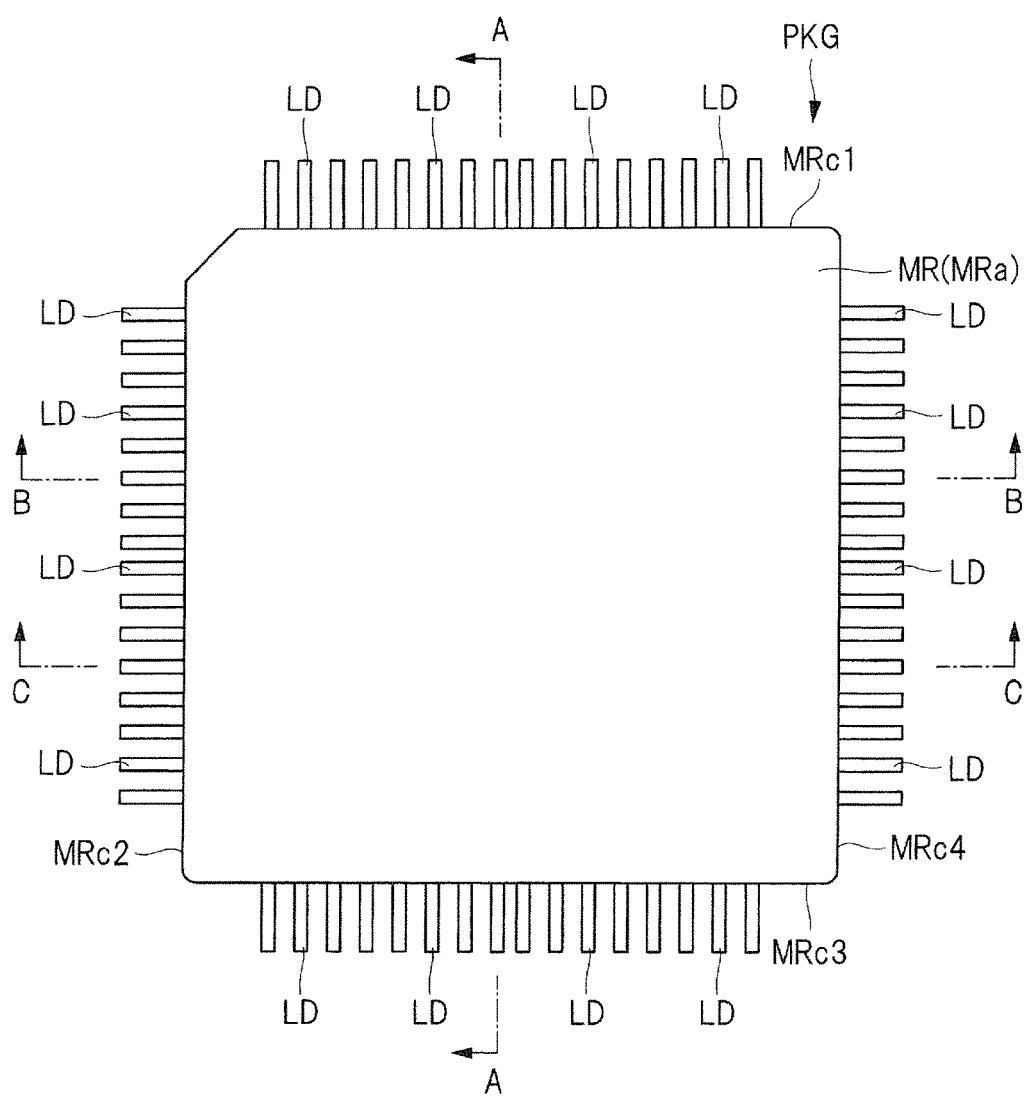
FIG. 1 is a top view of a semiconductor device in an embodiment.

In the following embodiment, if necessary for the sake of convenience, the embodiment will be each described by being divided into a plurality of sections or embodiments. However, they are by no means irrelevant to each other unless particularly explicitly described otherwise, but are in relations such that one of the sections or embodiments is a modification, details, supplementary explanation, and so forth of part or the whole of the others. Also, in the following embodiment, when the number and the like (including the number, numerical value, amount, range, and the like) of elements are referred to, they are not limited to specific numbers unless particularly explicitly described otherwise or unless they are obviously limited to specific numbers in principle. The number and the like of the elements may be not less than or not more than specific numbers. Also, in the following embodiment, it goes without saying that the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are referred to in the following embodiment, the shapes and the like are assumed to include those substantially proximate or similar thereto and the like unless particularly explicitly described otherwise or unless it can be considered that they obviously do not in principle. The same shall apply in regard to the foregoing numerical value and range.

The following will describe the embodiment in detail on the basis of the drawings. Note that, throughout all the drawings for illustrating the embodiment, members having the same functions are designated by the same reference numerals, and a repeated description thereof is omitted. In the following embodiment, a description of the same or like parts will not be repeated in principle unless particularly necessary.

In the drawings used in the embodiment, hatching may be omitted even in a cross section for improved clarity of illustration, while even a plan view may be hatched for improved clarity of illustration.

(Embodiment)

A semiconductor device in the embodiment of the present invention will be described with reference to the drawings.

<About Structure of Semiconductor Device (Semiconductor Package)>

Figure 2:
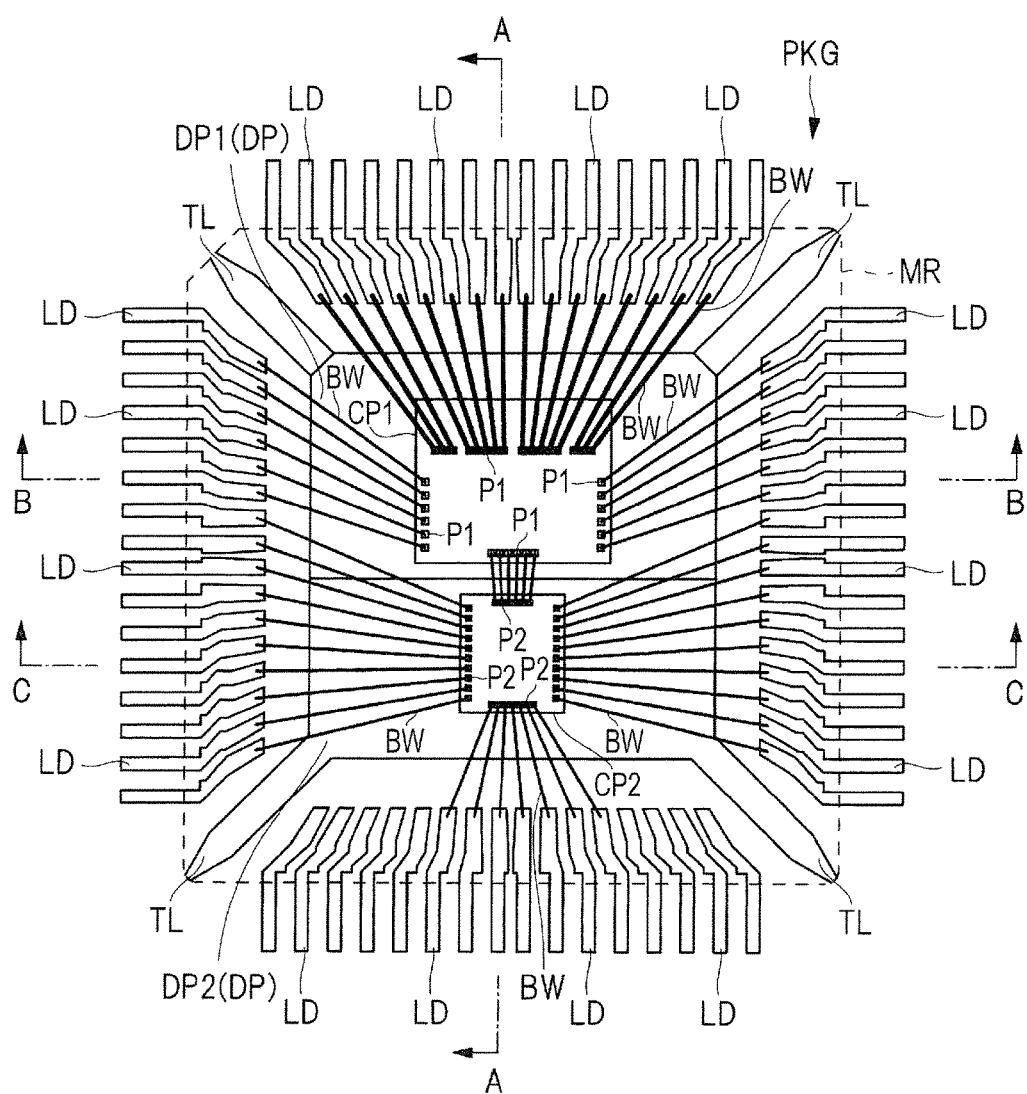
FIG. 2 is a perspective plan view of the semiconductor device in the embodiment.
Figure 3:
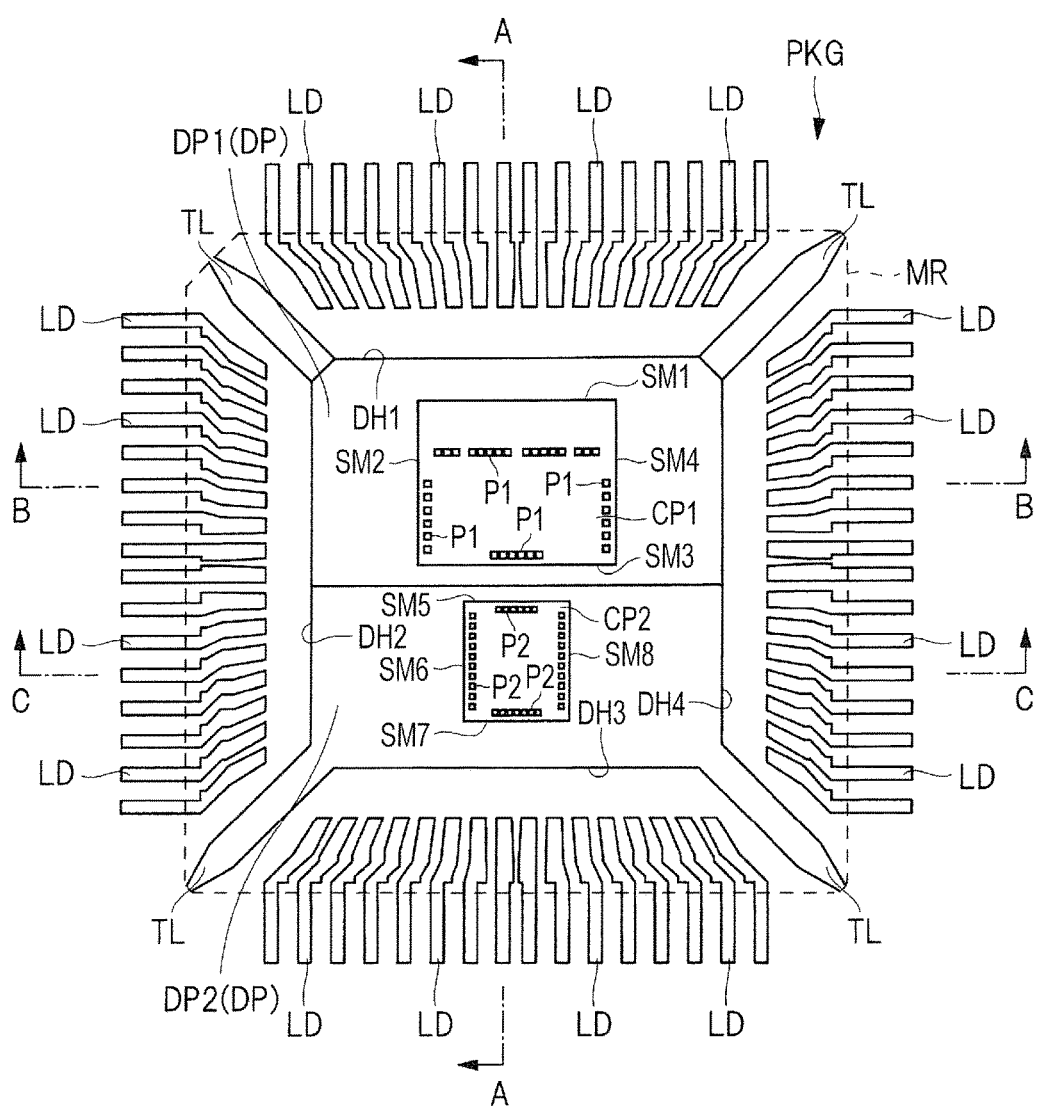
FIG. 3 is a perspective plan view of the semiconductor device in the embodiment.
Figure 4:
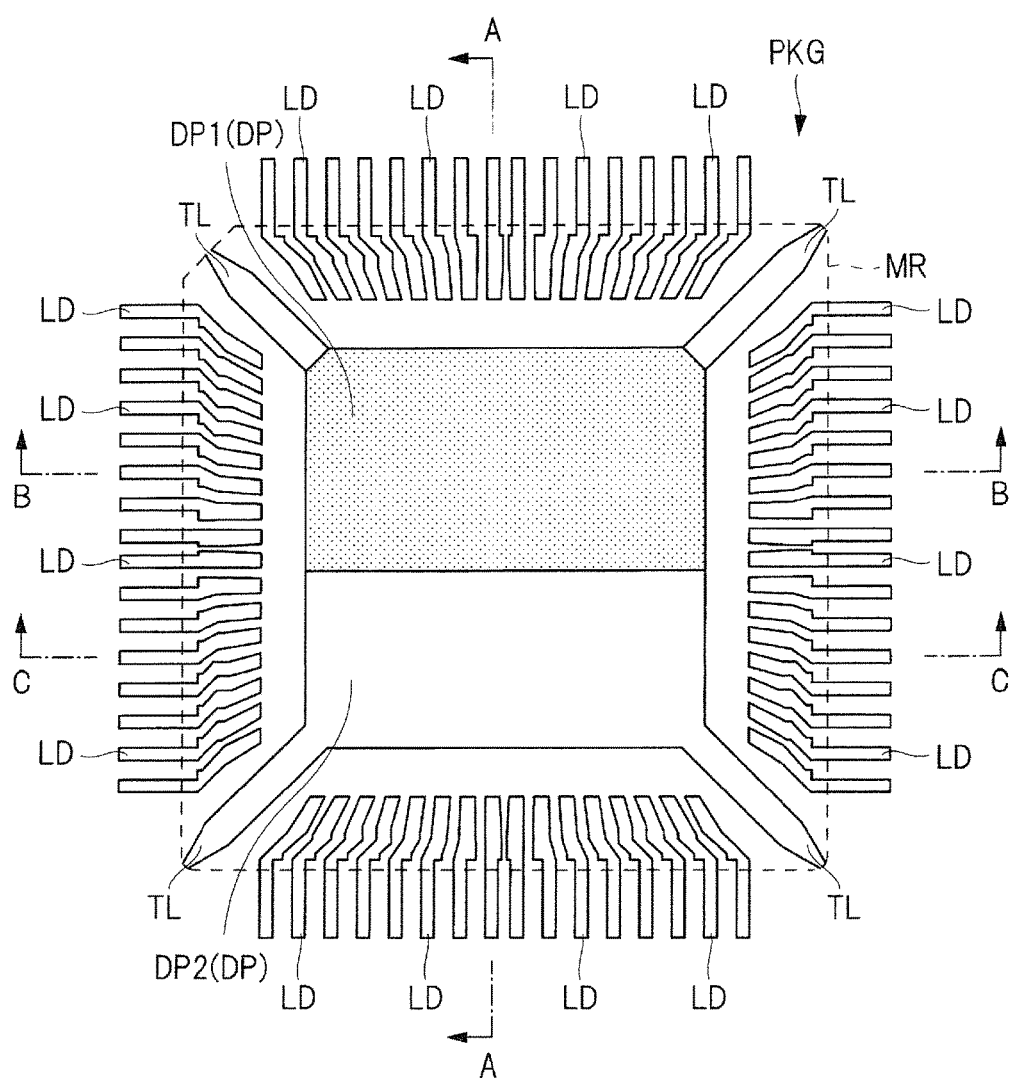
FIG. 4 is a perspective plan view of the semiconductor device in the embodiment.
Figure 5:
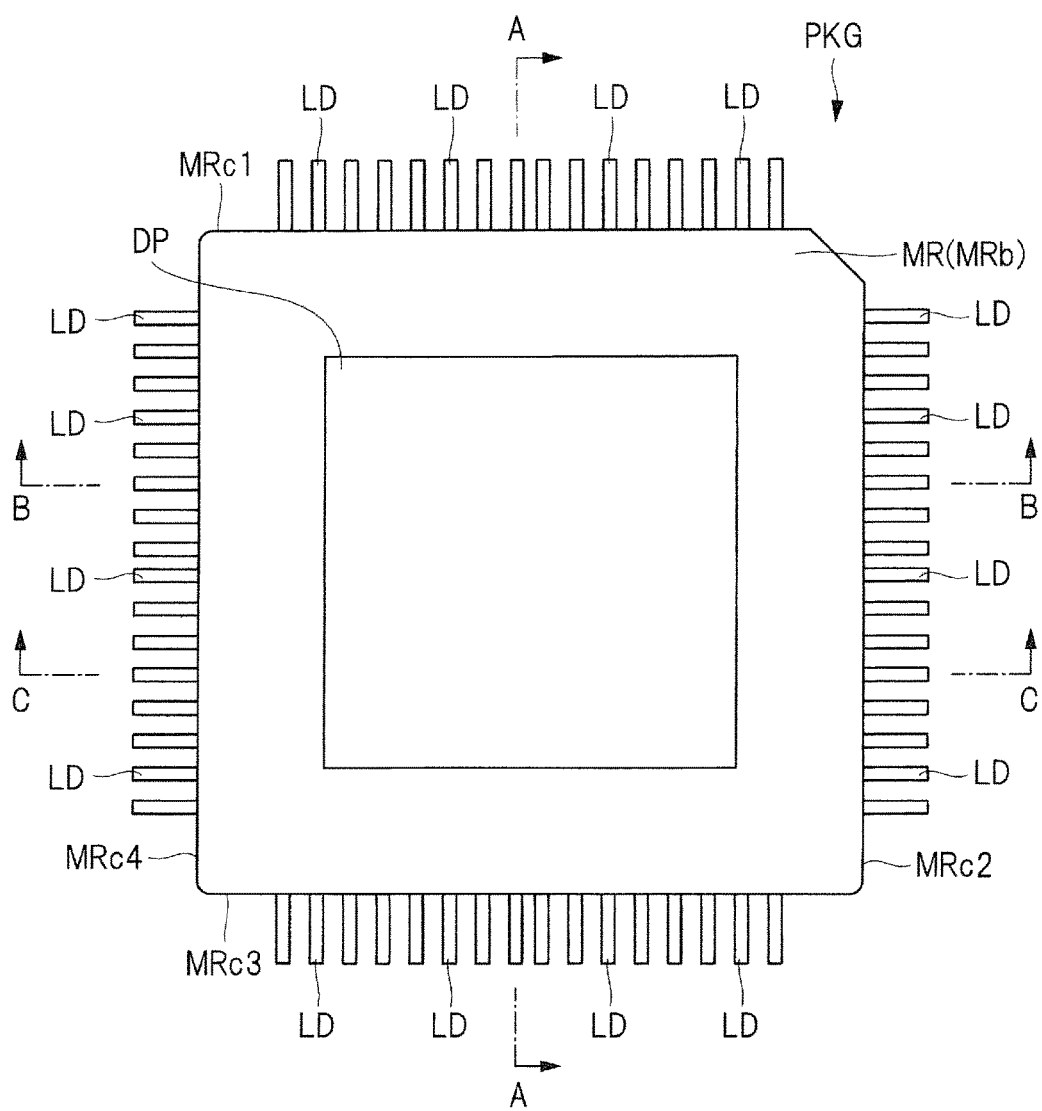
FIG. 5 is a bottom view of the semiconductor device in the embodiment.
Figure 6:
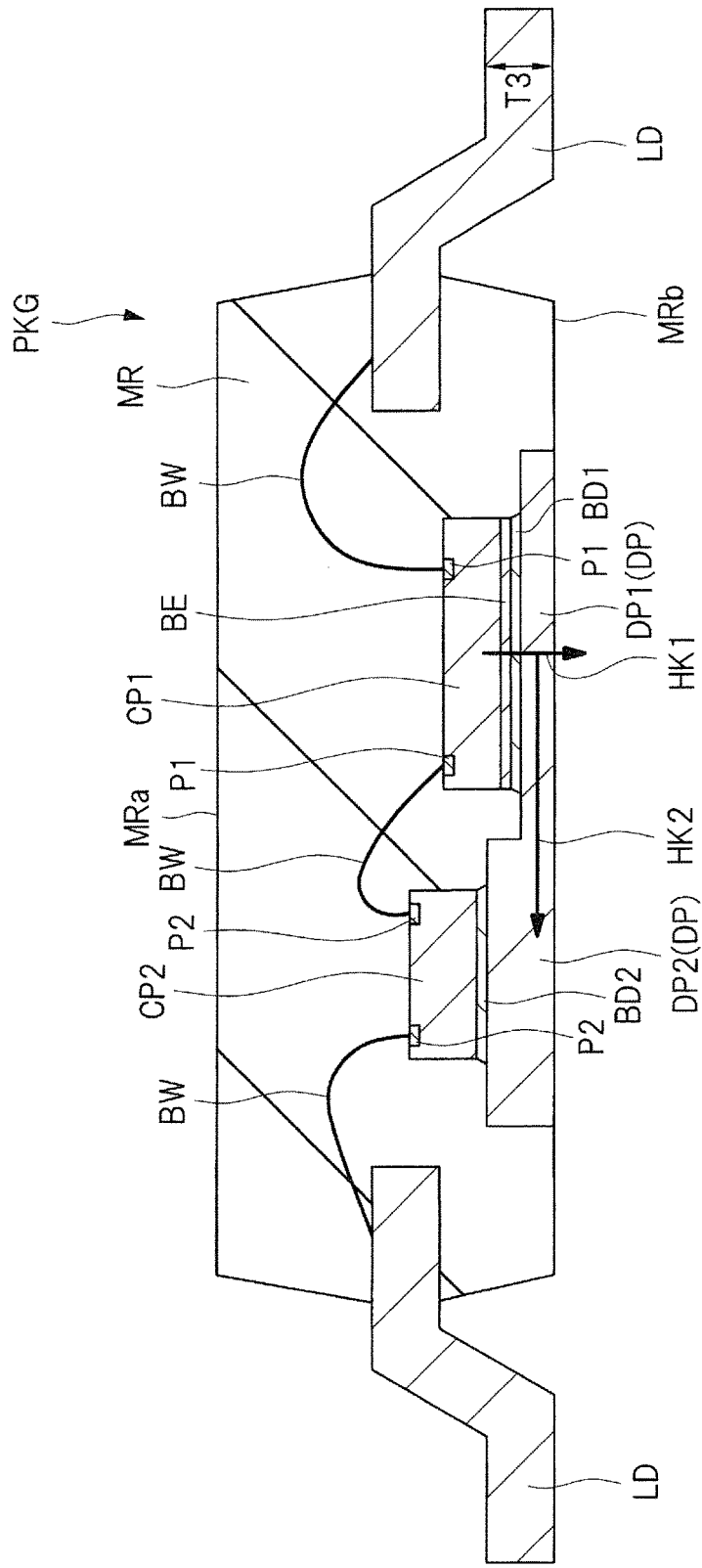
FIG. 6 is a cross-sectional view of the semiconductor device in the embodiment.
Figure 7:
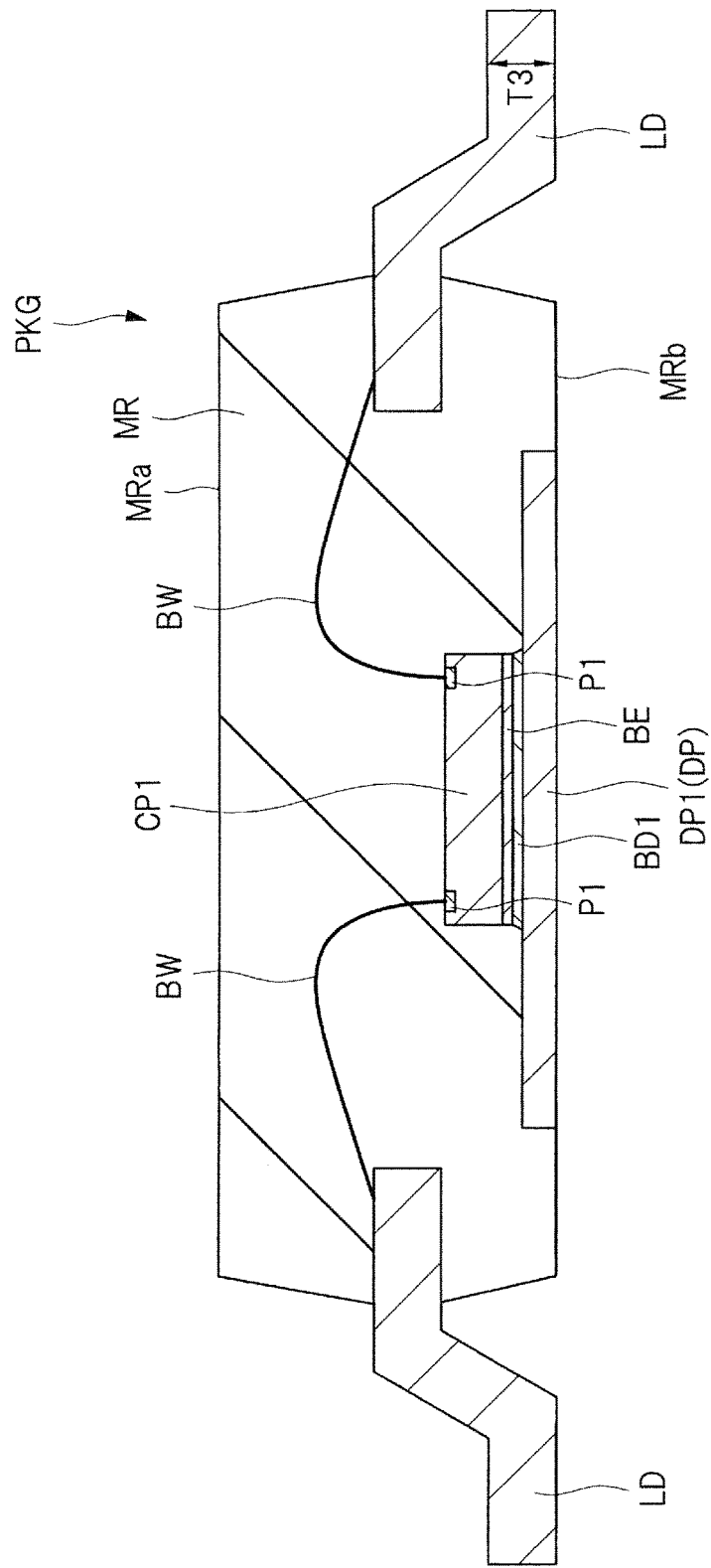
FIG. 7 is a cross-sectional view of the semiconductor device in the embodiment.
Figure 8:
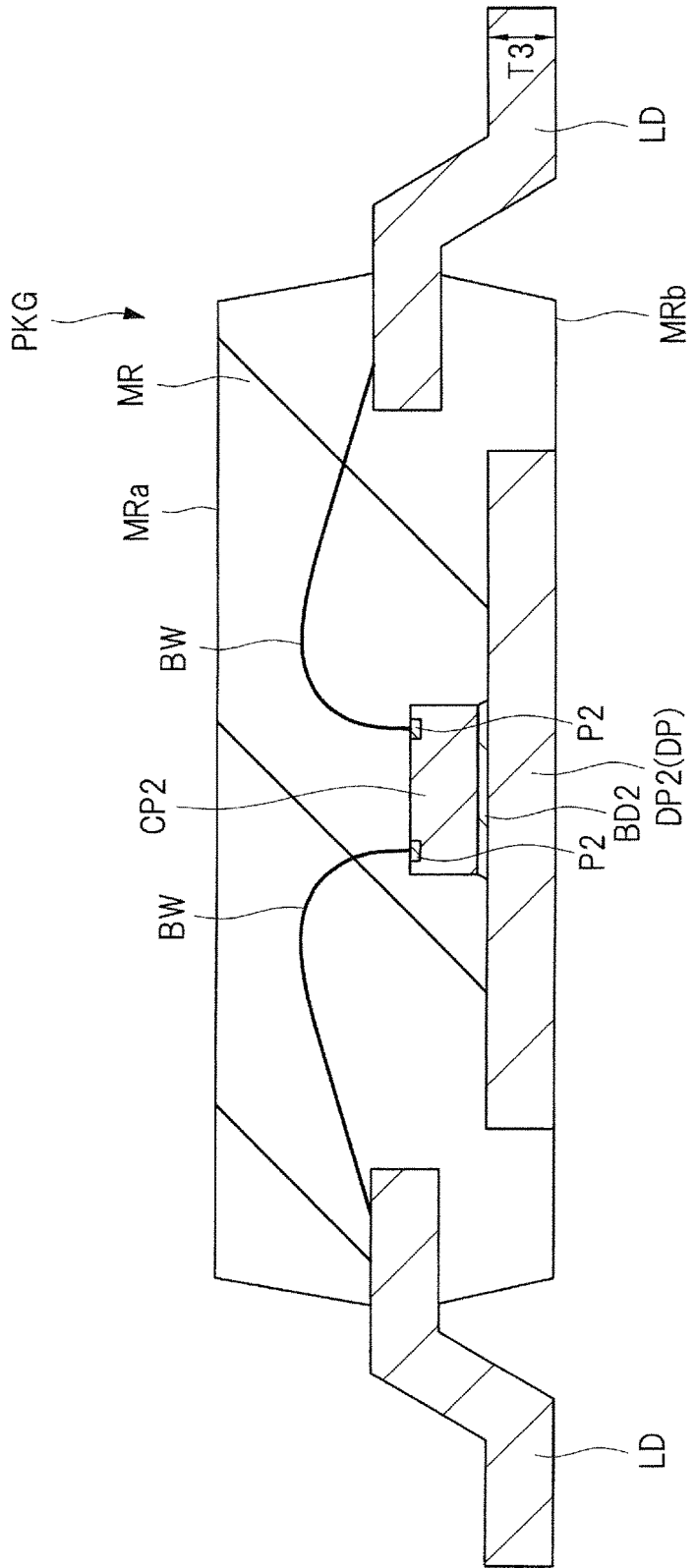
FIG. 8 is a cross-sectional view of the semiconductor device in the embodiment.
Figure 9:
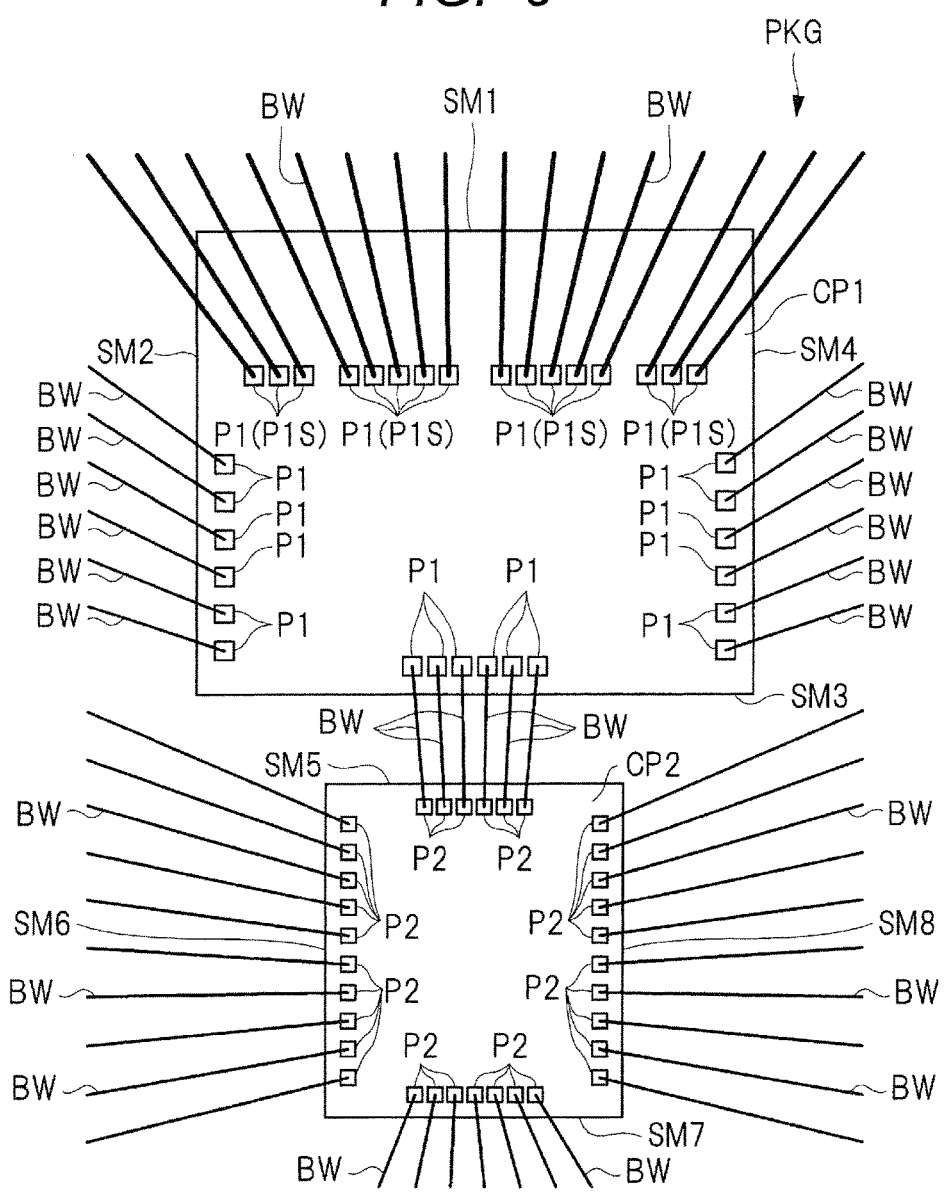
FIG. 9 is a partially enlarged perspective plan view of the semiconductor device in the embodiment.
Figure 10:
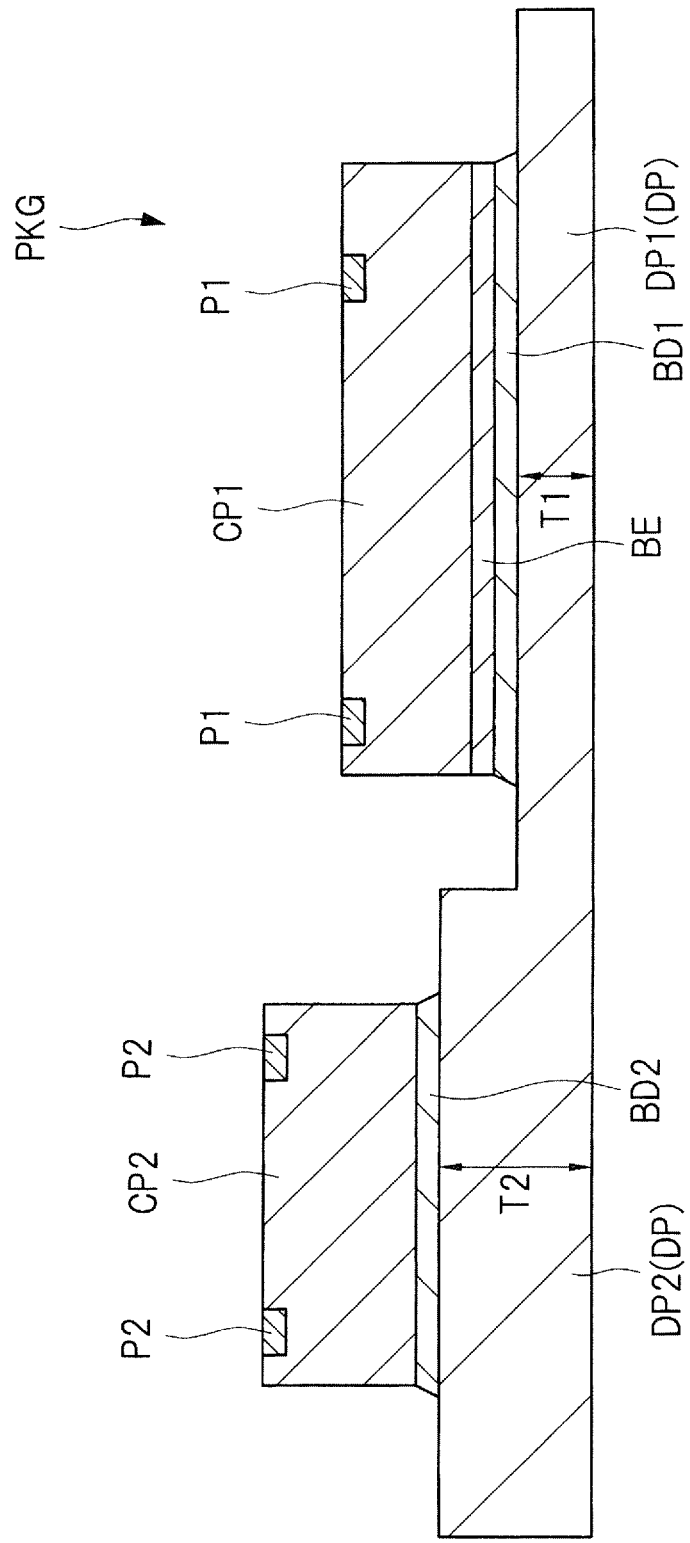
FIG. 10 is a partially enlarged cross-sectional view of the semiconductor device in the embodiment.

FIG. 1 is a top view of a semiconductor device PKG in the embodiment of the present invention. FIGS. 2 to 4 are perspective plan views of the semiconductor device PKG. FIG. 5 is a bottom view (back surface view) of the semiconductor device PKG. FIGS. 6 to 8 are cross-sectional views of the semiconductor device PKG. FIG. 2 shows a perspective plan view of the upper surface of the semiconductor device PKG when viewed through a sealing portion MR. FIG. 3 shows a perspective plan view of the upper surface of the semiconductor device PKG when viewed also through wires BW in FIG. 2 (when the wires BK are omitted therefrom). FIG. 4 shows a perspective plan view of the upper surface of the semiconductor device PKG when viewed also through semiconductor chips CP1 and CP2 in FIG. 3 (when the semiconductor chips CP1 and CP2 are omitted therefrom). In each of FIGS. 1 to 4, the semiconductor device PKG faces the same direction. Note that FIG. 4 is a plan view but, for easier understanding, a thinner portion DP1 of a die pad DP shown in FIG. 4 are hatched with dots. In each of FIGS. 2 to 4, the position of the outer periphery of the sealing portion MR is shown by the broken line. The cross section of the semiconductor device PKG at the position along the line A-A in each of FIGS. 1, 2, and 5 substantially corresponds to FIG. 6. The cross section of the semiconductor device PKG at the position along the line B-B in each of FIGS. 1, 2, and 5 substantially corresponds to FIG. 7. The cross section of the semiconductor device PKG at the position along the line C-C substantially corresponds to FIG. 8. FIG. 9 is a partially enlarged perspective plan view showing a part of FIG. 2 in enlarged relation. FIG. 10 is a partially enlarged cross-sectional view showing a part of FIG. 6 in enlarged relation. In FIG. 10, the die pad DP, the semiconductor chip CP1 mounted over the die pad DP via a bonding material BD1, and the semiconductor chip CP2 mounted over the die pad DP via a bonding material BD2 are shown, while the illustration of the wires BW, leads LD, and the sealing portion MR is omitted.

The semiconductor device (semiconductor package) PKG in the present embodiment shown in FIGS. 1 to 10 is a semiconductor device in the form of a resin-sealed semiconductor package, which is a semiconductor device in the form of a QFP (Quad Flat Package) herein. The following will describe a configuration of the semiconductor device PKG with reference to FIGS. 1 to 10.

The semiconductor device PKG in the present embodiment shown in FIGS. 1 to 9 has the semiconductor chips CP1 and CP2, the die pad DP mounting the semiconductor chips CP1 and CP2, the plurality of leads LD each formed of a conductor, the plurality of wires BW electrically coupling a plurality of pad electrodes P1 and P2 of the semiconductor chips CP1 and CP2 to the plurality of leads LD, and the sealing portion MR sealing therein the semiconductor chips CP1 and CP2, the die pad DP, the leads LD, and the wires BW.

The sealing portion (resin sealing portion or sealing body) MR as a sealing body is made of a resin material such as, e.g., a thermosetting resin material and can also contain a filler or the like. For example, using an epoxy resin containing a filler or the like, the sealing portion MR can be formed. For the reason of achieving a lower stress or the like, e.g., a phenol-based curing agent or a biphenyl-based thermosetting resin to which silicone rubber, a filler, or the like has been added may also be used as the material of the sealing portion MR instead of the epoxy-based resin.

The sealing portion MR has un upper surface (top surface) MRa as one main surface, a lower surface (back surface or bottom surface) MRb as a main surface opposite to the upper surface MRa, and side surfaces MRc1, MRc2, MRc3, and MRc4 each intersecting the upper and lower surfaces MRa and MRb (see FIGS. 1 and 5 to 8). That is, the sealing portion MR has a thin-plate outer appearance defined by the upper and lower surfaces MRa and MRb and the side surfaces MRc1, MRc2, MRc3, and MRc4. Among the side surfaces MRc1, MRc2, MRc3, and MRc4 of the sealing portion MR, the side surfaces MRc1 and MRc3 face each other and the side surfaces MRc2 and MRc4 face each other. The side surface MRc1 and each of the side surfaces MRc2 and MRc4 intersect each other, while the side surface MRc3 and each of the side surfaces MRc2 and MRc4 intersect each other.

The sealing portion MR is formed to have, e.g., a quadrilateral two-dimensional shape. That is, each of the upper and lower surfaces MRa and MRb of the sealing portion MR has, e.g., a quadrilateral two-dimensional shape. The corners of the quadrilateral can also be rounded or any of the four corners of the quadrilateral can be cut off.

The plurality of leads (lead portions) LD are each formed of a conductor and preferably made of a metal material such as copper (Cu) or a copper alloy. Each of the plurality of leads LD has a part sealed in the sealing portion MR and another part protruding from the side surface of the sealing portion MR to the outside thereof. The part of the lead LD which is located in the sealing portion MR will be hereinafter referred to as an inner lead portion and the part of the lead LD which is located outside the sealing portion MR will be hereinafter referred to as an outer lead portion.

Note that the semiconductor device PKG in the present embodiment has a structure in which each of the leads LD has the part (outer lead portion) protruding from the side surface of the sealing portion MR. The following description will be given on the basis of this structure, but the semiconductor device PKG is not limited to this structure. It is also possible to use a configuration (QFN-type configuration) in which, e.g., each of the leads LD scarcely protrudes from the side surface of the sealing portion MR and a part of each of the leads LD is exposed at the lower surface MRb of the sealing portion MR or the like.

The plurality of leads LD include the plurality of leads LD arranged closer to the side surface MRc1 of the sealing portion MR, the plurality of leads LD arranged closer to the side surface MRc2 of the sealing portion MR, the plurality of leads LD arranged closer to the side surface MRc3 of the sealing portion MR, and the plurality of leads LD arranged closer to the side surface MRc4 of the sealing portion MR.

Each of the outer lead portions of the plurality of leads LD arranged closer to the side surface MRc1 of the sealing portion MR protrudes from the side surface MRc1 of the sealing portion MR to the outside thereof. Each of the outer lead portions of the plurality of leads LD arranged closer to the side surface MRc2 of the sealing portion MR protrudes from the side surface MRc2 of the sealing portion MR to the outside thereof. Each of the outer lead portions of the plurality of leads LD arranged closer to the side surface MRc3 of the sealing portion MR protrudes from the side surface MRc3 of the sealing portion MR to the outside thereof. Each of the outer lead portions of the plurality of leads LD arranged closer to the side surface MRc4 of the sealing portion MR protrudes from the side surface MRc4 of the sealing portion MR to the outside thereof.

The outer lead portion of each of the leads LD is bent such that the lower surface of the outer lead portion in the vicinity of the end portion thereof is located in substantially the same plane as that of the lower surface MRb of the sealing portion MR. The outer lead portion of each of the leads LD functions as an external coupling terminal portion (external terminal) of the semiconductor device PKG.

The die pad (chip mounting portion or tab) DP is a chip mounting portion mounting the semiconductor chips CP1 and CP2. The die pad DP is formed to have, e.g., a quadrilateral two-dimensional shape. The semiconductor chips CP1 and CP2 are arranged in juxtaposition over the die pad DP. The sealing portion MR seals a part of the die pad DP. The plurality of leads LD are disposed around the die pad DP.

The die pad DP has a side (side surface) DH1 defining the side surface MRc1, a side (side surface) DH2 defining the side surface MRc2, a side (side surface) DH3 defining the side surface MRc3, and a side (side surface) DH4 defining the side surface MRc4 (see FIGS. 1 and 3). The side (side surface) DH1 of the die pad DP is a side (side surface) along the side surface MRc1 of the sealing portion MR. The side (side surface) DH2 of the die pad DP is a side (side surface) along the side surface MRc2 of the sealing portion MR. The side (side surface) DH3 of the die pad DP is a side (side surface) along the side surface MRc3 of the sealing portion MR. The side (side surface) DH4 of the die pad DP is a side (side surface) along the side surface MRc4 of the sealing portion MR.

The plurality of leads LD disposed closer to the side surface MRc1 of the sealing portion MR are disposed (arranged) along the side DH1 of the die pad DP. The plurality of leads LD disposed closer to the side surface MRc2 of the sealing portion MR are disposed (arranged) along the side DH2 of the die pad DP. The plurality of leads LD disposed closer to the side surface MRc3 of the sealing portion MR are disposed (arranged) along the side DH3 of the die pad DP. The plurality of leads LD disposed closer to the side surface MRc4 of the sealing portion MR are disposed (arranged) along the side DH4 of the die pad DP.

That is, between the side DH1 of the die pad DP and the side surface MRc1 of the sealing portion MR, the inner lead portions of the plurality of leads LD are located (arranged) along the side surface MRc1 of the sealing portion MR. Between the side DH2 of the die pad DP and the side surface MRc2 of the sealing portion MR, the inner lead portions of the plurality of leads LD are located (arranged) along the side surface MRc2 of the sealing portion MR. Between the side DH3 of the die pad DP and the side surface MRc3 of the sealing portion MR, the inner lead portions of the plurality of leads LD are located (arranged) along the side surface MRc3 of the sealing portion MR. Between the side DH4 of the die pad DP and the side surface MRc4 of the sealing portion MR, the inner lead portions of the plurality of leads LD are located (arranged) along the side surface MRc4 of the sealing portion MR.

At the lower surface MRb of the sealing portion MR, the lower surface of the die pad DP is exposed (see FIGS. 5 to 8). At the upper surface MRa of the sealing portion MR, the die pad DP is not exposed.

The die pad DP has a conductive property. The die pad DP is formed of a conductor and preferably made of a metal material such as copper (Cu) or a copper alloy. More preferably, the die pad DP and the plurality of leads LD which are included in the semiconductor device PKG are formed of the same material (the same metal material). This facilitates the production of a lead frame in which the die pad DP and the plurality of leads LD are connected and facilitates the manufacturing of the semiconductor device PKG using the lead frame.

The thickness of the die pad DP is not uniform. The die pad DP integrally has a thicker portion DP2 as the portion thereof having a larger thickness and the thinner portion DP1 as the portion thereof having a smaller thickness. As shown in FIG. 10, a thickness T1 of the thinner portion DP1 of the die pad DP is smaller than a thickness T2 of the thicker portion DP2 of the die pad DP (T2>T1).

The four corners of the quadrilateral forming the two-dimensional shape of the die pad DP are integrally formed with respective suspension leads TL. Each of the suspension leads TL is formed of the same material as that of the die pad DP in integral relation with the die pad DP. The four corners of the outer edge of the die pad DP are integrally formed with the respective suspension leads TL. The respective end portions of the suspension leads TL which are opposite to the respective end portions thereof coupled to the die pad DP extend in the sealing portion MR having a quadrilateral two-dimensional shape to reach the side surfaces of the sealing portion MR defining the four corners (corner portions) thereof. The portions of the suspension leads TL which protrude from the sealing portion MR are cut after the formation of the sealing portion MR. The cut surfaces (end surfaces) resulting from the cutting of the suspension leads TL are exposed at the side surfaces of the sealing portion MR defining the four corners thereof.

Over the upper surface (main surface) of the die pad DP, the semiconductor chip CP1 is mounted with the top surface (main surface or upper surface) thereof facing upward and with the back surface (lower surface) thereof facing the die pad DP (see FIGS. 2, 3, 6, and 7). Also, over the upper surface (main surface) of the die pad DP, the semiconductor chip CP2 is mounted with the top surface (main surface or upper surface) thereof facing upward and the back surface (lower surface) thereof facing the die pad DP (see FIGS. 2, 3, 6, and 8). In the upper surface of the die pad DP, the region where the semiconductor chip CP1 is mounted and the region where the semiconductor chip CP2 is mounted are spaced apart from each other. Accordingly, the semiconductor chips CP1 and CP2 are spaced apart from each other in plan view.

That is, the semiconductor chips CP1 and CP2 are arranged in juxtaposition over the upper surface of the die pad DP. In other words, the semiconductor chips CP1 and CP2 are not stacked, but are arranged in juxtaposition over the upper surface of the die pad DP to be spaced apart from each other. The two-dimensional size (plane area) of the die pad DP is larger than the two-dimensional size (plane area) of each of the semiconductor chips CP1 and CP2. In plan view, the semiconductor chips CP1 and CP2 are included in the upper surface of the die pad DP, but do not overlap each other.

Note that the semiconductor chip CP1 is mounted over the thinner portion DP1 of the die pad DP and the semiconductor chip CP2 is mounted over the thicker portion DP2 of the die pad DP. Accordingly, in plan view, the semiconductor chip CP1 is included in the thinner portion DP1 of the die pad DP and the semiconductor chip CP2 is included in the thicker portion DP2 of the die pad DP. Thus, the thickness (corresponding to the thickness T1) of the portion of the die pad DP over which the semiconductor chip CP1 is mounted is smaller than the thickness (corresponding to the thickness T2) of the portion of the die pad DP over which the semiconductor chip CP2 is mounted.

The back surface of the semiconductor chip CP1 is bonded (joined) and fixed to the upper surface of the die pad DP (thinner portion DP1) via the bonding material (bonding material layer, bonding layer, or adhesion layer) BD1. The back surface of the semiconductor chip CP2 is bonded (joined) and fixed to the upper surface of the die pad DP (thicker portion DP2) via the bonding material (bonding material layer, bonding layer, or adhesion layer) BD2. That is, the semiconductor chip CP1 is mounted over the upper surface of the die pad DP (thinner portion DP1) via the bonding material BD1 and the semiconductor chip CP2 is mounted over the upper surface of the die pad DP (thicker portion DP2) via the bonding material BD2. The semiconductor chips CP1 and CP2 are sealed in the sealing portion MR and are not exposed from the sealing portion MR.

The semiconductor chip CP1 has a back surface electrode BE over the back surface (main surface bonded to the die pad DP) thereof (see FIGS. 6, 7, and 10). Accordingly, the bonding material BD1 for bonding the semiconductor chip CP1 has a conductive property and, via the conductive boning material BD1, the back surface electrode BE of the semiconductor chip CP1 is bonded and fixed to the die pad DP and is electrically coupled thereto. This allows an intended potential to be supplied from the die pad DP to the back surface electrode BE of the semiconductor chip CP1 via the bonding material BD1. The back surface electrode BE of the semiconductor chip CP1 is electrically coupled to the drain of the power MOSFET (corresponding to a power MOSFET Q1 described later) formed in the semiconductor chip CP1. As the bonding material BD1, a conductive-paste bonding material (adhesive) such as, e.g., a silver (Ag) paste can be used appropriately. As the conductive-past bonding material for the bonding material BD1, a thermosetting bonding material can be used appropriately. However, in the manufactured semiconductor device PKG, the bonding material BD1 has already been cured.

On the other hand, over the back surface of the semiconductor chip CP2, no back surface electrode is formed (see FIGS. 6, 8, and 10). The bonding material BD2 for bonding the semiconductor chip CP2 does not have a conductive property but has an insulating property. That is, the bonding material BD2 is made of an insulating bonding material. Accordingly, the die pad DP and the semiconductor chip CP2 are insulated from each other via the insulating bonding material BD2 and the potential supplied from the die pad DP to the back surface electrode BE of the semiconductor chip CP1 via the conductive bonding material BD1 is not supplied to the back surface of the semiconductor chip CP2. As the bonding material BD2, an insulating-paste bonding material (adhesive) can be used appropriately. As the insulating-paste bonding material for the bonding material BD2, a thermosetting bonding material can be used appropriately. However, in the manufactured semiconductor device PKG, the bonding material BD2 has already been cured.

The die pad DP can also have the function of a heat sink for dissipating the heat generated in the semiconductor chip CP1. The heat generated in the semiconductor chip CP1 is transferred to the die pad DP via the bonding material BD1 and can be dissipated from the lower surface (back surface) of the die pad DP exposed from the sealing portion MR to the outside of the semiconductor device PKG. Since the bonding material BD1 interposed between the semiconductor chip CP1 and the die pad DP has the conductive property, the heat conductivity of the bonding material BD1 is higher than that of the insulating bonding material BD2 interposed between the semiconductor chip CP2 and the die pad DP. The higher heat conductivity of the bonding material BD1 interposed between the semiconductor chip CP1 and the die pad DP offers an advantage in terms of dissipating the heat generated in the semiconductor chip CP1 to the outside of the semiconductor device PKG via the bonding material BD1 and the die pad DP.

On the other hand, the amount of heat generated in the semiconductor chip CP2 (the amount of heat generated during the operation thereof) is smaller than the amount of heat generated in the semiconductor chip CP1 (the amount of heat generated during the operation thereof). This is because, as will be described later, the semiconductor chip CP1 has the embedded power transistor in which a large current flows, while the semiconductor chip CP2 does not have such an embedded power transistor. Accordingly, the current flowing in the semiconductor chip CP2 is smaller than the current flowing in the semiconductor chip CP1. As a result, even when the heat conductivity of the bonding material BD2 interposed between the semiconductor chip CP2 and the die pad DP is lower due to the insulating property thereof, a problem associated with the heat generation in the semiconductor chip CP2 is less likely to occur.

The semiconductor chips CP1 and CP2 are manufactured by forming various semiconductor elements or semiconductor integrated circuits in a main surface of a semiconductor substrate (semiconductor wafer) made of, e.g., monocrystalline silicon or the like and then dividing the semiconductor substrate into individual semiconductor chips by dicing or the like. The two-dimensional shape of each of the semiconductor chips CP1 and CP2 which intersects the thickness thereof is a quadrilateral.

The semiconductor chip CP1 is an IPD (Intelligent Power Device) chip. Accordingly, the semiconductor chip CP1 has the power transistor (corresponding to the power MOSFET Q1 described later) and a control circuit (corresponding to a control circuit CLC described later) which controls the power transistor. The semiconductor chip CP2 is a so-called microcomputer chip including a microcomputer. Accordingly, the semiconductor chip CP2 has the circuit which controls the semiconductor chip CP1 (particularly, the control circuit CLC of the semiconductor chip CP1) and has, e.g., an arithmetic operation circuit (CPU), a memory circuit, and the like. The semiconductor chip CP2 can be used as a control chip (control semiconductor chip) which controls the semiconductor chip CP1. That is, the semiconductor chip CP2 is a semiconductor chip for controlling the semiconductor chip CP1.

The semiconductor chip CP1 has a plane area larger than that of the semiconductor chip CP2. The plane area difference between the semiconductor chips CP1 and CP2 results from the following. That is, in consideration of the size of the whole semiconductor device PKG, the outer size of the semiconductor chip CP2 is preferably minimized. On the other hand, in the semiconductor chip CP1, the power transistor is formed and, in the power transistor, ON resistance produced in the transistor is preferably minimized. A reduction in ON resistance can be achieved by increasing the channel width of each of a plurality of unit transistor cells included in the power transistor. Accordingly, the outer size of the semiconductor chip CP1 is larger than the outer size of the semiconductor chip CP2.

Over the top surface of the semiconductor chip CP1, the plurality of pad electrodes (pads, bonding pads, or terminals) P1 are formed (see FIGS. 2, 3, 6, 7, and 9). On the other hand, over the top surface of the semiconductor chip CP2, the plurality of pad electrodes (pads, bonding pads, or terminals) P2 are formed (see FIGS. 2, 3, 6, 8, and 9). Note that the "pad electrodes" may occasionally be referred to simply as the "pads".

It is assumed herein that, of the two main surfaces of the semiconductor chip CP1 located opposite to each other, the main surface over which the plurality of pad electrodes P1 are formed is referred to as the top surface of the semiconductor chip CP1 and the main surface opposite to the top surface and facing the die pad DP is referred to as the back surface of the semiconductor chip CP1. Likewise, of the two main surfaces of the semiconductor chip CP2 located opposite to each other, the main surface over which the plurality of pad electrodes P2 are formed is referred to as the top surface of the semiconductor chip CP2 and the main surface opposite to the top surface and facing the die pad DP is referred to as the back surface of the semiconductor chip CP2.

The top surface of the semiconductor chip CP1 has a quadrilateral two-dimensional shape (see FIGS. 3 and 9). Accordingly, the semiconductor chip CP1 has four side surfaces SM1, SM2, SM3, and SM4 connecting the top surface of the semiconductor chip CP1 and the back surface of the semiconductor chip CP1. That is, the semiconductor chip CP1 has the top surface as one main surface, the back surface as the main surface opposite to the top surface, and the side surfaces SM1, SM2, SM3, and SM4 intersecting the top and back surfaces. In the semiconductor chip CP1, the side surfaces SM1 and SM3 are located opposite to each other and the side surfaces SM2 and SM4 are located opposite to each other. The side surfaces SM1 and SM3 are parallel with each other and the side surfaces SM2 and SM4 are parallel with each other. The side surface SM1 is orthogonal to each of the side surfaces SM2 and SM4 and the side surface SM3 is orthogonal to each of the side surfaces SM2 and SM4. Note that, in plan view, the side surfaces SM1, SM2, SM3, and SM4 of the semiconductor chip CP1 can also be regarded as the sides of the semiconductor chip CP1.

The top surface of the semiconductor chip CP2 also has a quadrilateral two-dimensional shape (see FIGS. 3 and 9). Accordingly, the semiconductor chip CP2 has four side surfaces SM5, SM6, SM7, and SM8 connecting the top surface of the semiconductor chip CP2 and the back surface of the semiconductor chip CP2. That is, the semiconductor chip CP2 has the top surface as one main surface, the back surface as the main surface opposite to the top surface, and the side surfaces SM5, SM6, SM7, and SM8 intersecting the top and back surfaces. In the semiconductor chip CP2, the side surfaces SM5 and SM7 are located opposite to each other and the side surfaces SM6 and SM8 are located opposite to each other. The side surfaces SM5 and SM7 are parallel with each other and the side surfaces SM6 and SM8 are parallel with each other. The side surface SM5 is orthogonal to each of the side surfaces SM6 and SM8 and the side surface SM7 is orthogonal to each of the side surfaces SM6 and SM8. Note that, in plan view, the side surfaces SM5, SM6, SM7, and SM8 can also be regarded as the sides of the semiconductor chip CP2.

The semiconductor chips CP1 and CP2 are mounted over the upper surface of the die pad DP such that the side surface SM3 of the semiconductor chip CP1 and the side surface SM5 of the semiconductor chip CP2 face each other (see FIGS. 3 and 9). The side surface SM3 of the semiconductor chip CP1 and the side surface SM5 of the semiconductor chip CP2 which face each other can be generally parallel with each other.

In the semiconductor chip CP1, the side surface SM1 is along the side surface MRc1 of the sealing portion MR and along the side DH1 of the die pad DP and the side surface SM2 is along the side surface MRc2 of the sealing portion MR and along the side DH2 of the die pad DP. Also, in the semiconductor chip CP1, the side surface SM3 is along the side surface MRc3 of the sealing portion MR and along the side DH3 of the die pad DP and the side surface SM4 is along the side surface MRc4 of the sealing portion MR and along the side DH4 of the die pad DP. On the other hand, in the semiconductor chip CP2, the side surface SM5 is along the side surface MRc1 of the sealing portion MR and along the side DH1 of the die pad DP and the side surface SM6 is along the side surface MRc2 of the sealing portion MR and along the side DH2 of the die pad DP. Also, in the semiconductor chip CP2, the side surface SM7 is along the side surface MRc3 of the sealing portion MR and along the side DH3 of the die pad DP and the side surface SM8 is along the side surface MRc4 of the sealing portion MR and along the side DH4 of the die pad DP.

Over the upper surface of the die pad DP, the semiconductor chip CP1 as one of the semiconductor chips CP1 and CP2 is disposed closer to the side surface MRc1 of the sealing portion MR and the semiconductor chip CP2 as the other of the semiconductor chips CP1 and CP2 is disposed closer to the side surface MRc3 of the sealing portion MR. In other words, over the upper surface of the die pad DP, the semiconductor chip CP1 as one of the semiconductor chips CP1 and CP2 is disposed closer to the side DH1 of the die pad DP and the semiconductor chip CP2 as the other of the semiconductor chips CP1 and CP2 is disposed closer to the side DH3 of the die pad DP.

In plan view, the side surface SM1 of the semiconductor chip CP1 faces the inner lead portions of the plurality of leads LD disposed closer to the side surface MRc1 of the sealing portion MR. The side surface SM2 of the semiconductor chip CP1 faces the inner lead portions of the plurality of leads LD disposed closer to the side surface MRc2 of the sealing portion MR. The side surface SM3 of the semiconductor chip CP1 faces the side surface SM5 of the semiconductor chip CP2. The side surface SM4 of the semiconductor chip CP1 faces the inner lead portions of the plurality of leads LD disposed closer to the side surface MRc4 of the sealing portion MR. Also, in plan view, the side surface SM5 of the semiconductor chip CP2 faces the side surface SM3 of the semiconductor chip CP1. The side surface SM6 of the semiconductor chip CP2 faces the inner lead portions of the plurality of leads LD disposed closer to the side surface MRc2 of the sealing portion MR. The side surface SM7 of the semiconductor chip CP2 faces the inner lead portions of the plurality of leads LD disposed closer to the side surface MRc3 of the sealing portion MR. The side surface SM8 of the semiconductor chip CP2 faces the inner lead portions of the plurality of leads LD disposed closer to the side surface MRc4 of the sealing portion MR.

The plurality of pad electrodes P1 and P2 of the semiconductor chips CP1 and CP2 and the plurality of leads LD are electrically coupled to each other via the plurality of wires (bonding wires) BW. Also, the plurality of pad electrodes P1 of the semiconductor chip CP1 and the plurality of pad electrodes P2 of the semiconductor chip CP2 are electrically coupled to each other via the plurality of wires BW.

That is, the plurality of pad electrodes P1 of the semiconductor chip CP1 include the pad electrodes P1 electrically coupled to the leads LD via the wires BW and the pad electrodes P1 electrically coupled to the pad electrodes P2 of the semiconductor chip CP2 via the wires BW. Also, the plurality of pad electrodes P2 of the semiconductor chip CP2 include the pad electrodes P2 electrically coupled to the leads LD via the wires BW and the pad electrodes P2 electrically coupled to the pad electrodes P1 of the semiconductor chip CP1 via the wires BW. The semiconductor device PKG has the plurality of wires BW, and the plurality of wires BW include the wires BW which electrically couple the pad electrodes P1 of the semiconductor chip CP1 to the leads LD, the wires BW which electrically couple the pad electrodes P2 of the semiconductor chip CP2 to the leads LD, and the wires BW which electrically couple the pad electrodes P1 of the semiconductor chip CP1 to the pad electrodes P2 of the semiconductor chip CP2.

Note that, among the plurality of pad electrodes P1 formed over the top surface of the semiconductor chip CP1, the plurality of pad electrodes P1 arranged along the side surface SM1 are electrically coupled to the plurality of leads LD disposed closer to the side surface MRc1 of the sealing portion MR via the plurality of wires BW. Also, among the plurality of pad electrodes P1 formed over the top surface of the semiconductor chip CP1, the plurality of pad electrodes P1 arranged along the side surface SM2 are electrically coupled to the plurality of leads LD disposed closer to the side surface MRc2 of the sealing portion MR via the plurality of wires BW. Also, among the plurality of pad electrodes P1 formed over the top surface of the semiconductor chip CP1, the plurality of pad electrodes P1 arranged along the side surface SM4 are electrically coupled to the plurality of leads LD disposed closer to the side surface MRc4 of the sealing portion MR via the plurality of wires BW. On the other hand, among the plurality of pad electrodes P2 formed over the top surface of the semiconductor chip CP2, the plurality of pad electrodes P2 arranged along the side surface SM6 are electrically coupled to the plurality of leads LD disposed closer to the side surface MRc2 of the sealing portion MR via the plurality of wires BW. Also, among the plurality of pad electrodes P2 formed over the top surface of the semiconductor chip CP2, the plurality of pad electrodes P2 arranged along the side surface SM7 are electrically coupled to the plurality of leads LD disposed closer to the side surface MRc3 of the sealing portion MR via the plurality of wires BW. Also, among the plurality of pad electrodes P2 formed over the top surface of the semiconductor chip CP2, the plurality of pad electrodes P2 arranged along the side surface SM8 are electrically coupled to the plurality of leads LD disposed closer to the side surface MRc4 of the sealing portion MR via the plurality of wires BW. The plurality of pad electrodes P1 which are among the plurality of pad electrodes P1 formed over the top surface of the semiconductor chip CP1 and arranged along the side surface SM3 are electrically coupled to the plurality of pad electrodes P2 which are among the plurality of pad electrodes P2 formed over the top surface of the semiconductor chip CP2 and arranged along the side surface SM5 via the plurality of wires BW.

The plurality of pad electrodes P1 formed over the top surface of the semiconductor chip CP1 also include a plurality of source pad electrodes P1S (see FIG. 9). Over the top surface of the semiconductor chip CP1, the source pad electrodes P1S are arranged along the side surface SM1 and electrically coupled individually to the leads LD disposed closer to the side surface MRc1 of the sealing portion MR via the wires BW. Accordingly, the source pad electrodes P1S are included in the pad electrodes P1 electrically coupled to the leads LD via the wires BW. The source pad electrodes P1S are source pad electrodes (pads or bonding pads) and electrically coupled to the source of the power transistor (corresponding to the power MOSFET Q1 described later) formed in the semiconductor chip CP1. The plurality of source pad electrodes P1S can be arranged over the top surface of the semiconductor chip CP1 along the side surface SM1 and can also be arranged at a given distance from the side surface SM1.

The wires BW are conductive coupling members. More specifically, the wires BW are conductive wires. Since the wires BW are made of a metal, the wires BW can also be regarded as metal lines (thin metal lines). The wires BW are sealed in the sealing portion MR and are not exposed from the sealing portion MR. The respective portions of the leads LD to which the wires BW are coupled are the inner lead portions thereof located in the sealing portion MR.

It is also possible that all the plurality of wires BW (corresponding to the wires BW shown in FIG. 2) provided in the semiconductor device PKG have the same thickness (diameter). However, among the plurality of wires BW (corresponding to the wires BW shown in FIG. 2) provided in the semiconductor device PKG, each of the wires BW coupling the source pad electrodes P1S of the semiconductor chip CP1 to the leads LD preferably has a thickness (diameter) which is set larger than the thickness (diameter) of each of the other wires BW.

That is, in each of the wires BW coupling the source pad electrodes P1S of the semiconductor chip CP1 to the leads LD, a current larger than in each of the other wires BW flows. Accordingly, by increasing the thickness (diameter) thereof, it is possible to reduce the resistance thereof and thus reduce a loss. On the other hand, the current flowing in each of the wires BW other than the wires BW coupling the source pads P1S of the semiconductor chip CP1 to the leads LD is not so large. Accordingly, by reducing the thickness (diameter) of each of the other wires BW, it is possible to reduce the sizes of the pad electrodes P1 and P2 coupled to the other wires BW. This offers an advantage in terms of reducing the sizes of the semiconductor chips CP1 and CP2.

As the wires BW, gold (Au) wires, copper (Cu) wires, aluminum (Al) wires, silver (Ag) wires, or the like can appropriately be used.

<About Manufacturing Process of Semiconductor Device>

Figure 11:
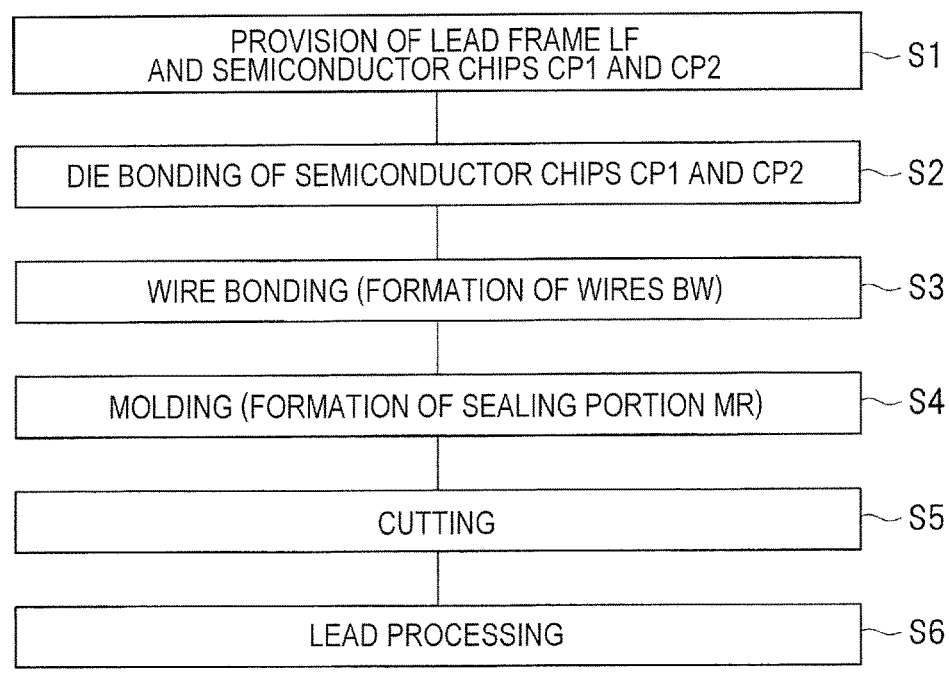
FIG. 11 is a process flow chart showing a manufacturing process of the semiconductor device in the embodiment.

Next, a description will be given of a manufacturing process (assembly process) of the semiconductor device PKG shown in each of FIGS. 1 to 10 described above. FIG. 11 is a process flow chart showing the manufacturing process of the semiconductor device PKG shown in FIGS. 1 to 10 described above. FIGS. 12 to 16 are cross-sectional views of the semiconductor device PKG during the manufacturing process thereof. Note that each of FIGS. 12 to 16 shows a cross section corresponding to FIG. 6 described above.

To manufacture the semiconductor device PKG, first, the lead frame LF and the semiconductor chips CP1 and CP2 are provided (Steps S1 in FIG. 11).

Figure 12:
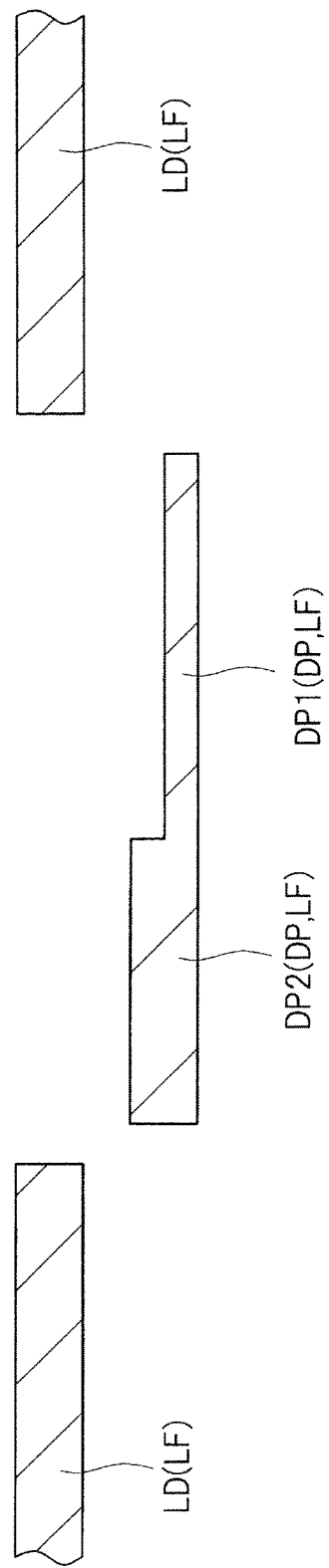
FIG. 12 is a cross-sectional view of the semiconductor device in the embodiment during the manufacturing process thereof.

As shown in FIG. 12, the lead frame LF integrally has a frame rim (not shown), the plurality of leads LD connected to the frame rim, and the die pad DP connected to the frame rim via the plurality of suspension leads TL.

In Step S1, the provision of the lead frame LF, the provision of the semiconductor chip CP1, and the provision of the semiconductor chip CP2 may be performed in any order or may also be performed simultaneously.

Figure 13:
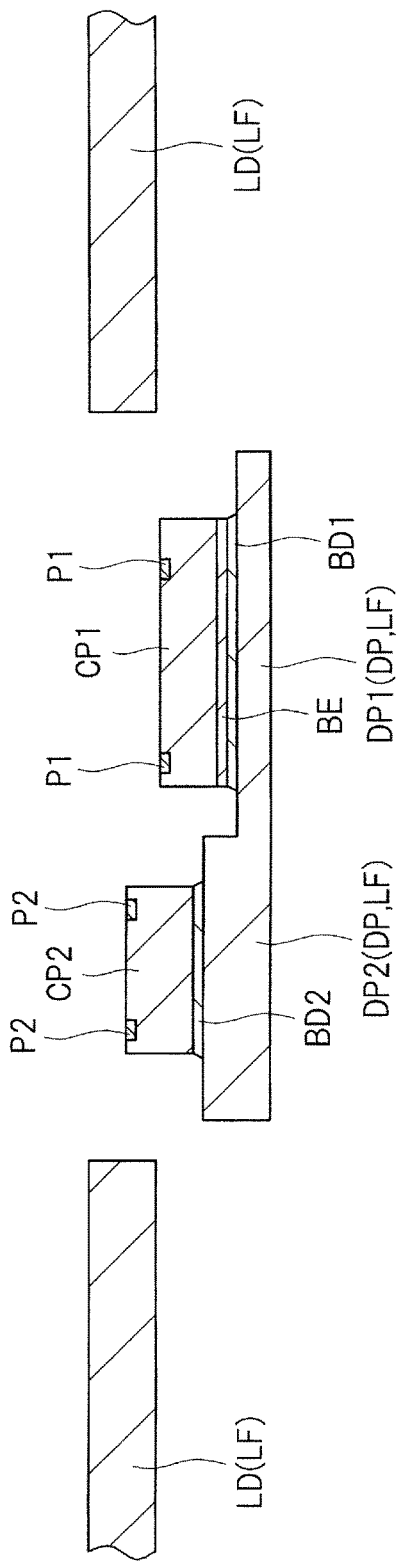
FIG. 13 is a cross-sectional view of the semiconductor device during the manufacturing process thereof, which is subsequent to FIG. 12.

Next, as shown in FIG. 13, a die bonding step for the semiconductor chips CP1 and CP2 is performed to mount the semiconductor chip CP1 over the die pad DP of the lead frame via the conductive bonding material BD1 and bond the semiconductor chip CP1 to the die pad DP, while mounting the semiconductor chip CP2 over the die pad DP of the lead frame via the insulating bonding material BD2 and bonding the semiconductor chip CP2 to the die pad DP (Step S2 in FIG. 11). Over the back surface of the semiconductor chip CP1, the back surface electrode BE has been formed. Accordingly, in Step S2, the back surface electrode BE of the semiconductor chip CP1 is bonded to the die pad DP via the conductive bonding material BD1.

Note that, in Step S2, the semiconductor chip CP1 is mounted over the thinner portion DP1 of the die pad DP via the bonding material BD1, while the semiconductor chip CP2 is mounted over the thicker portion DP2 of the die pad DP via the bonding material BD2.

Figure 14:
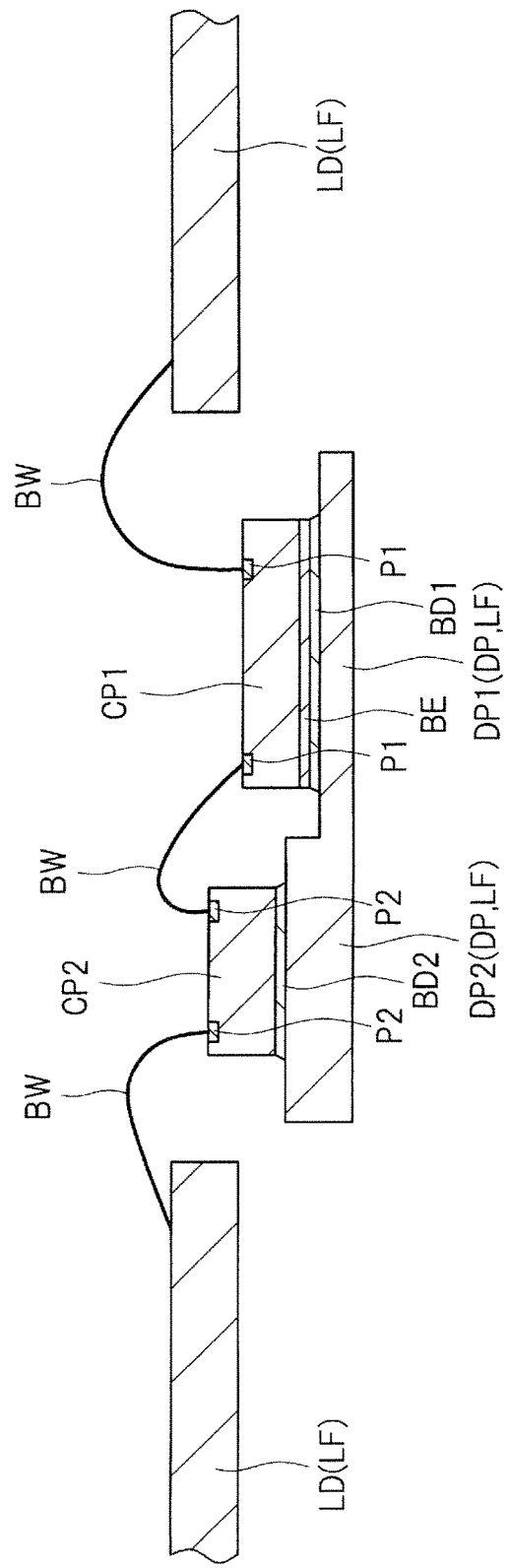
FIG. 14 is a cross-sectional view of the semiconductor device during the manufacturing process thereof, which is subsequent to FIG. 13.

After the die bonding step in Step S2 is performed, as shown in FIG. 14, a wire bonding step is performed (Step S3 in FIG. 11).

In Step S3, electrical coupling is provided between the plurality of pad electrodes P1 of the semiconductor chip CP1 and the plurality of leads LD of the lead frame LF, between the plurality of pad electrodes P2 of the semiconductor chip CP2 and the plurality of leads LD of the lead frame LF, and between the plurality of pad electrodes P1 of the semiconductor chip CP1 and the plurality of pad electrodes P2 of the semiconductor chip CP2 via the plurality of wires BW.

Figure 15:
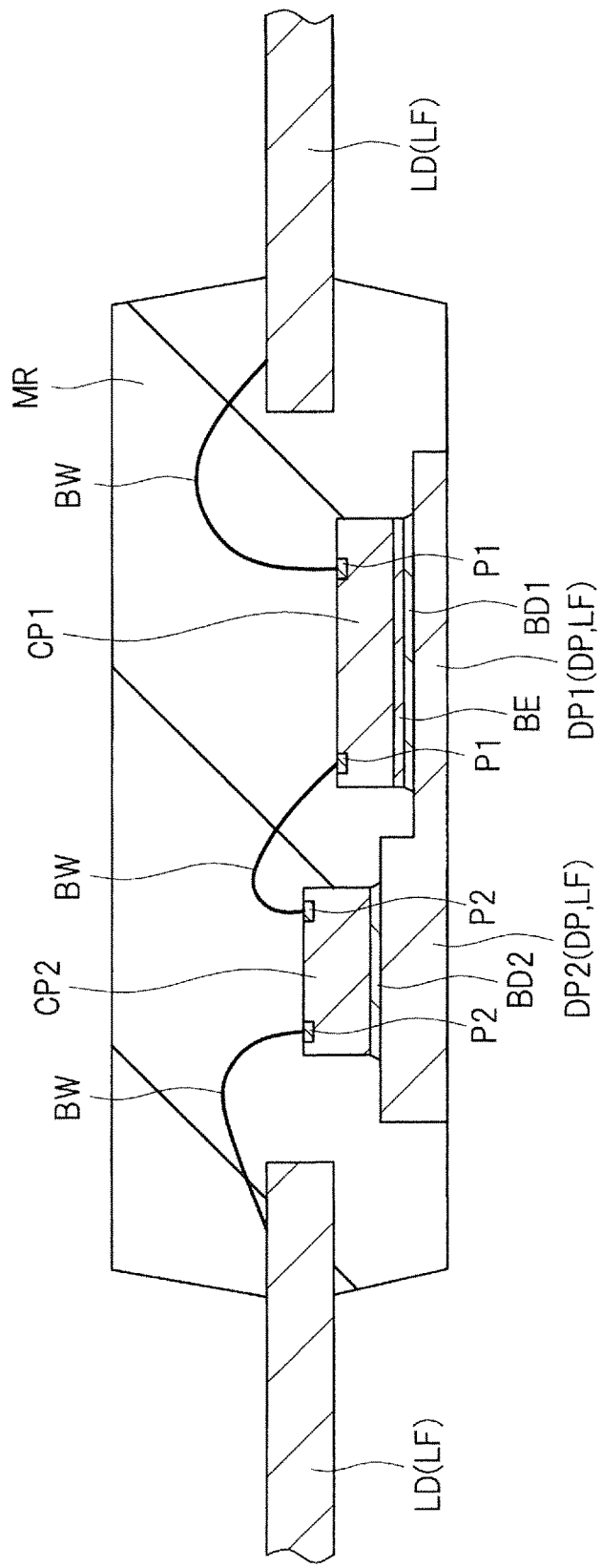
FIG. 15 is a cross-sectional view of the semiconductor device during the manufacturing process thereof, which is subsequent to FIG. 14.

Next, resin sealing is performed by a molding step (resin molding step) to seal the semiconductor chips CP1 and CP2 and the plurality of wires BW coupled thereto in the sealing portion MR, as shown in FIG. 15 (Step S4 in FIG. 11). By the molding step in Step S4, the sealing portion MR sealing therein the semiconductor chips CP1 and CP2, the die pad DP, the inner lead portions of the plurality of leads LD, the plurality of wires BW, and the suspension leads TL is formed.

Next, a plating process is performed as necessary on the outer lead portions of the leads LD exposed from the sealing portion MR. Then, outside the sealing portion MR, the leads LD and the suspension leads TL are cut at predetermined positions to be separated from the frame rim of the lead frame LF (Step S5 in FIG. 11).

Figure 16:
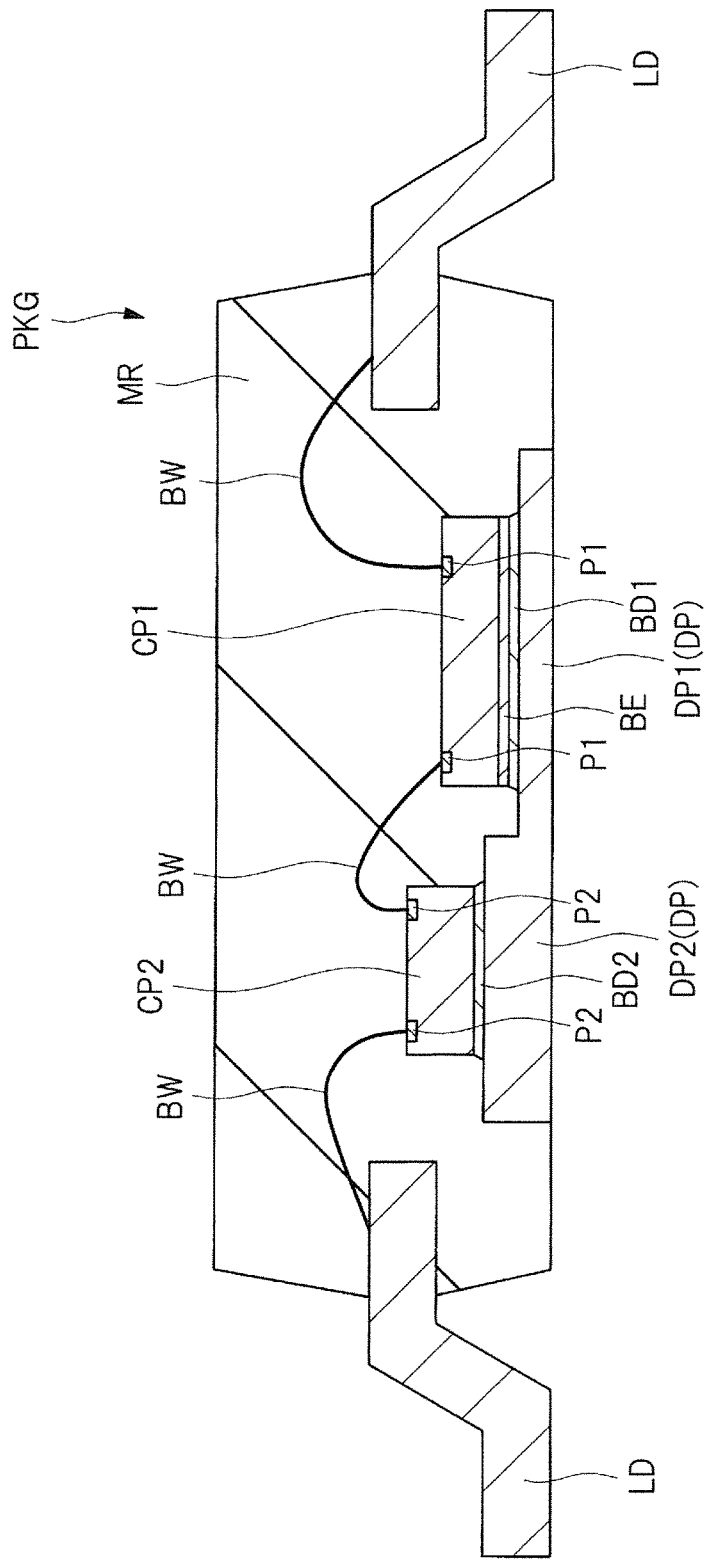
FIG. 16 is a cross-sectional view of the semiconductor device during the manufacturing process thereof, which is subsequent to FIG. 15.

Next, as shown in FIG. 16, the outer lead portions of the leads LD protruding from the sealing portion MR are subjected to bending (lead processing or lead forming) (Step S6 in FIG. 11).

In this manner, the semiconductor device PKG shown in each of FIGS. 1 to 10 described above is manufactured.

<About Circuit Configuration of Semiconductor Device>

Figure 17:
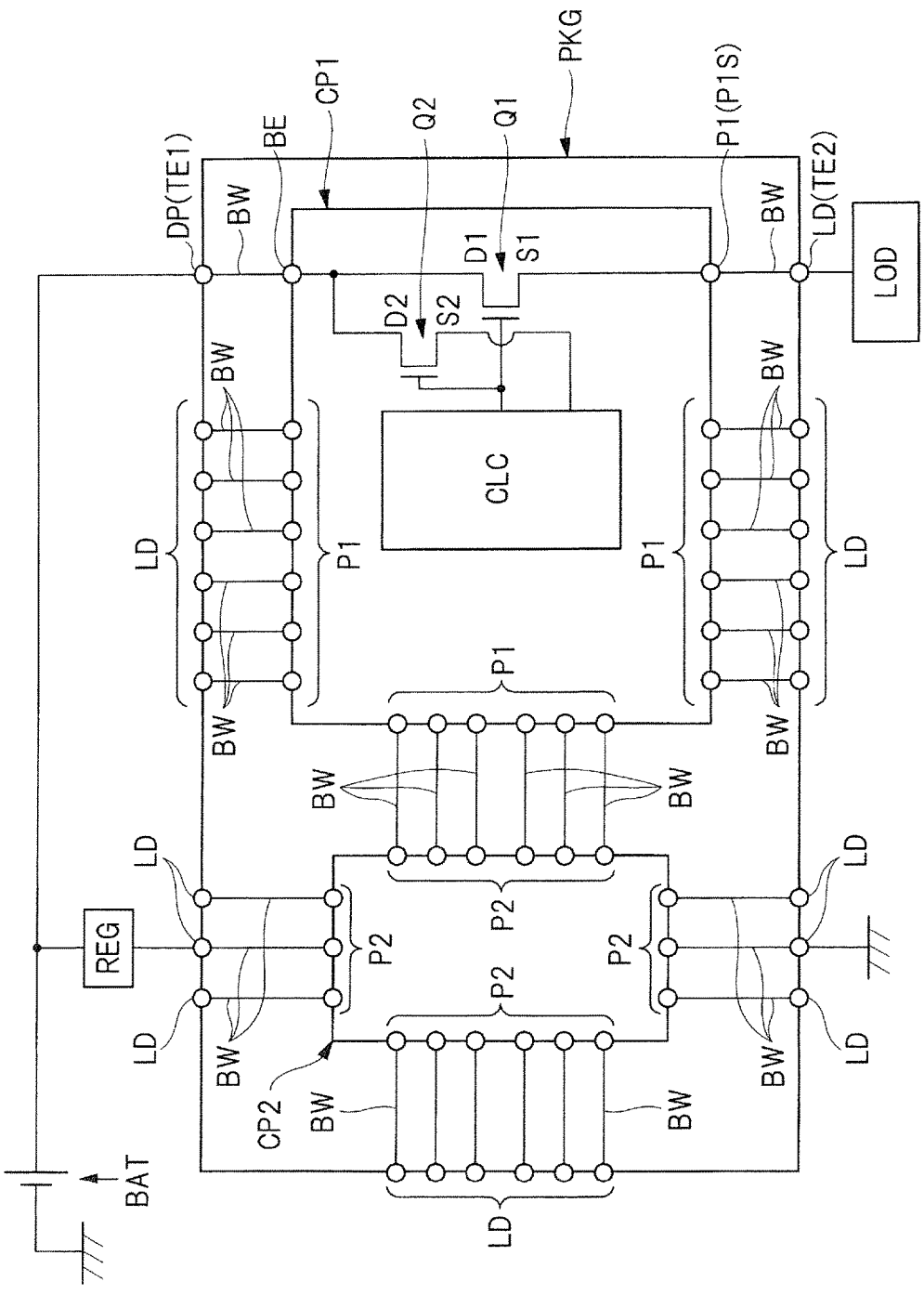
FIG. 17 is a circuit diagram of the semiconductor device in the embodiment.

Next, referring to FIG. 17, a description will be given of a circuit configuration of the semiconductor device PKG. FIG. 17 is a circuit diagram (circuit block diagram) of the semiconductor device PKG.

As described above, the semiconductor device PKG in the present embodiment has the semiconductor chips CP1 and CP2 embedded therein. In the semiconductor chip CP1, the power MOSFET (Metal Oxide Semiconductor Field Effect Transistor) Q1 as a power transistor, a sense MOSFET Q2 for sensing the current flowing in the power MOSFET Q1, and the control circuit CLC are formed. The power MOSFET Q1 can function as the switching power transistor.

Note that, in the present application, when MOSFETs are mentioned, it is assumed that the MOSFETs include not only a MISFET (Metal Insulator Semiconductor Field Effect Transistor or MIS Field Effect Transistor) in which an oxide film (silicon dioxide film) is used as a gate insulating film, but also a MISFET in which an insulating film other than an oxide film (silicon dioxide film) is used as a gate insulating film.

The control circuit CLC includes a driver circuit (drive circuit) which drives the power MOSFET Q1 and the sense MOSFET Q2. Accordingly, the control circuit CLC controls a potential in the gate (corresponding to a gate electrode 8 described later) of the power MOSFET Q1 in accordance with the signal supplied from outside the semiconductor chip CP1 to the control circuit CLC and can thus control the operation of the power MOSFET Q1. That is, the gate of the power MOSFET Q1 is coupled to the control circuit CLC. By supplying an ON signal (gate voltage which brings the power MOSFET Q1 into an ON state) from the control circuit CLC to the gate of the power MOSFET Q1, the power MOSFET Q1 can be brought into the ON state.

When the power MOSFET Q1 is brought into the ON state by supplying the ON signal from the control circuit CLC to the gate of the power MOSFET Q1, a voltage from a power supply BAT is output from the power MOSFET Q1 and supplied to a load LOD. When the power MOSFET Q1 is brought into an OFF state by supplying an OFF signal from the control circuit CLC to the gate of the power MOSFET Q1 (or stopping the supply of the ON signal), the supply of the voltage from the power supply BAT to the load LOD is stopped. Such ON/OFF control of the power MOSFET Q1 of the semiconductor chip CP1 is performed by the control circuit CLC of the semiconductor chip CP1.

Thus, the semiconductor device PKG can function as a switching semiconductor device which turns ON/OFF the application of the voltage from the power supply BAT to the load LOD. Also, the power MOSFET Q1 of the semiconductor chip CP1 can function as a switching element. Since the output of the power MOSFET Q1 is supplied to the load LOD, the power MOSFET Q1 can also be regarded as an output circuit. As the load LOD, any electronic device or electronic component which is desired to be coupled to the power supply BAT via the switching semiconductor device PKG can be used appropriately. For example, a motor, a lamp, a heater, or the like can be used as the load LOD.

In the semiconductor chip CP1 of the semiconductor device PKG, the sense MOSFET Q2 for sensing a current is provided. The current flowing in the power MOSFET Q1 is sensed by the sense MOSFET Q2. In accordance with the current flowing in the sense MOSFET Q2, the power MOSFET Q1 is controlled. For example, when it is determined (detected) that, due to the current flowing in the sense MOSFET Q2, an excess current (current having a value of not less than a prescribed value) is flowing in the power MOSFET Q1, the control circuit CLC controls the gate voltage of the power MOSFET Q1 to limit the current in the power MOSFET Q1 to a value of not more than a predetermined value or forcibly turn OFF the power MOSFET Q1. This can prevent an excess current from flowing in the power MOSFET Q1 and protect the semiconductor device PKG and the electronic device using the semiconductor device PKG.

The sense MOSFET Q2 and the power MOSFET Q1 share a common drain and a common gate. That is, the drain of the power MOSFET Q1 and the drain of the sense MOSFET Q2 which are formed in the semiconductor chip CP1 are each electrically coupled to the foregoing back surface electrode BE of the semiconductor chip CP1 and are therefore electrically coupled to each other. Accordingly, the foregoing back surface electrode BE of the semiconductor chip CP1 is for the respective drains of the power MOSFET Q1 and the sense MOSFET Q2.

The back surface electrode BE of the semiconductor chip CP1 to which the respective drains of the power MOSFET Q1 and the sense MOSFET Q2 are coupled is coupled to a terminal TE1 of the semiconductor device PKG. The foregoing die pad DP corresponds to the terminal TE1. From the terminal TE1 (i.e., the die pad DP) of the semiconductor device PKG, the same potential is supplied to the respective drains of the sense MOSFET Q2 and the power MOSFET Q1 via the foregoing bonding material BD1 and the back surface electrode BE of the semiconductor chip CP1. Since the terminal TE1 (die pad DP) is coupled to the power supply (battery) BAT disposed outside the semiconductor device PKG, the voltage from the power supply BAT is supplied from the terminal TE1 (i.e., the die pad DP) of the semiconductor device PKG to the respective drains of the power MOSFET Q1 and the sense MOSFET Q2 via the foregoing bonding material BD1 and the back surface electrode BE of the semiconductor chip CP1.

The respective gates of the sense MOSFET Q2 and the power MOSFET Q1 are electrically coupled to each other to provide a common gate. The common gate is coupled to the control circuit CLC so that the same gate signal (gate voltage) is input from the control circuit CLC to the gate of the sense MOSFET Q2 and to the gate of the power MOSFET Q1. Specifically, the gate (gate electrode) of the sense MOSFET Q2 and the gate (gate electrode) of the power MOSFET Q1 which are formed in the semiconductor chip CP1 are electrically coupled to the control circuit CLC in the semiconductor chip CP1 via the internal wiring of the semiconductor chip CP1.

On the other hand, the sense MOSFET Q2 and the power MOSFET Q1 do not share a common source. The respective sources of the power MOSFET Q1 and the sense MOSFET Q2 are not short-circuited.

The source of the power MOSFET Q1 is coupled to a terminal TE2 of the semiconductor device PKG. To the terminal TE2, the load LOD disposed outside the semiconductor device PKG is coupled. That is, the source of the power MOSFET Q1 is coupled to the load LOD. Among the plurality of leads LD of the semiconductor device PKG, the lead LD electrically coupled to the source pad electrode P1S of the semiconductor chip CP1 via the wire BW corresponds to the terminal TE2. Specifically, the source of the power MOSFET Q1 formed in the semiconductor chip CP1 is electrically coupled to the source pad electrode P1S of the semiconductor chip CP1 via the internal wiring of the semiconductor chip CP1. The source pad electrode P1S is electrically coupled to the terminal TE2 (lead LD) via the wire BW. To the terminal TE2 (lead LD), the load LOD is coupled. Consequently, when the power MOSFET Q1 is brought into the ON state (conductive state) by supplying an ON signal from the control circuit CLC to the gate of the power MOSFET Q1, the voltage from the power supply BAT is supplied to the load LOD via the power MOSFET Q1 in the ON state.

On the other hand, the source of the sense MOSFET Q2 is coupled to the control circuit CLC. Specifically, the source of the sense MOSFET Q2 formed in the semiconductor chip CP1 is electrically coupled to the control circuit CLC in the semiconductor chip CP1 via the internal wiring of the semiconductor chip CP1.

Note that, in FIG. 17, the reference numeral D1 denotes the drain of the power MOSFET Q1, the reference numeral S1 denotes the source of the power MOSFET Q1, the reference numeral D2 denotes the drain of the power MOSFET Q2, and the reference numeral S2 denotes the source of the sense MOSFET Q2.

The sense MOSFET Q2 is formed in conjunction with the power MOSFET Q1 in the semiconductor chip CP1. The sense MOSFET Q2 is formed so as to form a current mirror circuit with the power MOSFET Q1 in the semiconductor chip CP1. The sense MOSFET Q2 has a size which is, e.g., 1/20000 of the size of the power MOSFET Q1. The size ratio can be changed as necessary.

The control circuit CLC formed in the semiconductor chip CP1 is electrically coupled to some of the plurality of pad electrodes P1 of the semiconductor chip CP1 via the internal wiring of the semiconductor chip CP1. The plurality of pad electrodes P1 of the semiconductor chip CP1 include the input pad electrode, the output pad electrode, and the ground pad electrode. From these pad electrodes P1, a signal (input signal) and a ground potential are input or supplied to the control circuit CLC. Also, from these pad electrodes P1, the signals output from the control circuit CLC (output signals) are output.

Each of the pad electrodes P1 of the semiconductor chip CP1 is electrically coupled to the lead LD or the pad electrode P2 of the semiconductor chip CP2 via the wire BW. That is, the pad electrodes P1 of the semiconductor chip CP1 include the pad electrodes P1 electrically coupled to the leads LD via the wires BW and the pad electrodes P1 electrically coupled to the pad electrodes P2 of the semiconductor chip CP2 via the wires BW.

The semiconductor chip CP2 is a microcomputer chip (control chip) and can function as a control semiconductor chip which controls the operation of the semiconductor chip CP1.

In FIG. 17, the circuit in the semiconductor chip CP2 is not shown but, actually, in the semiconductor chip CP2, a circuit which controls the semiconductor chip CP1 (circuit in the semiconductor chip CP1) is formed. That is, the circuit which controls the control circuit CLC formed in the semiconductor chip CP1 is formed in the semiconductor chip CP2.

The internal circuit of the semiconductor chip CP2 is electrically coupled to the plurality of pad electrodes P2 of the semiconductor chip CP2 via the internal wiring of the semiconductor chip CP2. Each of the pad electrodes P2 of the semiconductor chip CP2 is electrically coupled to the lead LD or the pad electrode P1 of the semiconductor chip CP1 via the wires BW. That is, the pad electrodes P2 of the semiconductor chip CP2 include the pad electrodes P2 electrically coupled to the leads LD via the wires BW and the pad electrodes P2 electrically coupled to the pad electrodes P1 of the semiconductor chip CP1 via the wires BW.

The plurality of leads LD coupled to the semiconductor chip CP2 via the wires BW include the input lead, the output lead, and the ground lead. From these leads LD, a signal (input signal) and a ground potential are input or supplied to the internal circuit of the semiconductor chip CP2. Also, from these leads LD, the signals (output signals) output from the internal circuit of the semiconductor chip CP2 are output.

Any of the plurality of leads LD connected to the semiconductor chip CP2 via the wires BW is coupled to the power supply BAT disposed outside the semiconductor device PKG via a regulator REG. The voltage from the power supply BAT is converted in the regulator BEG to a voltage appropriate as the power supply voltage for the semiconductor chip CP2, supplied to the lead LD coupled to the regulator REG, and then supplied to the semiconductor chip CP2 via the wire BW coupled to the lead LD.

Some of the plurality of pad electrodes P2 of the semiconductor chip CP2 are electrically coupled to some of the plurality of pad electrodes P1 of the semiconductor chip CP1 via the respective wires BW. The internal circuit of the semiconductor chip CP2 can be electrically coupled to the internal circuit (e.g., the control circuit CLC) of the semiconductor chip CP1 via the pad electrodes P2 of the semiconductor chip CP2, the wires BW (wires BW providing coupling between the pad electrodes P1 and P2), and the pad electrodes P1 of the semiconductor chip CP1.

It is also possible to electrically couple the leads LD electrically coupled to the semiconductor chip CP2 to the leads LD electrically coupled to the semiconductor chip CP1 outside the semiconductor device PKG. For example, it is possible to mount the semiconductor device PKG over a wiring substrate (mounting substrate) and electrically couple the leads LD electrically coupled to the semiconductor chip CP2 to the leads LD electrically coupled to the semiconductor chip CP1 in the wiring substrate via the wiring of the wiring substrate or the like. This also allows the internal circuit of the semiconductor chip CP2 to be electrically coupled to the internal circuit (e.g., the control circuit CLC) of the semiconductor chip CP1 via wiring (e.g., the wiring of the wiring substrate over which the semiconductor device PKG is mounted) outside the semiconductor device PKG.

Here, the internal circuit of the semiconductor chip CP1 corresponds to any of the circuits formed in the semiconductor chip CP1 and the internal circuit of the semiconductor chip CP2 corresponds to any of the circuits formed in the semiconductor chip CP2. The internal wiring of the semiconductor chip CP1 corresponds to the wiring formed in the semiconductor chip CP1 and the internal wiring of the semiconductor chip CP2 corresponds to the wiring formed in the semiconductor chip CP2.

<About Structure of Semiconductor Chip>

Next, a description will be given of a structure of the semiconductor chip CP1.

Figure 18:
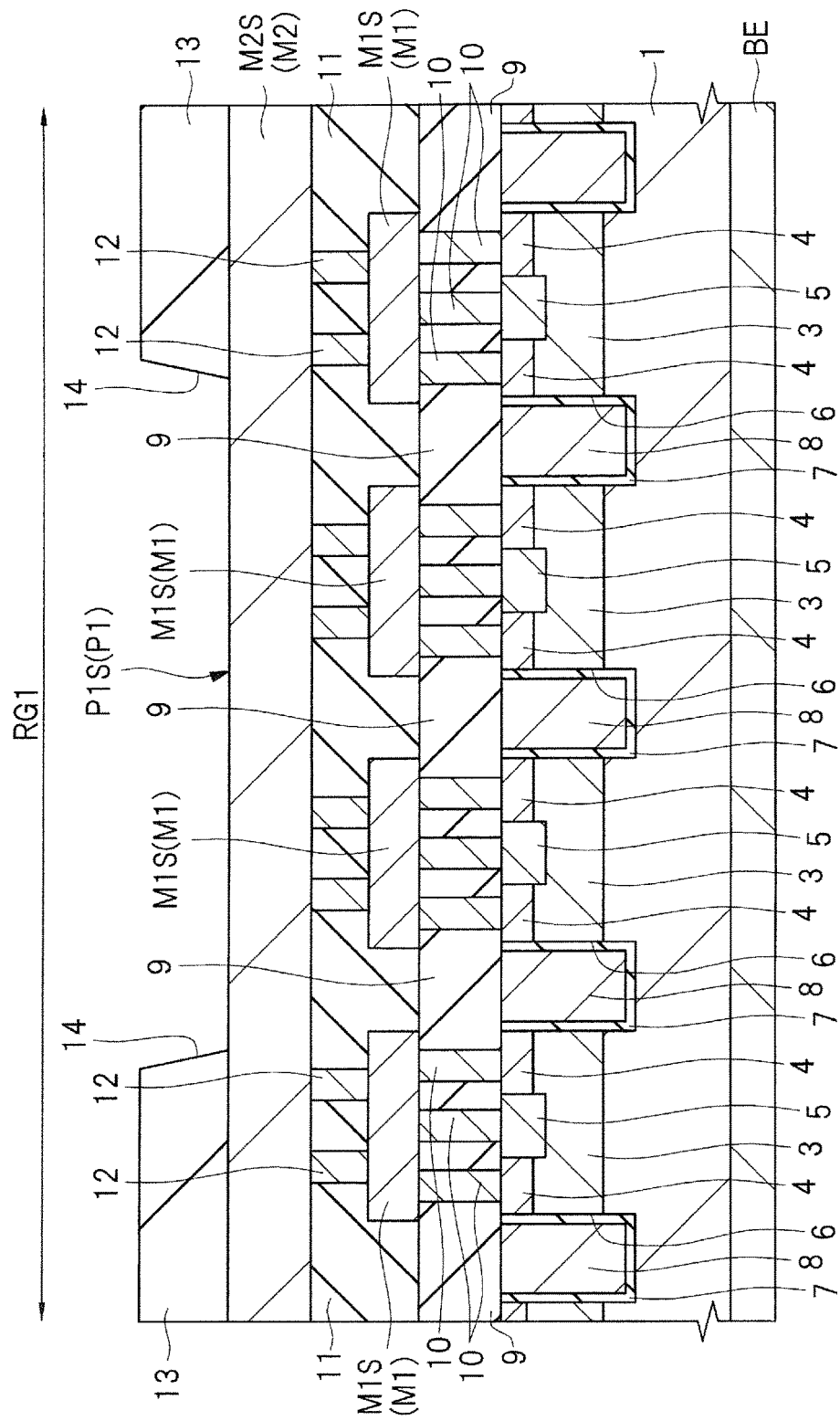
FIG. 18 is a main-portion cross-sectional view of a semiconductor chip used in the semiconductor device in the embodiment.

FIG. 18 is a main-portion cross-sectional view of the semiconductor chip CP1, which shows a main-portion cross-sectional view of a region of the semiconductor chip CP1 where the transistor forming the foregoing power MOSFET Q1 is formed (power MOSFET formation region).

The region (two-dimensional region) of the semiconductor chip CP1 where the transistor forming the foregoing power MOSFET Q1 is formed will be referred to as a power MOSFET formation region. Also, the region (two-dimensional region) of the semiconductor chip CP1 where the transistor forming the foregoing sense MOSFET Q2 is formed will be referred to as a sense MOSFET formation region. Also, the region (two-dimensional region) of the semiconductor chip CP1 where the foregoing control circuit CLC is formed will be referred to as a control circuit formation region. The semiconductor chips CP1 and CP2 are arranged in juxtaposition over the foregoing die pad DP such that the control circuit formation region of the semiconductor chip CP1 is closer to the semiconductor chip CP2 than the power MOSFET formation region of the semiconductor chip CP1.

A description will be given of a structure of the region (power MOSFET formation region) of the semiconductor chip CP1 where the transistor forming the foregoing power MOSFET Q1 is formed with reference to FIG. 18. Note that FIG. 18 shows a cross-sectional structure of the power MOSFET formation region, and a cross-sectional structure of the sense MOSFET formation region is basically the same as the structure in FIG. 18. However, in the sense MOSFET formation region, a source line M2S described later is covered with a protective film 13 and is not exposed.

The foregoing power MOSFET Q1 is formed over the main surface of the semiconductor substrate 1 included in the semiconductor chip CP1.

As shown in FIG. 18, the semiconductor substrate 1 included in the semiconductor chip CP1 is made of, e.g., monocrystalline silicon into which an n-type impurity such as arsenic (As) has been introduced or the like. As the semiconductor substrate 1, a semiconductor substrate (so-called epitaxial wafer) in which, over a substrate main body made of an n-type monocrystalline silicon substrate, an epitaxial layer (semiconductor layer) made of n⁻-type monocrystalline silicon having an impurity concentration lower than that of the substrate main body is formed can also be used.

Over the main surface of the semiconductor substrate 1, a field insulating film (not shown) made of, e.g., silicon dioxide or the like is formed.

In the power MOSFET formation region, in the active region surrounded by the field insulating film, a plurality of unit transistor cells included in the power MOSFET Q1 are formed. The power MOSFET Q1 is formed of the plurality of unit transistor cells which are provided in the power MOSFET formation region and coupled in parallel with each other. In the sense MOSFET formation region, in the active region surrounded by the field insulating film, a plurality of unit transistor cells included in the sense MOSFET Q2 are formed. The sense MOSFET Q2 is formed of the plurality of unit transistor cells which are provided in the sense MOSFET formation region and coupled in parallel with each other.

Each of the unit transistors cells formed in the power MOSFET formation region and each of the unit transistor cells formed in the sense MOSFET formation region have basically the same structure. However, the power MOSFET formation region and the sense MOSFET formation region occupy different areas. The area of the sense MOSFET formation region is smaller than the area of the power MOSFET formation region. Accordingly, the number of the unit transistor cells coupled to each other in the power MOSFET Q1 is different from the number of the unit transistor cells coupled to each other in the sense MOSFET Q2. The number of the unit transistor cells coupled in parallel to each other to form the sense MOSFET Q2 is smaller than the number of the unit transistor cells coupled in parallel to each other to form the power MOSFET Q1. As a result, as long as the source potential in the sense MOSFET Q2 is the same as the source potential in the power MOSFET Q1, a current smaller than the current flowing in the power MOSFET Q1 flows in the sense MOSFET Q2. Each of the unit transistors cells in the power MOSFET formation region and the sense MOSFET formation region is formed of, e.g., an n-channel MOSFET having a trench gate structure.

The semiconductor substrate 1 has the function of the drain region of the foregoing unit transistor cell. Over the entire back surface of the semiconductor substrate 1 (semiconductor chip CP1), the drain back surface electrode (back surface drain electrode or drain electrode) BE is formed. The back surface electrode BE is formed by, e.g., stacking a titanium (Ti) layer, a nickel (Ni) layer, and a gold (Au) layer in this order over the back surface of the semiconductor substrate 1. In the foregoing semiconductor device PKG, the back surface electrode BE of the semiconductor chip CP1 is bonded to the foregoing die pad DP via the foregoing bonding material BD1 and electrically coupled thereto.

In the power MOSFET formation region and the sense MOSFET formation region, each of p-type semiconductor regions 3 formed in the semiconductor substrate 1 has the function of the channel formation region of the foregoing unit transistor cell. Each of n⁺-type semiconductor regions 4 formed over the p-type semiconductor regions 3 has the function of the source region of the foregoing unit transistor cell. Accordingly, the n⁺-type semiconductor region 4 is a source semiconductor region. Each of p⁺-type semiconductor regions 5 is formed over the p-type semiconductor region 3 and between the n⁺-type semiconductor regions 4 adjacent to each other. The p⁺-type semiconductor region 5 has an impurity concentration higher than the impurity concentration of the p-type semiconductor region 3.

In the power MOSFET formation region and the sense MOSFET formation region, in the semiconductor substrate 1, trenches 6 are formed to extend from the main surface of the semiconductor substrate 1 in the thickness direction thereof. The trenches 6 are formed so as to extend from the upper surfaces of the n⁺-type semiconductor regions 4 through the n⁺-type semiconductor regions 4 and the p-type semiconductor regions 3 to terminate in the semiconductor substrate 1 in the layer located therebelow. Over the bottom and side surfaces of the trenches 6, gate insulating films 7 made of silicon dioxide or the like are formed. In the trenches, gate electrodes 8 made of doped polysilicon or the like are embedded via the gate insulating films 7. Each of the gate electrodes 8 has the function of the gate electrode of the foregoing unit transistor cell.

Over the main surface of the semiconductor substrate 1, an interlayer insulating film 9 is formed so as to cover the gate electrodes 8. In the interlayer insulating film 9, contact holes (through holes) are formed. In each of the contact holes formed in the interlayer insulating film 9, a conductive plug 10 is embedded.

Over the interlayer insulating film 9 in which the plugs 10 are embedded, wires M1 are formed. The wires M1 are in a first wiring layer.

Over the interlayer insulating film 9, an interlayer insulating film 11 is formed so as to cover the wires M1. In the interlayer insulating film 11, through holes (through bores) are formed. In each of the through holes formed in the interlayer insulating film 11, a conductive plug 12 is embedded.

Over the interlayer insulating film 11 in which the plugs 12 are embedded, wires M2 and the pad electrodes P1 are formed. The wires M2 are in a second wiring layer.

Each of the wires M1 is made of a conductive film. Specifically, each of the wires M1 is made of a metal film and preferably made of an aluminum film or an aluminum alloy film. Likewise, each of the wires M2 and the pad electrodes P1 is made of a conductive film. Specifically, each of the wires M2 and the pad electrodes P1 is made of a metal film and preferably made of an aluminum film or an aluminum alloy film.

The wires M1 include a gate line (not shown) and a source line M1S. The wires M2 include a gate line (not shown) and a source line M2S.

The source n⁺-type semiconductor regions 4 are electrically coupled to the source line M1S via the plugs 10 disposed over the semiconductor regions 4. To the source line M1S, the p⁺-type semiconductor regions 5 are electrically coupled via the plugs 10 disposed over the semiconductor regions 5. That is, the semiconductor regions 4 and 5 adjacent to each other are electrically coupled to the common source line M1S via the plugs 10. The source line M1S is electrically coupled to the source line M2S via the respective plugs 12 disposed between the source lines M1S and M2S.

The p⁺-type semiconductor regions 5 have the same conductivity type as that of the p-type semiconductor regions 3 and are in contact with the p-type semiconductor regions 3. Accordingly, the p⁺-type semiconductor regions 5 are electrically coupled to the p-type semiconductor regions 3. Consequently, the source line M2S is electrically coupled to the source n⁺-type semiconductor regions 4 through the plugs 12, the source line M1S, and the plugs 10 and is also electrically coupled to the p-type semiconductor regions 3 for channel formation.

The source line M2S electrically coupled to the source (semiconductor region 4 in the power MOSFET formation region) of the power MOSFET Q1 is formed in substantially the entire power MOSFET formation region. The source line M2S has a part thereof exposed from an opening 14 in the protective film 13. The exposed part of the source line M2S forms the foregoing source pad electrode P1S.

The source line M2S electrically coupled to the source (semiconductor region 4 in the sense MOSFET formation region) of the sense MOSFET Q2 is formed in substantially the entire sense MOSFET formation region. The source line M2S is covered with the protective film 13 and is therefore not exposed. The source lines M1S and M2S electrically coupled to the source of the sense MOSFET Q2 are electrically coupled to the control circuit CLC formed in the semiconductor chip CP1. The source lines M1S and M2S electrically coupled to the source of the power MOSFET Q1 and the source lines M1S and M2S electrically coupled to the source of the sense MOSFET Q2 are not electrically coupled to each other and are isolated from each other.

The plurality of gate electrodes 8 formed in the power MOSFET formation region and the sense MOSFET formation region are electrically coupled to each other and electrically coupled to the control circuit CLC formed in the semiconductor chip CP1 via the plugs 10, the gate line (not shown) which is among the wires M1, the plugs 12, and the gate line (not shown) which is among the wires M2.

Over the interlayer insulating film 11, the insulating protective film 13 is formed so as to cover the wires M2 and the pad electrodes. The protective film 13 is made of, e.g., a resin film made of a polyimide resin or the like. The protective film 13 is in the uppermost layer of the semiconductor chip CP1. In the protective film 13, the plurality of openings 14 are formed. From each of the openings 14, a part of a conductor pattern forming the pad electrodes P1 or a part of the source line M2S is exposed. Note that the foregoing source pad electrode P1S is formed of the source line M2S exposed from the opening 14 in the protective film 13 and the pad electrodes P1 other than the foregoing source pad electrode P1S are formed of the conductor pattern (conductor pattern for the pad electrodes P1) formed in the same layer as that of the wires M2. The conductor pattern (not shown in FIG. 32) forming the pad electrodes P1 other than the foregoing source pad electrode P1S is formed in the same layer as that of the wires M2 and in the same step of forming the wires M2 and has, e.g., a quadrilateral two-dimensional shape. Over the top surface of each of the pad electrodes P1 (including also the source pad electrode P1S) exposed from the openings 14, a metal layer (not shown) may also be formed by a plating method or the like.

Also, in FIG. 9 described above, the plurality of source pad electrodes P1S as the source pad electrodes of the foregoing power MOSFET Q1 are isolated from each other by the uppermost-layer protective film 13, but are electrically coupled to each other through the source lines M2S and M1S.

In the semiconductor chip CP1 having such a configuration, operating currents for the unit transistors of the foregoing power MOSFET Q1 and the sense MOSFET Q2 flow between the drain n-type semiconductor substrate 1 and the source n⁺-type semiconductor regions 4 in the thickness direction of the semiconductor substrate 1 along the side surfaces (i.e., the side surfaces of the trenches 6) of the gate electrodes 8. That is, a channel is formed along the thickness direction of the semiconductor chip CP1.

Thus, in the semiconductor chip CP1, the vertical MOSFETs each having the trench-gate structure are formed. Each of the foregoing power MOSFET Q1 and the sense MOSFET Q2 is formed of the trench-gate MOSFETs. Here, the vertical MOSFET corresponds to a MOSFET in which a source-drain current flows in the thickness direction of a semiconductor substrate (direction generally perpendicular to the main surface of the semiconductor substrate).

Also, in the semiconductor chip CP1, the plurality of transistors included in the foregoing control circuit CLC and the wires M1 and M2 are formed in the control circuit formation region. However, the illustration and description thereof is omitted herein.

In the semiconductor chip CP1, a plurality of the foregoing power MOSFETs Q1 can also be embedded.

<About Studied Examples>

Figure 19:
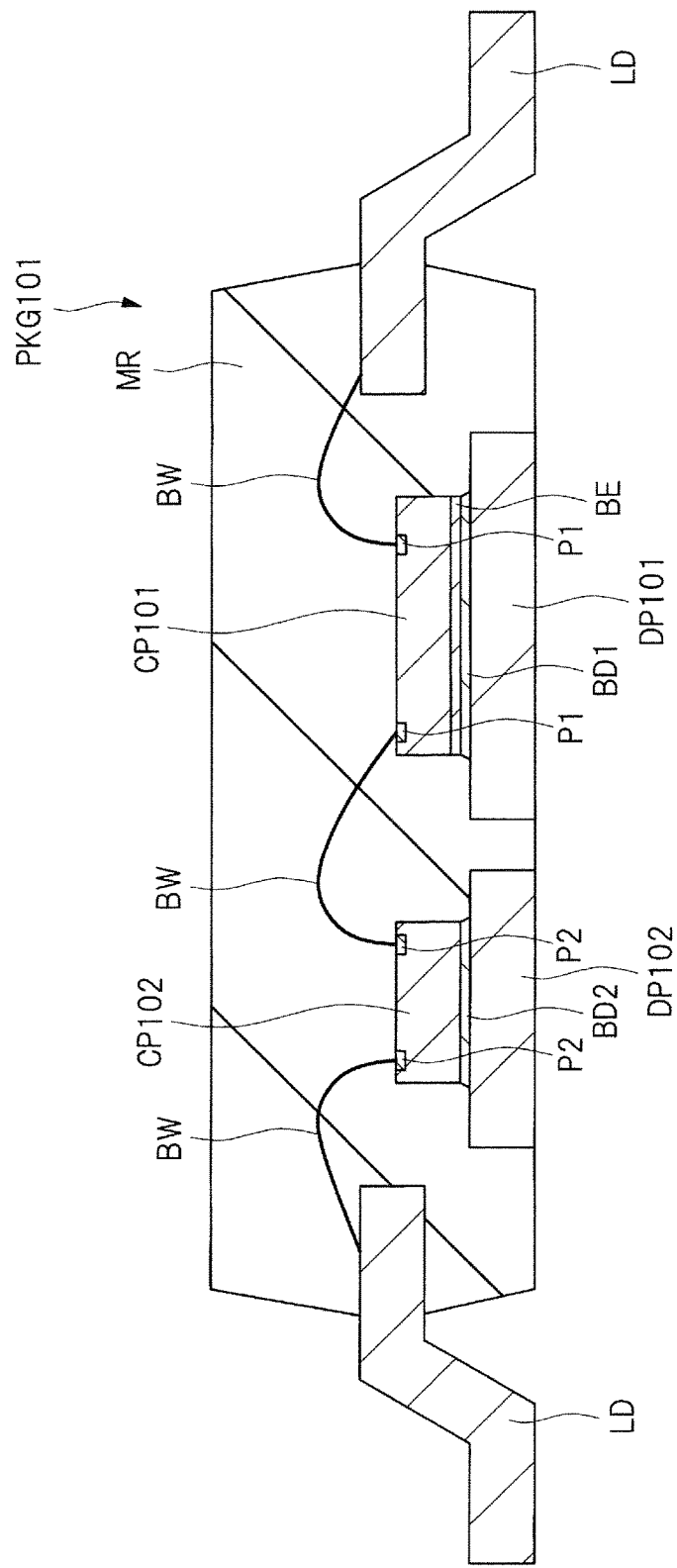
FIG. 19 is a cross-sectional view of a semiconductor device in a first studied example.

FIG. 19 is a cross-sectional view of a semiconductor device (semiconductor package) PKG101 in a first studied example studied by the present inventors, which shows a cross-sectional view corresponding to FIG. 6 described above.

The semiconductor device PKG101 in the first studied example shown in FIG. 19 is mainly different from the semiconductor device PKG in the present embodiment in the following point.

That is, the semiconductor device PKG101 in the first studied example shown in FIG. 19 has two die pads DP101 and DP102. Over the die pad DP101 as one of the two die pads DP101 and DP102, a semiconductor chip CP101 equivalent to the semiconductor chip CP1 is mounted via the bonding material BD1 and, over the die pad DP102 as the other of the two die pads DP101 and DP102, a semiconductor chip CP102 equivalent to the semiconductor chip CP2 is mounted via the bonding material BD2. The die pads DP101 and DP102 are not integrally formed and are electrically isolated from each other. That is, the die pads DP101 and DP102 are sealed in the sealing portion MR, but are electrically isolated from each other by a part of the sealing portion MR which is interposed therebetween. Also, at the back surface of the sealing portion MR, the respective lower surfaces of the die pads DP101 and DP102 are exposed.

In the case where the semiconductor chips CP101 and CP102 are not embedded in the same semiconductor package but the semiconductor package in which the semiconductor chip CP101 is embedded and the semiconductor package in which the semiconductor chip CP102 is embedded are separately provided unlike in the semiconductor devices in the present embodiment and in the first studied example, an electronic device manufactured using such semiconductor packages requires a larger number of components. This increases manufacturing cost and is disadvantageous in terms of reducing the size of the electronic device.

By contrast, in the semiconductor device PKG101 in the first studied example shown in FIG. 19, in the semiconductor device PKG101, the semiconductor chips CP101 and CP102 are embedded. This can reduce the number of components required by an electronic device which is manufactured using the semiconductor device PKG101. Accordingly, it is possible to reduce the manufacturing cost of the electronic device and reduce the size of the electronic device.

However, in the semiconductor device PKG101 in the first studied example, the following problem arises.

That is, since each of the die pad DP101 for mounting the semiconductor chip CP101 and the die pad DP102 for mounting the semiconductor chip CP102 is required and the die pads DP101 and DP102 need to be spaced apart from each other by the sealing portion MR, the two-dimensional size of the semiconductor device PKG101 is increased. This is disadvantageous in terms of reducing the size of the semiconductor device PKG101.

Also, since suspension leads for the die pad DP101 and suspension leads for the die pad DP102 are present in the sealing portion MR, the larger number of suspension leads reduces the number of the leads LD. This is disadvantageous in terms of increasing the number of pins (the number of the leads LD) in the semiconductor device PKG101. The larger number of suspension leads also disadvantageously increases the two-dimensional size of the semiconductor device PKG101.

In addition, a stress may be generated in the part of the sealing portion MR which is interposed between the die pads DP101 and DP102 to cause a crack. This degrades the reliability of the semiconductor device PKG101.

Figure 20:
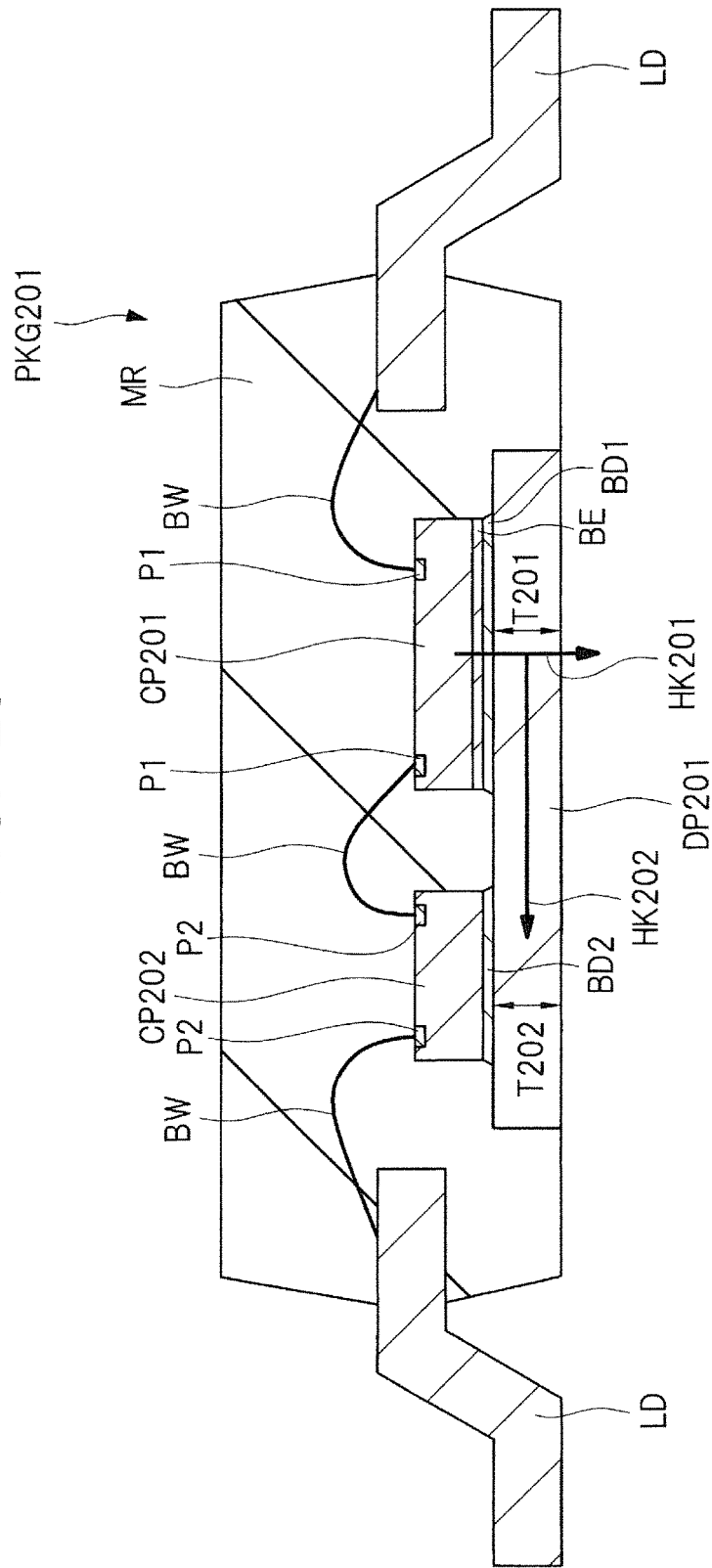
FIG. 20 is a cross-sectional view of a semiconductor device in a second studied example.

FIG. 20 is a cross-sectional view of a semiconductor device (semiconductor package) PKG2 in a second studied example studied by the present inventors, which shows a cross-sectional view corresponding to FIGS. 6 and 19 described above.

In the semiconductor device PKG201 in the second studied example, a semiconductor chip CP201 equivalent to the semiconductor chip CP1 and a semiconductor chip CP202 equivalent to the semiconductor chip CP2 are mounted over a common die pad DP201. Note that the thickness of the die pad DP201 is uniform and a thickness T201 of the portion of the die pad DP201 over which the semiconductor chip CP201 is mounted is equal to a thickness T202 of the portion of the die pad DP201 over which the semiconductor chip CP202 is mounted (i.e., T201=T202). Note that the thicknesses T201 and T202 of the die pad DP201 are set equal to the thickness T2 of the thicker portion DP2 of the die pad DP in the present embodiment.

By mounting the semiconductor chips CP201 and CP202 over the common die pad DP201, the two-dimensional size of the semiconductor device PKG201 in the second studied example shown in FIG. 20 can be set smaller than the two-dimensional size of the semiconductor device PKG101 in the first studied example shown in FIG. 19. This can reduce the size of the semiconductor device. In addition, the number of the suspension leads can be set smaller in the semiconductor device PKG201 in the second studied example shown in FIG. 20 than in the semiconductor device PKG101 in the first studied example shown in FIG. 19. This can increase the number of pins (the number of the leads LD) in the semiconductor device PKG201. Moreover, the semiconductor device PKG201 in the second studied example shown in FIG. 20 is free from concern about the formation of a crack in the part of the sealing portion MR which is interposed between the die pads DP101 and DP102, which may occur in the semiconductor device PKG101 in the first studied example shown in FIG. 19. Therefore, it is possible to improve the reliability of the semiconductor device PKG201.

However, in the semiconductor device PKG201 in the second studied example, the following problem arises.

That is, in the case where the semiconductor chips CP201 and CP202 are arranged in juxtaposition over the common die pad DP201, the heat generated in the semiconductor chip CP201 is undesirably transferred to the semiconductor chip CP202 through the die pad DP201. As a result, the semiconductor chip CP202 is susceptible to the influence of the heat generated in the semiconductor chip CP201.

FIG. 20 shows main transfer paths HK201 and HK202 for the heat generated in the semiconductor chip CP201 in the semiconductor device PKG201 in the second studied example. The transfer path HK201 is a path along which the heat conducted from the semiconductor chip CP201 to the die pad DP201 via the bonding material BD1 is downwardly transferred in the die pad DP201 to be dissipated from the lower surface of the die pad DP201 to the outside of the semiconductor device PKG201 (e.g., to the mounting substrate over which the semiconductor device PKG201 is mounted or the like). The transfer path HK202 is a path along which the heat conducted from the semiconductor chip CP201 to the die pad DP201 via the bonding material BD1 is laterally transferred in the die pad DP201 to be transferred to the semiconductor chip CP202. The heat conducted along the transfer path HK202 is conducted from the die pad DP201 to the semiconductor chip CP202 via the bonding material BD2 to result in the temperature rise of the semiconductor chip CP202.

Here, the semiconductor chip CP201 is equivalent to the foregoing semiconductor chip CP1 and has an embedded power transistor in which a large current flows so that the amount of heat generated therein is large. By contrast, the semiconductor chip CP202 is equivalent to the foregoing semiconductor chip CP2 and controls the semiconductor chip CP201. The semiconductor chip CP202 does not have such an embedded power transistor. The current flowing in the semiconductor chip P202 is smaller than the current flowing in the semiconductor chip CP201. Accordingly, the amount of heat generated in the semiconductor chip CP202 is smaller than the amount of heat generated is the semiconductor chip CP201. Thus, the amount of heat generated in the semiconductor chip CP202 is not so large so that the temperature rise of the semiconductor chip CP202 resulting from the heat generated therein is not so large. However, since the heat (heat transferred along the foregoing transfer path HK202) transferred from the semiconductor chip CP201 to the semiconductor chip CP202 through the die pad DP201 causes an extra temperature rise, the temperature of the semiconductor chip CP202 considerably rises. That is, in the case of the semiconductor device PKG101 in the first studied example in FIG. 19, the die pad DP101 mounting the semiconductor chip CP101 and the die pad DP102 mounting the semiconductor chip CP102 are isolated from each other via the sealing portion MR. As a result, the influence of the heat generation in the semiconductor chip CP101 exerted on the semiconductor chip CP102 is not so large and the temperature rise of the semiconductor chip CP102 is not so large. However, in the case of the semiconductor device PKG201 in the second studied example in FIG. 20, the semiconductor chips CP201 and CP202 are mounted over the common die pad DP201 so that heat transfer occurs along the foregoing transfer path HK202. As a result, the semiconductor chip CP202 is susceptible to the influence of the heat generation in the semiconductor chip CP201 through the die pad DP201. This accelerates the temperature rise of the semiconductor chip CP202. Thus, in the case of the semiconductor device PKG201 in the second studied example in FIG. 20, due to the heat generation in the semiconductor chip CP201, the temperature of the semiconductor chip CP202 rises. The temperature rise of the semiconductor chip CP202 leads to the degradation of the reliability and performance of the semiconductor device PKG201. Therefore, it is desirable to minimize the temperature rise of the semiconductor chip CP202.

<About Main Characteristic Features and Effects>

The semiconductor device PKG in the present embodiment includes the die pad DP (chip mounting portion), the semiconductor chip CP1 (first semiconductor chip) and the semiconductor chip CP2 (second semiconductor chip) which are mounted over the die pad DP, and the sealing portion MR (sealing body) sealing therein at least a part of the die pad DP.

Here, the semiconductor chip CP1 is the semiconductor chip (first semiconductor chip) which includes the power transistor and the semiconductor chip CP2 is the semiconductor chip (second semiconductor chip) which controls the semiconductor chip CP1 (first semiconductor chip). From another perspective, the amount of heat generated in the semiconductor chip CP1 (first semiconductor chip) during the operation thereof is larger than the amount of heat generated in the semiconductor chip CP2 (second semiconductor chip) during the operation thereof.

One of the main characteristic features of the present embodiment is that the thickness of the portion (first portion) of the die pad DP (chip mounting portion) over which the semiconductor chip CP1 is mounted is smaller than the thickness of the portion (second portion) of the die pad DP (chip mounting portion) over which the semiconductor chip CP2 is mounted. This can inhibit or prevent the temperature rise of the semiconductor chip CP2 resulting from the heat generation from the semiconductor chip CP1 and improve the reliability and performance of the semiconductor device PK. The following is a specific description thereof.

In the present embodiment, the thickness of the die pad DP is not uniform. In the die pad DP, the thicker portion DP2 as a portion having a larger thickness and the thinner portion DP1 as a portion having a smaller thickness are integrally formed. The thickness T2 of the thicker portion DP2 of the die pad DP is larger than the thickness T1 of the thinner portion DP1 of the die pad DP (T2>T1). In other words, the thickness T1 of the thinner portion DP1 of the die pad DP is smaller than the thickness T2 of the thicker portion DP2 of the die pad DP (T2>T1). Note that the thickness T2 corresponds to the thickness (dimension) of the thicker portion DP2 of the die pad DP in a direction generally perpendicular to the surface thereof over which the semiconductor chip CP2 is mounted. The thickness T1 corresponds to the thickness (dimension) of the thinner portion DP1 of the die pad DP in a direction generally perpendicular to the surface thereof over which the semiconductor chip CP1 is mounted.

The semiconductor chip CP1 is mounted over the thinner portion DP1 of the die pad DP1 via the bonding material BD1. The semiconductor chip CP2 is mounted over the thicker portion DP2 of the die pad DP via the bonding material BD2. Consequently, the thickness (corresponding to the thickness T1) of the portion (corresponding to the thinner portion DP1 immediately under the semiconductor chip CP1) of the die pad DP over which the semiconductor chip CP1 is mounted is smaller than the thickness (corresponding to the thickness T2) of the portion (corresponding to the thicker portion DP2 immediately under the semiconductor chip CP2) of the die pad DP over which the semiconductor chip CP2 is mounted.

In FIG. 6 described above, main transfer paths HK1 and HK2 for the heat generated in the semiconductor chip CP1 in the semiconductor device PKG in the present embodiment are shown by the arrows. The transfer path HK1 is a transfer path equivalent to the foregoing transfer path HK201, which is a path along which the heat conducted from the semiconductor chip CP1 to the die pad DP (thinner portion DP1) via the bonding material BD1 is downwardly transferred in the die pad DP (thinner portion DP1) to be dissipated from the lower surface of the die pad DP (thinner portion DP1) to the outside of the semiconductor device PKG (e.g., to the mounting substrate mounting the semiconductor device PKG or the like). The transfer path HK2 is a path along which the heat conducted from the semiconductor chip CP1 to the die pad DP (thinner portion DP1) via the bonding material BD1 is laterally transferred in the die pad DP to be transferred to the semiconductor chip CP2 (to the thicker portion DP2 immediately under the semiconductor chip CP2). The heat conducted along the transfer path HK2 is conducted from the die pad DP (thicker portion DP2 immediately under the semiconductor chip CP2) to the semiconductor chip CP2 via the bonding material BD2. This may result in the temperature rise of the semiconductor chip CP2 and cause an unstable operation of the semiconductor chip CP2.

In the semiconductor device PKG201 in the second studied example in FIG. 20 described above, the thickness T201 of the die pad DP201 immediately under the semiconductor chip CP201 is rather large. Accordingly, when the semiconductor device PKG201 is mounted over a mounting substrate or the like, the heat resistance between the semiconductor chip CP201 in the semiconductor device PKG201 and the mounting substrate increases to be relatively large. This suppresses the heat transfer along the foregoing transfer path HK201 to a degree and undesirably increases the heat transfer along the foregoing transfer path HK202. As a result, the heat generated in the semiconductor chip CP1 is likely to be conducted to the semiconductor chip CP202 via the foregoing transfer path HK202. This accelerates the temperature rise of the semiconductor chip CP202.

By contrast, in the present embodiment, the die pad DP has the thicker portion DP2 having a larger thickness and the thinner portion DP1 having a smaller thickness, and the semiconductor chip CP1 is mounted over the thinner portion DP1 having a smaller thickness. This can reduce the thickness of the portion of the die pad DP over which the semiconductor chip CP1 is mounted, i.e., the thickness (T1) of the portion of the die pad DP which is located immediately under the semiconductor chip CP1. As a result, when the semiconductor device PKG is mounted over a mounting substrate or the like, the heat resistance between the semiconductor chip CP1 in the semiconductor device PKG and the mounting substrate can be reduced. This can accelerate the heat transfer along the foregoing transfer path HK1 and accordingly suppress the heat transfer along the foregoing transfer path HK2.

That is, to cause the heat generated in the semiconductor chip CP1 to be promptly transferred along the foregoing transfer path HK1 and dissipated to the outside of the semiconductor device PKG, it is effective to reduce the heat resistance between the mounting substrate and the semiconductor chip CP1 in the semiconductor device PKG and is accordingly effective to reduce the thickness (T1) of the portion of the die pad DP which is located immediately under the semiconductor chip CP1. If it is possible to cause the heat generated in the semiconductor chip CP1 to be promptly transferred along the foregoing transfer path HK1 and dissipated to the outside of the semiconductor device PKG, the amount of heat generated in the semiconductor chip CP1 and conducted from the semiconductor chip CP1 to the die pad DP immediately under the semiconductor chip CP2 via the foregoing transfer path HK2 can accordingly be reduced. Thus, a reduction in the thickness (T1) of the portion of the die pad DP which is located immediately under the semiconductor chip CP1 leads to prompt transfer of the heat generated in the semiconductor chip CP1 along the foregoing transfer path HK1 and dissipation of the heat to the outside of the semiconductor device PKG. The reduction in the thickness (T1) of the portion of the die pad DP which is located immediately under the semiconductor chip CP1 also leads to a reduction in the amount of heat conducted from the semiconductor chip CP1 to the die pad DP immediately under the semiconductor chip CP2 via the foregoing transfer path HK2.

On the other hand, the die pad DP (thicker portion DP2) immediately under the semiconductor chip CP2 can function also as a heat bath (heat sink) for the semiconductor chip CP2. Accordingly, as long as the amount of heat conducted from the semiconductor chip CP1 to the die pad DP (thicker portion DP2) immediately under the semiconductor chip CP2 via the foregoing transfer path HK2 is equal, as the heat capacity of the die pad DP (thicker portion DP2) immediately under the semiconductor chip CP2 is larger, the temperature rise of the die pad DP (thicker portion DP2) immediately under the semiconductor chip CP2 is smaller and accordingly the temperature rise of the semiconductor chip CP2 is smaller. Here, as the thickness (T2) of the die pad DP (thicker portion DP2) immediately under the semiconductor chip CP2 is larger, the heat capacity of the die pad DP (thicker portion DP2) immediately under the semiconductor chip CP2 is larger. Consequently, as the thickness (T2) of the die pad DP (thicker portion DP2) immediately under the semiconductor chip CP2 is larger, the temperature rise of the die pad DP (thicker portion DP2) immediately under the semiconductor chip CP2 is smaller and accordingly the temperature rise of the semiconductor chip CP2 is smaller.

That is, a reduction in the thickness (T1) of the portion (thinner portion DP1) of the die pad DP which is located immediately under the semiconductor chip CP1 acts to accelerate the heat transfer along the foregoing transfer path HK1 and suppress the heat transfer along the foregoing transfer path HK2. On the other hand, an increase in the thickness (T2) of the die pad DP (thicker portion DP2) immediately under the semiconductor chip CP2 acts to suppress the temperature rise of the semiconductor chip CP2 resulting from the amount of heat transferred along the foregoing transfer path HK2. To suppress the temperature rise of the semiconductor chip CP2 resulting from the heat generated in the semiconductor chip CP1, it is effective to reduce the foregoing thickness T1 and thus suppress the heat transfer along the foregoing transfer path HK2 and increase the foregoing thickness T2 and thus increase the heat capacity of the die pad DP (thicker portion DP2) immediately under the semiconductor chip CP2. In the present embodiment, the thickness (T1) of the portion (thinner portion DP1) of the die pad DP which is located immediately under the semiconductor chip CP1 is reduced and the thickness (T2) of the die pad DP (thicker portion DP2) immediately under the semiconductor chip CP2 is increased. By thus reducing the amount of heat transferred from the semiconductor chip CP1 to the die pad DP (thicker portion DP2) immediately under the semiconductor chip CP2 along the foregoing transfer path HK2 and increasing the heat capacity of the die pad DP (thicker portion DP2) immediately under the semiconductor chip CP2, it is possible to suppress the temperature rise of the semiconductor chip CP2 resulting from the amount of heat transferred along the foregoing transfer path HK2.

In the semiconductor device PKG201 in the second studied example in FIG. 20 described above, the thickness of the die pad DP201 is uniform. The thickness T201 of the portion of the die pad DP201 which is located immediately under the semiconductor chip CP201 is equal to the thickness T202 of the portion of the die pad DP201 which is located immediately under the semiconductor chip CP202 (T201=T202). In this case, when the thickness T201 of the portion of the die pad DP201 which is located immediately under the semiconductor chip CP201 is larger, the amount of heat conducted from the semiconductor chip CP201 to the die pad DP201 immediately under the semiconductor chip CP202 via the foregoing transfer path HK202 is increased to a degree so that the temperature rise of the semiconductor chip CP202 is also increased to a degree.

A consideration will be given herein to a hypothetical case where, in the semiconductor device PKG201 in the second studied example in FIG. 20 described above, the thickness of the die pad DP201 is reduced, while the thickness of the die pad DP201 is held uniform. In this case, since the relationship given by T201=T202 is maintained, not only the thickness T201 of the portion of the die pad DP201 which is located immediately under the semiconductor chip CP201, but also the thickness T202 of the portion of the die pad DP201 which is located immediately under the semiconductor chip CP202 is reduced. In this case, since the thickness T201 of the portion of the die pad DP201 which is located immediately under the semiconductor chip CP201 is reduced, it is possible to accelerate the heat transfer along the foregoing transfer path HK201 and suppress the heat transfer along the foregoing transfer path HK202. This can reduce the amount of heat conducted from the semiconductor chip CP201 to the die pad DP201 immediately under the semiconductor chip CP202 via the foregoing transfer path HK202. However, in this case, the thickness T202 of the portion of the die pad DP201 which is located immediately under the semiconductor chip CP202 is also reduced. In the structure with the reduced thickness T202, the heat capacity of the die pad DP201 immediately under the semiconductor chip CP202 is small and, when heat is conducted to the die pad DP201 immediately under the semiconductor chip CP202, the temperature of the semiconductor chip CP202 is likely to rise. The structure is such that, even when the thickness T201 is reduced to reduce the amount of heat conducted from the semiconductor chip CP201 to the die pad DP201 immediately under the semiconductor chip CP202 via the foregoing transfer path HK202, due to the reduced thickness T202, the temperature of the semiconductor chip CP202 is likely to rise. Consequently, the effect of suppressing the temperature rise of the semiconductor chip CP201 cannot be obtained or is low even though the effect is obtained.

By contrast, in the present embodiment, the thickness (T1) of the portion of the die pad DP which is located immediately under the semiconductor chip CP1 is set smaller than the thickness (T2) of the portion of the die pad DP which is located immediately under the semiconductor chip CP2. In other words, the thickness (T2) of the portion of the die pad DP which is located immediately under the semiconductor chip CP2 is set larger than the thickness (T1) of the portion of the die pad DP which is located immediately under the semiconductor chip CP1. Thus, it is possible to reduce the thickness (T1) of the portion of the die pad DP which is located immediately under the semiconductor chip CP1 and increase the thickness (T2) of the portion of the die pad DP which is located immediately under the semiconductor chip CP2. By reducing the thickness T1, the structure which can suppress the heat transfer along the foregoing transfer path HK2 can be obtained and, by increasing the thickness T2, the structure in which the heat capacity of the die pad DP (thicker portion DP2) immediately under the semiconductor chip CP2 is increased and the temperature rise of the semiconductor chip CP202 is less likely to occur can be obtained. Thus, it is possible to reduce the amount of heat conducted from the semiconductor chip CP1 to the die pad DP (thicker portion DP2) immediately under the semiconductor chip CP2 via the foregoing transfer path HK2 and suppress the temperature rise of the semiconductor chip CP2 resulting from the amount of heat. This can suppress the temperature rise of the semiconductor chip CP2 resulting from the heat generated in the semiconductor chip CP1. Therefore, it is possible to suppress or prevent the temperature rise of the semiconductor chip CP2 during the operation of the semiconductor device PKG and improve the reliability and performance of the semiconductor device PKG.

A further description will be given of other characteristic features of the present embodiment.

In the present embodiment, as described above, the thickness (T1) of the portion of the die pad DP over which the semiconductor chip CP1 is mounted is smaller than the thickness (T2) of the portion of the die pad DP over which the semiconductor chip CP2 is mounted. Also, in the present embodiment, the thickness (T1) of the portion of the die pad DP over which the semiconductor chip CP1 is mounted is more preferably not more than 50% of the thickness (T2) of the portion of the die pad DP over which the semiconductor chip CP2 is mounted (T1≤T2×0.5). This allows the effect of suppressing the temperature rise of the semiconductor chip CP2 resulting from the heat generated in the semiconductor chip CP2 to be more reliably obtained.

When the thickness (T1) of the thinner portion DP1 of the die pad DP is excessively reduced, the strength of the die pad DP decreases and the manufacturing process of the semiconductor device PKG may be difficult to perform. Accordingly, the thickness (T1) of the portion of the die pad DP over which the semiconductor chip CP1 is mounted is more preferably not less than 20% of the thickness (T2) of the portion of the die pad DP over which the semiconductor chip CP2 is mounted (T1≥T2×0.2).

Also, the thickness (T2) of the portion of the die pad DP over which the semiconductor chip CP2 is mounted, i.e., the thickness T2 of the thicker portion DP2 of the die pad DP is more preferably equal to a thickness T3 of each of the leads LD. This facilitates the production of the foregoing lead frame LF used to manufacture the semiconductor device PKG. As a result, the semiconductor device PKG is manufactured more easily and the manufacturing cost of the semiconductor device can be reduced. Note that the thickness T3 of each of the leads LD is shown in FIGS. 6 to 8 described above.

That is, when the semiconductor device PKG is manufactured, the foregoing lead frame LF for manufacturing the semiconductor device PKG is used. In the lead frame LF, the die pad DP, the plurality of suspension leads TL, the plurality of leads LD, and the frame rim are integrally connected. The lead frame LF can be produced by processing a plate-like member such as a metal plate. When the lead frame LF is produced, by thinning the portion of the metal plate to be processed into the lead frame LF which is to serve as the thinner portion DP1 of the die pad DP using a technique such as etching or press working, the die pad DP integrally having the thinner portion DP1 having a smaller thickness and the thicker portion DP2 having a larger thickness can be formed easily and properly. In that case, each of the thicker portion DP2 of the die pad DP and the leads LD has a thickness substantially equal to the thickness of the metal plate to be processed into the lead frame LF. Consequently, the thickness (T2) of the thicker portion DP2 of the die pad DP2 is substantially equal to the thickness (T3) of each of the leads LD. Accordingly, when the thickness T2 of the thicker portion DP2 of the die pad DP is equal to the thickness T3 of each of the leads LD, the lead frame LF used to manufacture the semiconductor device PKG is produced more easily.

Figure 21:
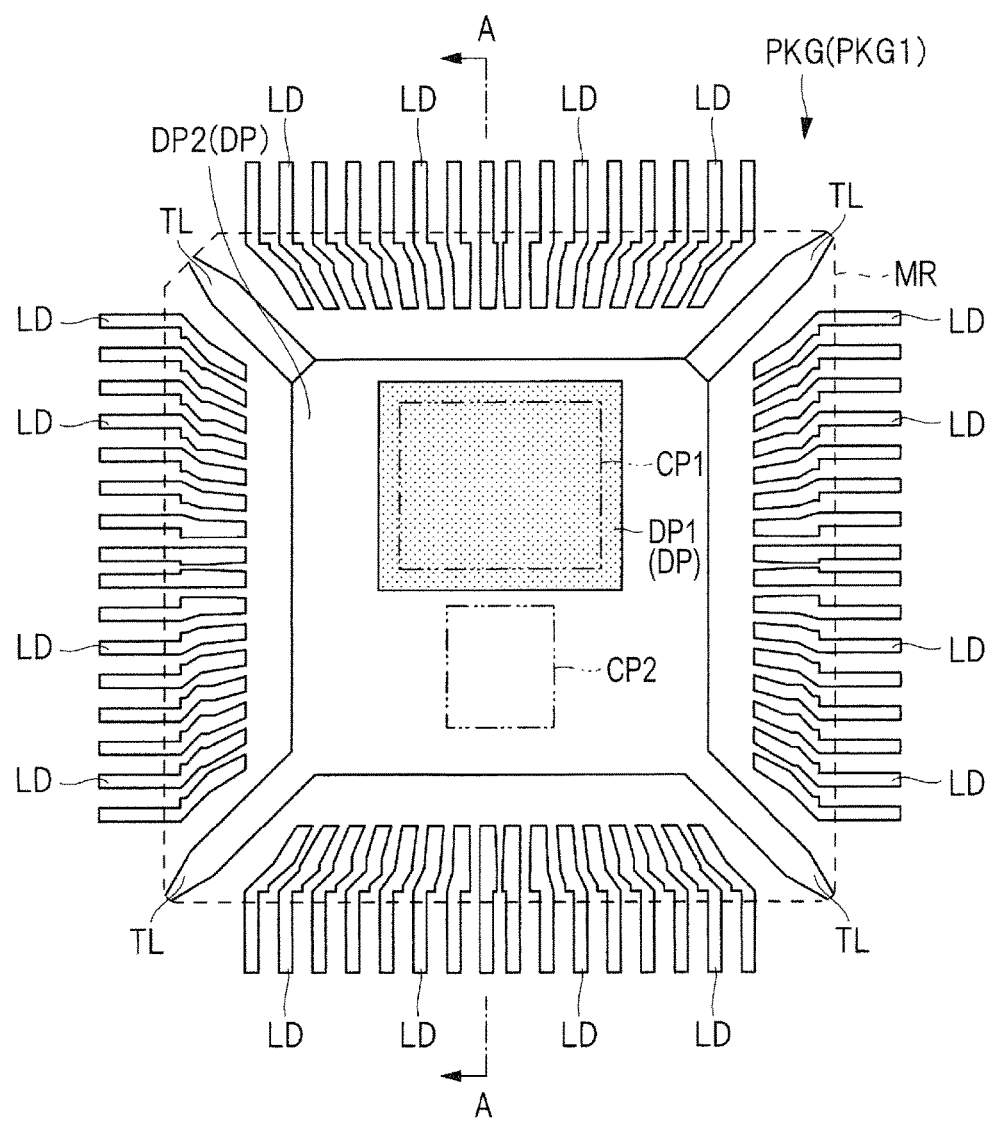
FIG. 21 is a plan view showing a first modification of the semiconductor device in the embodiment.
Figure 22:
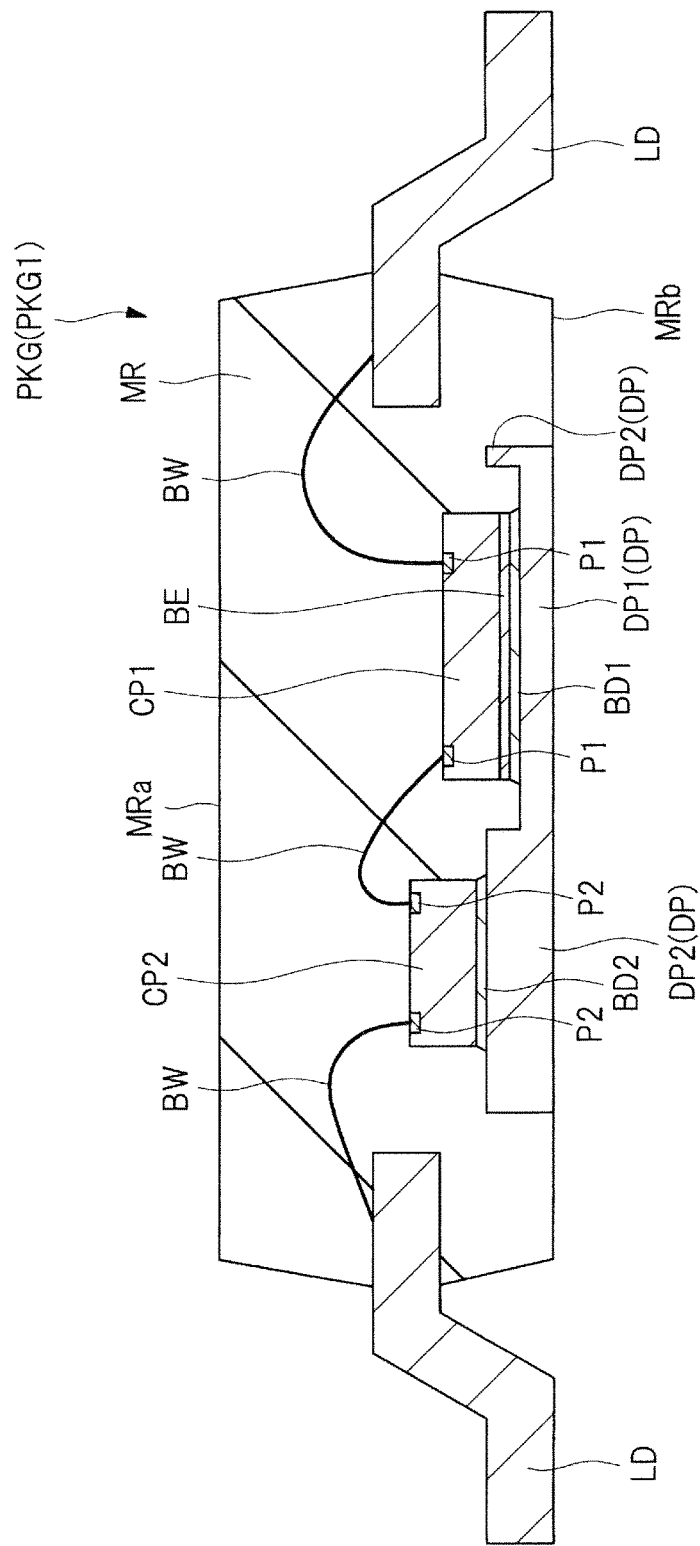
FIG. 22 is a cross-sectional view showing the first modification of the semiconductor device in the embodiment.

FIGS. 21 and 22 are a plan view (FIG. 21) and a cross-sectional view (FIG. 22) each showing a first modification of the semiconductor device PKG in the present embodiment and respectively correspond to FIGS. 4 and 6 described above. Note that, for easier understanding, the following will refer to the semiconductor device PKG in the first modification as a semiconductor device PKG1 using the reference numeral PKG1.

FIG. 21 shows a perspective plan view of the upper surface of the semiconductor device PKG1 in the first modification when viewed through the sealing portion MR, the wires BW, and the semiconductor chips CP1 and CP2 (when the sealing portion MR, the wires BW, and the semiconductor chips CP1 and CP2 are omitted). In FIG. 21, the position of the outer periphery of the sealing portion MR is shown by the broken line. The cross section of the semiconductor device PKG1 at the position along the line A-A in FIG. 21 substantially corresponds to FIG. 22. Note that FIG. 21 is a plan view but, for easier understanding, the thinner portion DP1 of the die pad DP is hatched with dots. Also, the respective positions at which the semiconductor chips CP1 and CP2 are mounted are shown by the two-dot-dash lines.

The semiconductor device PKG1 in the first modification shown in FIGS. 21 and 22 are different from the semiconductor device PKG shown in FIGS. 1 to 10 described above in that, in the case of the semiconductor device PKG1 in the first modification shown in FIGS. 21 and 22, the thicker portion DP2 of the die pad DP surrounds the periphery of the thinner portion DP1 thereof in plan view. That is, in the case of the semiconductor device PKG1 in the first modification shown in FIGS. 21 and 22, the thinner portion PD1 of the die pad DP is in the form of a recessed portion (depressed portion). The semiconductor device PKG1 in the first modification shown in FIGS. 21 and 22 has otherwise substantially the same configuration as that of the semiconductor device PKG shown in FIGS. 1 to 10 described above.

In the case of FIG. 3 described above, the thicker portion DP2 and the thinner portion DP1 of the die pad DP are adjacent to each other in plan view. The entire part of the die pad DP which is located on one side of the boundary between the thicker portion DP2 and the thinner portion DP1 (boundary line extending from the side DH2 of the die pad DP to the side DH4 thereof) serves as the thicker portion DP2, while the entire part of the die pad DP which is located on the other side of the boundary between the thicker portion DP2 and the thinner portion DP1 serves as the thinner portion DP1. According, in the die pad DP, the thinner portion DP1 is not surrounded by the thicker portion DP2 and reaches the sides DH1, DH2, and DH4 of the die pad DP, while the thicker portion DP2 reaches the sides DH2, DH3, and DH4 of the die pad DP.

On the other hand, in the case of the first modification shown in FIGS. 21 and 22, the thicker portion DP2 surrounds the periphery of the thinner portion DP1 in plan view.

Accordingly, in plan view, the outer peripheral portion (peripheral edge portion) of the die pad DP is formed of the thicker portion DP2.

Note that the semiconductor device PKG1 in the first modification shown in FIGS. 21 and 22 is the same as the semiconductor device PKG shown in FIGS. 1 to 10 described above in that, in plan view, the region where the semiconductor chip CP1 is mounted is included in the thinner portion DP1 and the region where the semiconductor chip CP2 is mounted is included in the thicker portion DP2.

From the semiconductor device PKG1 in the first modification shown in FIGS. 21 and 22, the following effect can further be obtained in addition to the effect obtained from the semiconductor device PKG shown in FIGS. 1 to 10 described above. That is, in the case of the first modification shown in FIGS. 21 and 22, the outer peripheral portion of the die pad DP is formed of the thicker portion DP2. This can enhance the strength of the die pad DP. As a result, the manufacturing process of the semiconductor device PKG is more easily performed.

Figure 23:
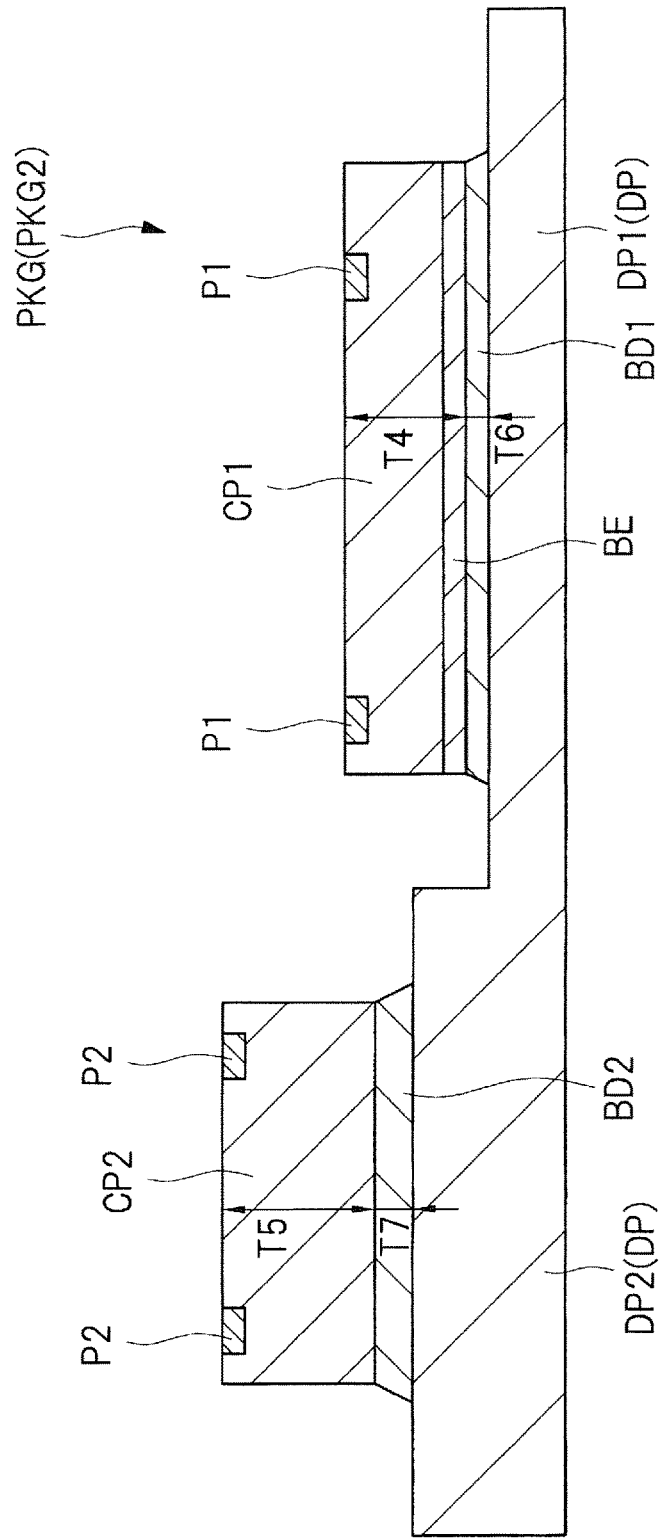
FIG. 23 is a partially enlarged cross-sectional view showing the first modification of the semiconductor device in the embodiment.

FIG. 23 is a partially enlarged cross-sectional view showing a second modification of the semiconductor device PKG in the present embodiment and corresponds to FIG. 10 described above. Note that, for easier understanding, the following will refer to the semiconductor device PKG in the second modification as a semiconductor device PKG2 using the reference numeral PKG2.

In the same manner as in FIG. 10 described above, in FIG. 23 also, the die pad DP, the semiconductor chip CP1 mounted over the die pad DP via the bonding material BD1, and the semiconductor chip CP2 mounted over the die pad DP via the bonding material BD2 are shown. However, the illustration of the wires BW, the leads LD, and the sealing portion MR is omitted.

The semiconductor device PKG2 in the second modification shown in FIG. 23 is different from the semiconductor device PKG shown in FIGS. 1 to 10 described above in the following two points.

The first point is that, in the semiconductor device PKG2 in the second modification shown in FIG. 23, a thickness T4 of the semiconductor chip CP1 is smaller than a thickness T5 of the semiconductor chip CP2 (T4<T5). That is, in the case of the semiconductor device PKG in FIGS. 1 to 10 described above, the thickness of the semiconductor chip CP1 is substantially the same as the thickness of the semiconductor chip CP2. However, in the case of the semiconductor device PKG2 in the second modification in FIG. 23, by thinning the semiconductor chip CP1, the thickness T4 of the semiconductor chip CP1 is set smaller than the thickness T5 of the semiconductor chip CP2. Consequently, in the case of the semiconductor device PKG2 in the second modification in FIG. 23, the thickness T5 of the semiconductor chip CP2 is larger than the thickness T4 of the semiconductor chip CP1.

The second point is that, in the semiconductor device PKG2 in the second modification shown in FIG. 23, a thickness T7 of the bonding material BD2 (second bonding layer) bonding the semiconductor chip CP2 to the die pad (thicker portion DP2) is larger than a thickness T6 of the bonding material BD1 (first bonding layer) bonding the semiconductor chip CP1 to the die pad DP (thinner portion DP1) (T7>T6). That is, in the case of the semiconductor device PKG in FIGS. 1 to 10 described above, the thickness of the bonding material BD2 bonding the semiconductor chip CP2 is substantially equal to the thickness of the bonding material BD1 bonding the semiconductor chip CP1. In the case of the semiconductor device PKG2 in the second modification in FIG. 23, the thickness (T7) of the bonding material BD2 bonding the semiconductor chip CP2 is set larger than the thickness (T6) of the bonding material BD1 bonding the semiconductor chip CP1. In other words, in the case of the semiconductor device PKG2 in the second modification in FIG. 23, the thickness (T6) of the bonding material BD1 bonding the semiconductor chip CP1 is set smaller than the thickness (T7) of the bonding material BD2 bonding the semiconductor chip CP2. Note that the thickness T6 of the bonding material BD1 corresponds to the thickness of the bonding material BD1 between the die pad DP and the semiconductor chip CP1. The thickness T7 of the bonding material BD2 corresponds to the thickness of the bonding material BD2 between the die pad DP and the semiconductor chip CP2.

First, a description will be given of the foregoing first point.

In the semiconductor chip CP1, a larger amount of heat is generated during the operation thereof. The heat is generated mainly at the top surface (in the vicinity of the top surface) of the semiconductor chip CP1. This is because, in the semiconductor chip CP1, the transistor element forming the power transistor is formed over the main surface of the semiconductor substrate (corresponding to the foregoing semiconductor substrate 1) included in the semiconductor chip CP1.

As a result, when the thickness of the semiconductor chip CP1 is large, the heat generated at the top surface of the semiconductor chip CP1 is less likely to be conducted to the die pad DP (thinner portion DP1) and is less likely to be dissipated to the outside of the semiconductor device PKG (to a mounting substrate over which the semiconductor device PKG is mounted or the like) along the foregoing transfer path HK1. Accordingly, it is desirable to reduce the thickness (T4) of the semiconductor chip CP1 to cause the heat generated at the top surface (in the vicinity of the top surface) of the semiconductor chip CP1 to be promptly transferred to the die pad DP (thinner portion DP1) and dissipate the heat to the outside of the semiconductor device PKG along the foregoing transfer path HK1.

On the other hand, the amount of heat generated in the semiconductor chip CP2 during the operation thereof is smaller than the amount of heat generated in the semiconductor chip CP1 during the operation thereof. Therefore, there is little need to consider the heat transfer from the semiconductor chip CP2 to the die pad DP. Instead, it is desirable to ensure the heat capacity of the semiconductor chip CP2 by increasing the thickness (T5) of the semiconductor chip CP2 so as to be able to suppress the temperature rise of the semiconductor chip CP2 when the heat generated in the semiconductor chip CP1 is conducted to the semiconductor chip CP2 via the die pad DP.

Accordingly, like in the semiconductor device PKG2 in the second modification shown in FIG. 23, the thickness T4 of the semiconductor chip CP1 is more preferably smaller than the thickness T5 of the semiconductor chip CP2 (i.e., T4<T5). By thus reducing the thickness T4 of the semiconductor chip CP1, the heat generated at the top surface of the semiconductor chip CP1 is more likely to be dissipated to the outside of the semiconductor device PKG along the foregoing transfer path HK1 and the temperature rise of the semiconductor chip CP2 can further be suppressed.

Next, a description will be given of the foregoing second point.

To cause the heat generated at the top surface (in the vicinity of the top surface) of the semiconductor chip CP1 to be promptly transferred to the die pad DP (thinner portion DP1) and dissipate the heat to the outside of the semiconductor device PKG along the foregoing transfer path HK1, it is effective to reduce the heat resistance of the bonding material BD1. By reducing the thickness T6 of the bonding material BD1, the heat resistance of the bonding material BD1 can be reduced. Also, to suppress the temperature rise of the semiconductor chip CP1 when the heat generated in the semiconductor chip CP1 is conducted to the die pad DP (thicker portion DP2) immediately under the semiconductor chip CP2 via the foregoing transfer path HK2, it is effective to increase the heat resistance of the bonding material BD2 and reduce the likelihood of the heat to be conducted from the die pad DP (thicker portion DP2) to the semiconductor chip CP2. By increasing the thickness T7 of the bonding material BD2, the heat resistance of the bonding material BD2 can be increased.

Accordingly, like in the semiconductor device PKG2 in the second modification shown in FIG. 23, the thickness T6 of the bonding material BD1 is more preferably smaller than the thickness T7 of the bonding material BD2 (T6<T7). By thus reducing the thickness T6 of the bonding material BD1, the heat generated at the top surface of the semiconductor chip CP1 is more likely to be dissipated to the outside of the semiconductor device PKG along the foregoing transfer path HK1. In addition, by increasing the thickness T7 of the bonding material BD2, the temperature rise of the semiconductor chip CP2 can further be suppressed.

Note that, in the semiconductor device PKG2 in the second modification shown in FIG. 23, each of the foregoing first point (the relationship given by T4<T5) and the second point (the relationship given by T6<T7) is established. However, there may also be the case where only one of the foregoing first point (the relationship given by T4<T5) and the second point (the relationship given by T6<T7) is established. Even when only one of the foregoing first point (the relationship given by T4<T5) and the second point (the relationship given by T6<T7) is established, the effect described above can be obtained. However, when both of the foregoing first point (the relationship given by T4<T5) and the foregoing second point (the relationship given by T6<T7) are established, the resulting effect is extremely large.

Also, as described above, it is desirable to reduce the heat resistance of the bonding material BD1. This can cause the heat generated in the semiconductor chip CP1 to be promptly transferred to the die pad DP (thinner portion DP1) and dissipate the heat to the outside of the semiconductor device PKG along the foregoing transfer path HK1. On the other hand, it is desirable to increase the heat resistance of the bonding material BD2. This can reduce the likelihood of the heat to be conducted from the die pad DP (thicker portion DP2) to the semiconductor chip CP2. Thus, it is desirable to reduce the heat resistance of the bonding material BD1 and increase the heat resistance of the bonding material BD2. The heat resistance depends on heat conductance and, as the heat conductance is higher, the heat resistance is lower.

Accordingly, in each of the semiconductor device PKG in FIGS. 1 to 10 described above, the semiconductor device PKG1 in the first modification in FIGS. 21 and 22 described above, and the semiconductor device PKG2 in the second modification in FIG. 23 described above, the heat conductance (heat conductivity) of the bonding material BD1 is preferably higher than the heat conductance (heat conductivity) of the bonding material BD2. In other words, the heat conductance (heat conductivity) of the bonding material BD2 is preferably lower than the heat conductance (heat conductivity) of the bonding material BD1. This increases the likelihood of the heat generated in the semiconductor chip CP1 to be dissipated to the outside of the semiconductor device PKG along the foregoing transfer path HK1, allows the heat transfer from the die pad DP to the semiconductor chip CP2 to be easily suppressed, and can further suppress the temperature rise of the semiconductor chip CP2.

The heat conductance and electric conductance are related to each other. The correlationship between the heat conductance and the electric conductance is such that, as the electric conductance is higher, the heat conductance is also higher and, as the electric conductance is lower, the heat conductance is also lower. Accordingly, when a conductive bonding material is used as the bonding material BD1 and an insulating bonding material is used as the bonding material BD2, the heat conductance of the bonding material BD1 is higher than the heat conductance of the bonding material BD2 and therefore the effect described above can be obtained.

On the other hand, there may also be the case where a conductive bonding material (such as, e.g., a silver paste) is used as each of the bonding materials BD1 and BD2. In the case where, e.g., the semiconductor chip CP1 does not have the back surface electrode, it is unnecessary to supply a specified voltage to the back surface electrode of the semiconductor chip CP1. Accordingly, it is possible to use a conductive bonding material as each of the bonding materials BD1 and BD2. Even in the case where the semiconductor chip CP1 has the back surface electrode, when the potential supplied to the back surface electrode is the ground potential, it is possible to use a conductive bonding material as each of the bonding materials BD1 and BD2.

However, even in the case where a conductive bonding material is used as each of the bonding materials BD1 and BD2, the heat conductance (heat conductivity) of the bonding material BD1 is preferably higher than the heat conductance (heat conductivity) of the bonding material BD2. This increases the likelihood of the heat generated in the semiconductor chip CP1 to be dissipated to the outside of the semiconductor device PKG1 along the foregoing transfer path HK1, allows the heat transfer from the die pad DP to the semiconductor chip CP2 to be easily suppressed, and can further suppress the temperature rise of the semiconductor chip CP2.

In the case of using, e.g., a silver (Ag) paste as a conductive bonding material, when the content of silver in the silver paste (silver filler content) is increased, the heat conductance of the silver paste is increased. Accordingly, in the case of using a silver paste as each of the bonding materials BD1 and BD2, the silver content in the silver paste for the bonding material BD1 is adjusted to be higher than the silver content in the silver paste for the bonding material BD2. This allows the heat conductance of the bonding material BD1 (silver paste for the bonding material BD1) to be higher than the heat conductance of the bonding material BD2 (silver paste for the bonding material BD2).

<About Mounting Structure of Semiconductor Device>

Next, a description will be given of a mounting structure of the semiconductor device PKG in the present embodiment. The following will describe the case where the semiconductor device PKG is mounted over a wiring substrate PB1. However, instead of the semiconductor device PKG, the semiconductor device PKG1 in the foregoing first modification or the semiconductor device PKG2 in the foregoing second modification can also be used.

Figure 24:
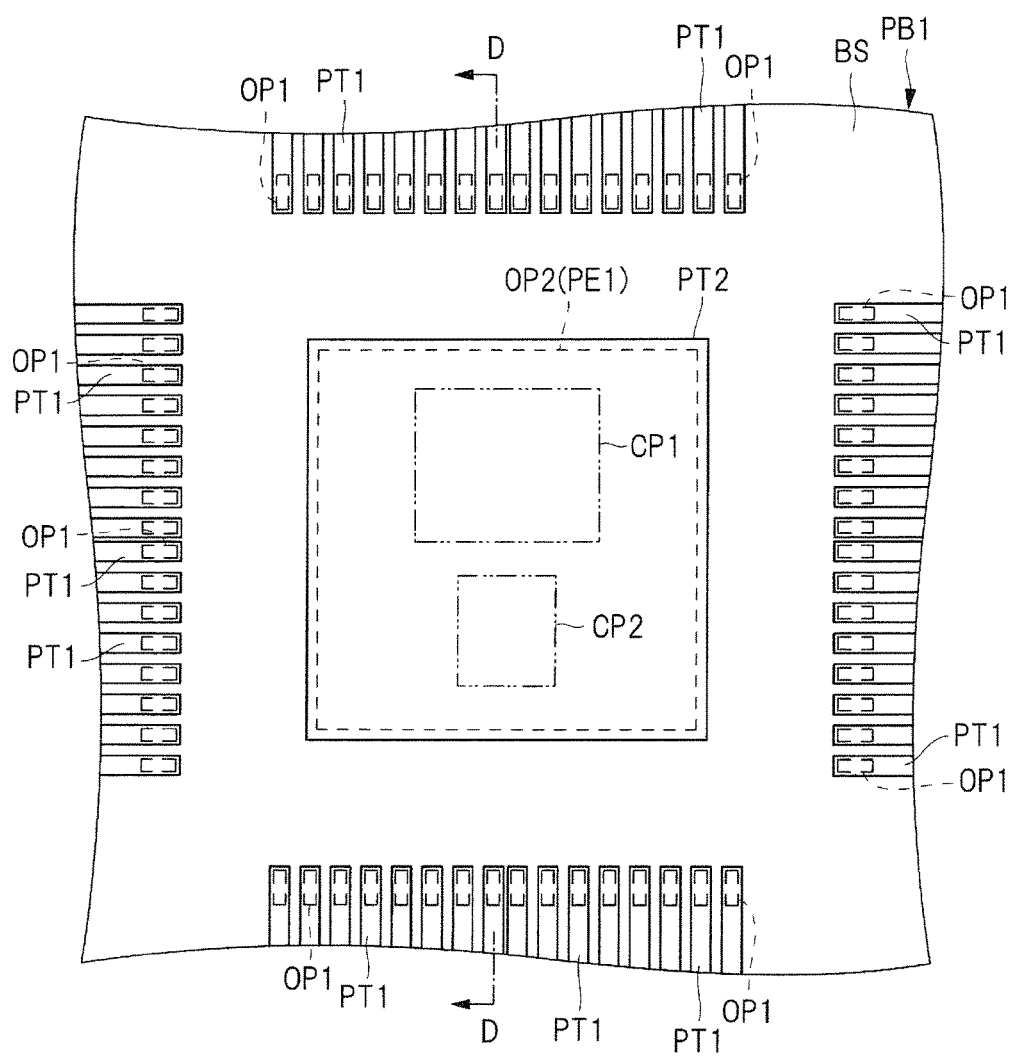
FIG. 24 is a plan view showing a wiring substrate for mounting the semiconductor device in the embodiment.

FIG. 24 is a plan view showing the wiring substrate (mounting substrate) PB1 for mounting the semiconductor device PKG in the present embodiment and shows a plan view of the upper surface of the wiring substrate PB1. FIG.

25 is a cross-sectional view of the wiring substrate PB1. The cross-sectional view at the position along the line D-D in FIG. 24 corresponds to FIG. 25. FIG. 26 is a cross-sectional view showing a structure in which the semiconductor device PKG is mounted (implemented) over the wiring substrate PB1, which shows a cross-sectional view (cross-sectional view at the position along the line D-D in FIG. 24) corresponding to FIG. 25. Note that, in FIG. 24, the wiring substrate PB1 is viewed through a resist layer RS1 over the upper surface of the wiring substrate PB1 (the resist layer RS1 is omitted) and the positions of openings OP1 and OP2 in the resist layer RS1 are shown by the broken lines. Also, in FIG. 24, the two-dimensional positions of the semiconductor chips CP1 and CP2 embedded in the semiconductor device PKG when the semiconductor device PKG is mounted over the wiring substrate PB1 are shown by the two-dot-dash lines. That is, in the state where the semiconductor device PKG is mounted over the wiring substrate PB1 (state in FIG. 26), the semiconductor chips CP1 and CP2 embedded in the semiconductor device PKG are present at the positions shown by the two-dot-dash lines in FIG. 24 in plan view.

First, a description will be given of a structure of the wiring substrate PB1 shown in each of FIGS. 24 and 25.

The wiring substrate PB1 has an insulating base layer (insulating substrate) BS, a conductor pattern formed over the upper surface of the base layer BS, a resist layer (solder resist layer) RS1 formed over the upper surface of the base layer BS so as to cover the conductor pattern, a conductor pattern formed over the lower surface of the base layer BS, and a resist layer (solder resist layer) RS2 formed over the lower surface of the base layer BS so as to cover the conductor pattern. Each of the resist layers RS1 and RS2 can also be regarded as an insulating layer.

The conductor pattern formed over the upper surface of the base layer BS, i.e., the conductor pattern over the upper surface of the wiring substrate PB1 includes a conductor pattern PT1 for coupling the leads LD of the semiconductor device PKG and a conductor pattern PT2 for bonding the die pad DP of the semiconductor device PKG. Of the conductor pattern PT1, the portions bonded to the leads LD of the semiconductor device PKG are exposed from the openings OP1 of the resist layer RS1 and the other portion is covered with the resist layer RS1. The openings OP1 are included in the conductor pattern PT1 in plan view. On the other hand, of the conductor pattern PT2, the outer peripheral portion is covered with the resist layer RS1 and the portion other than the outer peripheral portion is exposed from the opening OP2 of the resist pattern RS1. The opening OP2 is included in the conductor pattern PT2 in plan view.

Of the conductor pattern PT1, the portions exposed from the openings OP1 of the resist layer RS1 can be regarded as bonding lead portions (electrodes or terminals) for coupling the leads LD of the semiconductor device PKG. Also, of the conductor pattern PT1, the portion covered with the resist layer RS1 and extending over the upper surface of the base layer BS can be regarded as wiring and the wiring is formed integrally with the bonding lead portions.

Of the conductor pattern PT2, the portion exposed from the opening OP2 of the resist layer RS1 can be regarded as an electrode (pad electrode) for bonding the die pad DP of the semiconductor device PKG. The following will refer to the portion of the conductor pattern PT2 which is exposed from the opening OP2 of the resist layer RS1 as an electrode (pad electrode) PE1. The electrode PE1 is uncovered with the resist layer RS1 and exposed. The electrode PE1 and the opening OP2 coincide with each other in plan view.

The conductor pattern formed over the lower surface of the base layer BS, i.e., the conductor pattern over the lower surface of the wiring substrate PB1 includes a conductor pattern PT3 occupying a large area. The conductor pattern PT3 is, e.g., a power supply pattern or a ground pattern.

The conductor pattern PT2 over the upper surface of the wiring substrate PB1 is electrically coupled to the conductor pattern PT3 over the lower surface of the wiring substrate PB1 via a plurality of via portions VH. Each of the via portions VH is formed of a through hole (through bore) formed in the base layer BS and a conductive body (conductor film) embedded therein. The via portions VH couple the conductor pattern PT2 over the upper surface of the wiring substrate PB1 to the conductor pattern PT3 over the lower surface of the wiring substrate PB1 both electrically and thermally and can function as thermal vias.

Next, a description will be given of a structure in which the semiconductor device PKG is mounted (implemented) over the wiring substrate PB1. Since the wiring substrate and the semiconductor device PKG mounted over the wiring substrate may serve as the components of various electronic devices, the wiring substrate and the semiconductor device PKG mounted over the wiring substrate can be regarded as parts of the electronic devices. Accordingly, the cross-sectional view of FIG. 26 and the cross-sectional view of FIG. 29 described later can also be regarded as cross-sectional views of an electronic device having a wiring substrate and the semiconductor device PKG mounted over the wiring substrate.

When the semiconductor device PKG is mounted (implemented) over the wiring substrate PB1, as shown in FIG. 26, the lower surface of the die pad DP of the semiconductor device PKG is bonded to the electrode PE1 (the portion of the conductor pattern PT2 which is exposed from the opening OP2 of the resist layer RS) of the wiring substrate PB1 via a conductive bonding material (bonding material layer, bonding layer, or adhesion layer) BD3. Thus, the die pad DP of the semiconductor device PKG is electrically coupled to the electrode PE1 (conductive pattern PT2) of the wiring substrate PB1 via the conductive bonding material BD3. Also, the lower surfaces of the outer lead portions of the individual leads LD of the semiconductor device PKG are bonded to the bonding lead portions of the conductor pattern PT1 (the portions of the conductor pattern PT1 which are exposed from the openings OP1 of the resist layer RS1) of the wiring substrate PB1. Thus, the individual leads LD of the semiconductor device PKG are electrically coupled to the bonding lead portions of the conductor pattern PT1 of the wiring substrate PB1 via a conductive bonding material BD4. Preferably, each of the bonding materials BD3 and BD4 is a solder.

Thus, the semiconductor device PKG is mounted over the wiring substrate PB1 and fixed thereto.

The heat generated in the semiconductor chip CP1 of the semiconductor substrate PKG is transferred to the die pad DP via the foregoing bonding material BD1 and transferred to the conductor pattern PT2 over the upper surface of the wiring substrate PB1 via the bonding material BD3. That is, the heat generated in the semiconductor chip CP1 of the semiconductor device PKG is transferred to the conductor pattern PT2 over the upper surface of the wiring substrate PB1 along the foregoing transfer path HK1. The heat transferred from the die pad DP to the conductor pattern PT2 over the upper surface of the wiring substrate PB1 can further be transferred to the conductor pattern PT3 over the lower surface of the wiring substrate PB1 via the plurality of via portions VH.

<About Improvement in Mounting Structure of Semiconductor Device>

Figure 25:
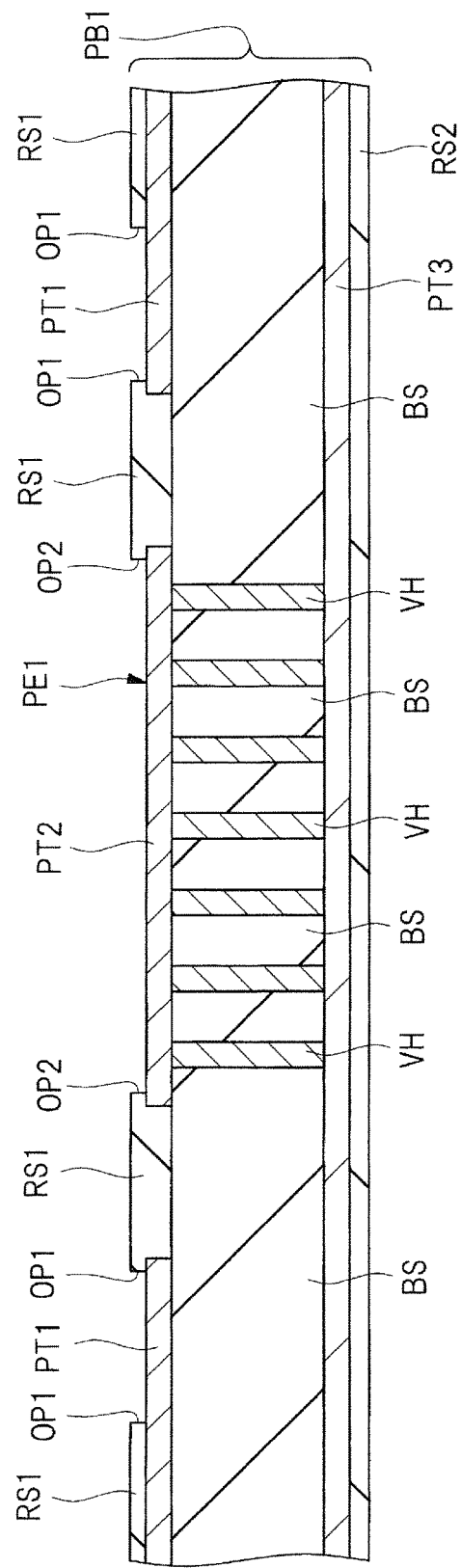
FIG. 25 is a cross-sectional view of the wiring substrate in FIG. 24.
Figure 26:
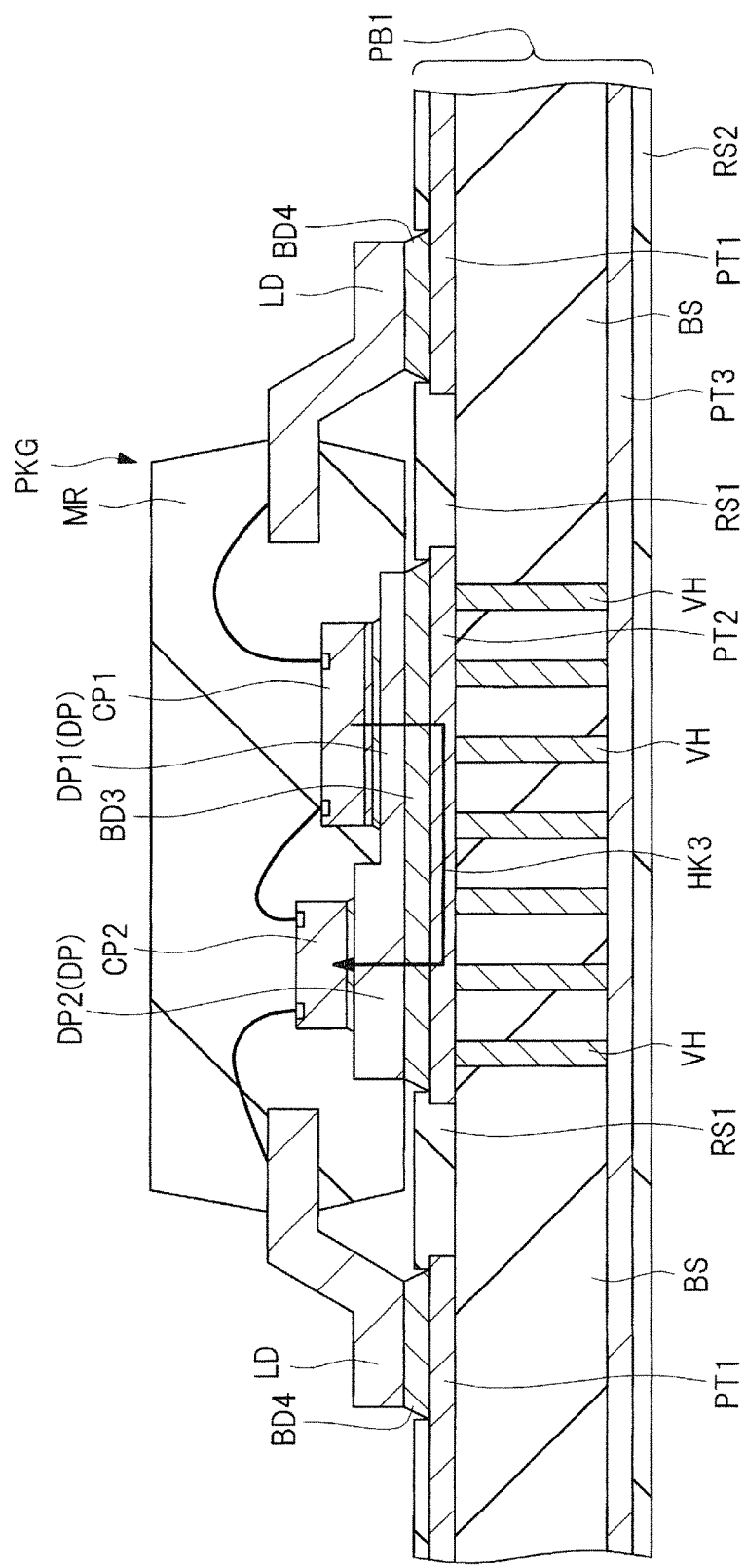
FIG. 26 is a cross-sectional view showing a structure in which the semiconductor device is mounted over the wiring substrate in FIG. 25.

As a result of conducting study, the present inventors have found that, when the wiring substrate PB1 shown in FIGS. 24 to 26 described above is used, the following phenomenon occurs.

That is, the heat generated in the semiconductor chip CP1 is conducted to the semiconductor chip CP2 along the transfer path HK3 shown by the arrow in FIG. 26 and may contribute to the temperature rise of the semiconductor chip CP2. Specifically, the heat generated in the semiconductor chip CP1 embedded in the semiconductor device PKG is transferred from the die pad DP of the semiconductor device PKG to the bonding material BD3 and to the conductor pattern PT2 over the upper surface of the wiring substrate PB1 along the foregoing transfer path HK1. At this time, the heat transferred from the die pad DP of the semiconductor device PKG to the bonding material BD3 and to the conductor pattern PT2 along the foregoing transfer path HK1 is laterally transferred in the bonding material BD3 and the conductor pattern PT2 to reach the portions of the bonding material BD3 and the conductor pattern PT2 which are located immediately under the semiconductor chip CP2. Then, from the portions of the bonding material BD3 and the conductor pattern PT2 which are located immediately under the semiconductor chip CP2, the heat is conducted to the die pad DP and conducted to the semiconductor chip CP2 via the foregoing bonding material BD2, resulting in the temperature rise of the semiconductor chip CP2. That is, the conductor pattern PT2 and the bonding material BD3 serve as a heat transfer path along which the heat generated in the semiconductor chip CP1 is transferred to the semiconductor chip CP2.

To maximally suppress the temperature rise of the semiconductor chip CP2 resulting from the heat generated in the semiconductor chip CP1, it is effective to improve the structure of the wiring substrate (mounting substrate) mounting the semiconductor device PKG. By using a wiring substrate (mounting substrate) PB2 described below as the wiring substrate mounting the semiconductor device PKG, the temperature rise of the semiconductor chip CP2 resulting from the heat generated in the semiconductor chip CP1 can further be suppressed. The following is a specific description thereof.

Figure 27:
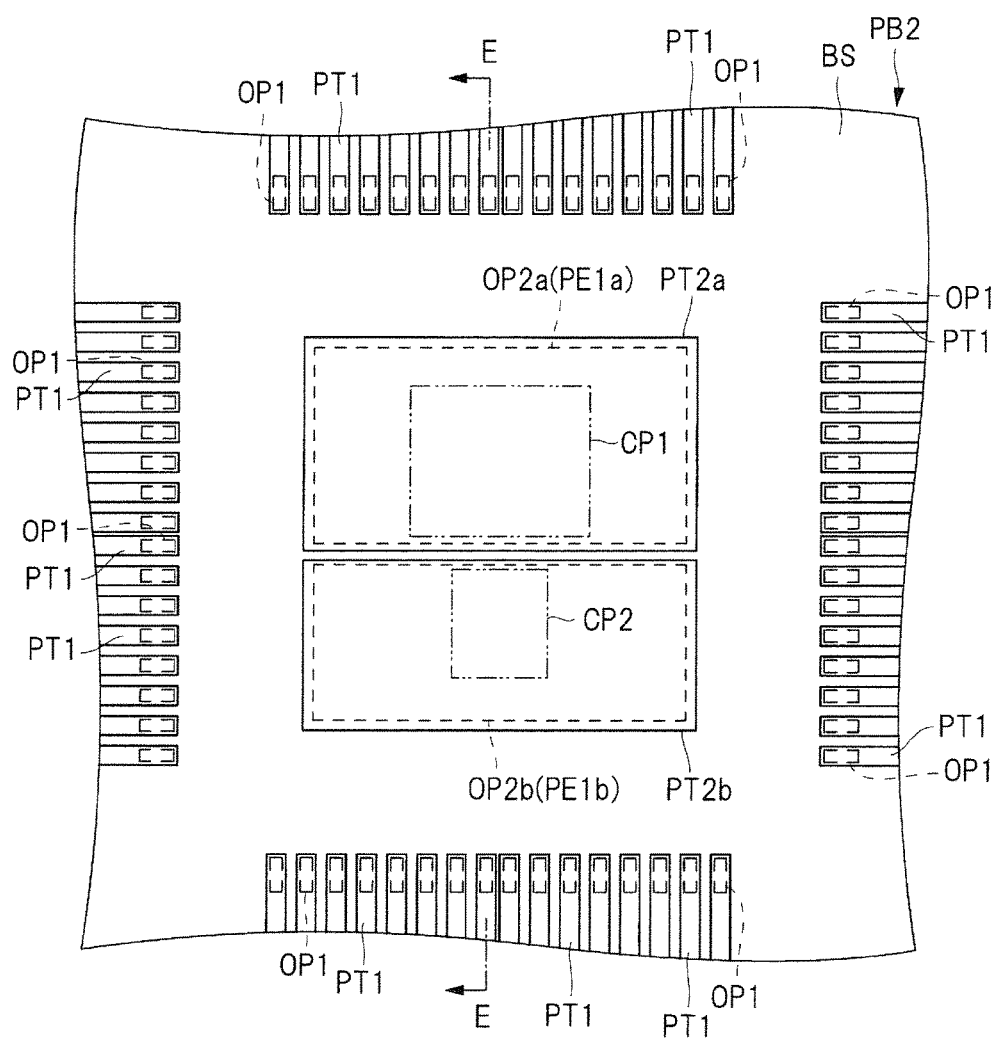
FIG. 27 is a plan view showing the wiring substrate for mounting the semiconductor device in the embodiment.
Figure 28:
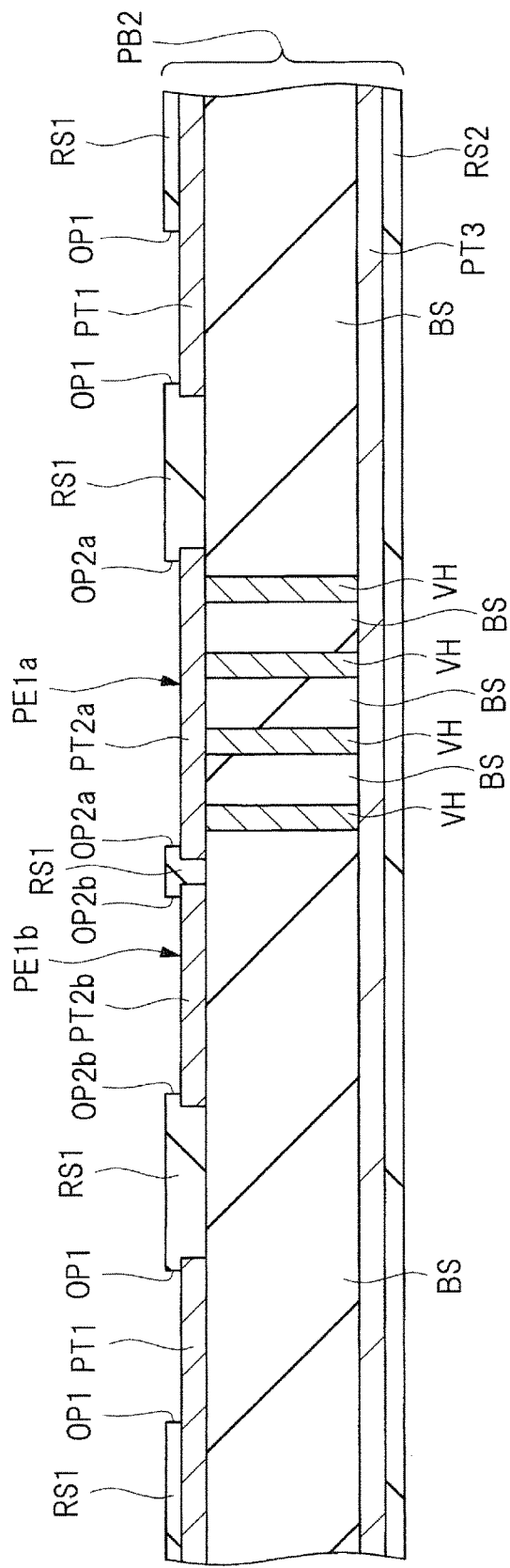
FIG. 28 is a cross-sectional view of the wiring substrate in FIG. 27.
Figure 29:
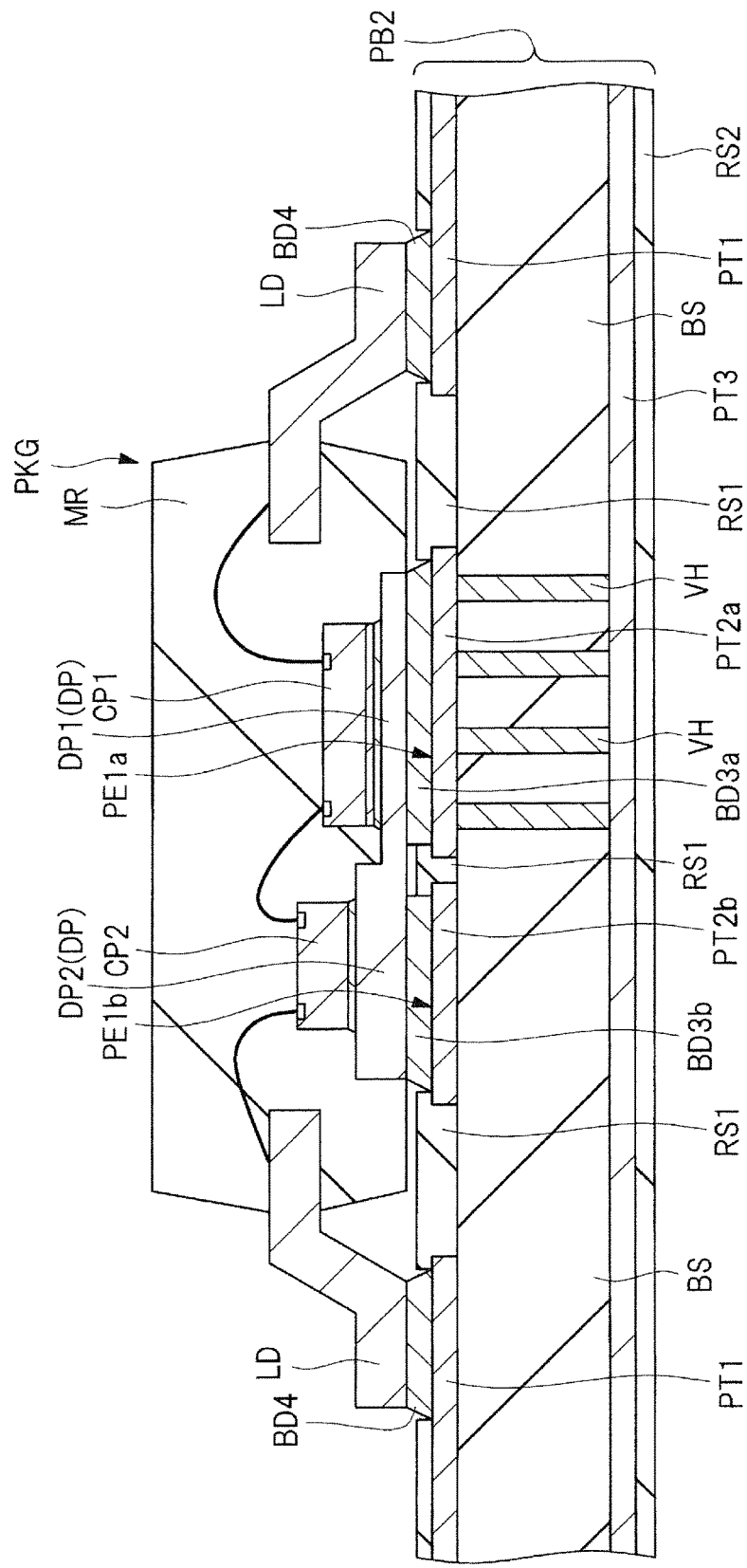
FIG. 29 is a cross-sectional view showing a structure in which the semiconductor device is mounted over the wiring substrate in FIG. 28.
Figure 30:
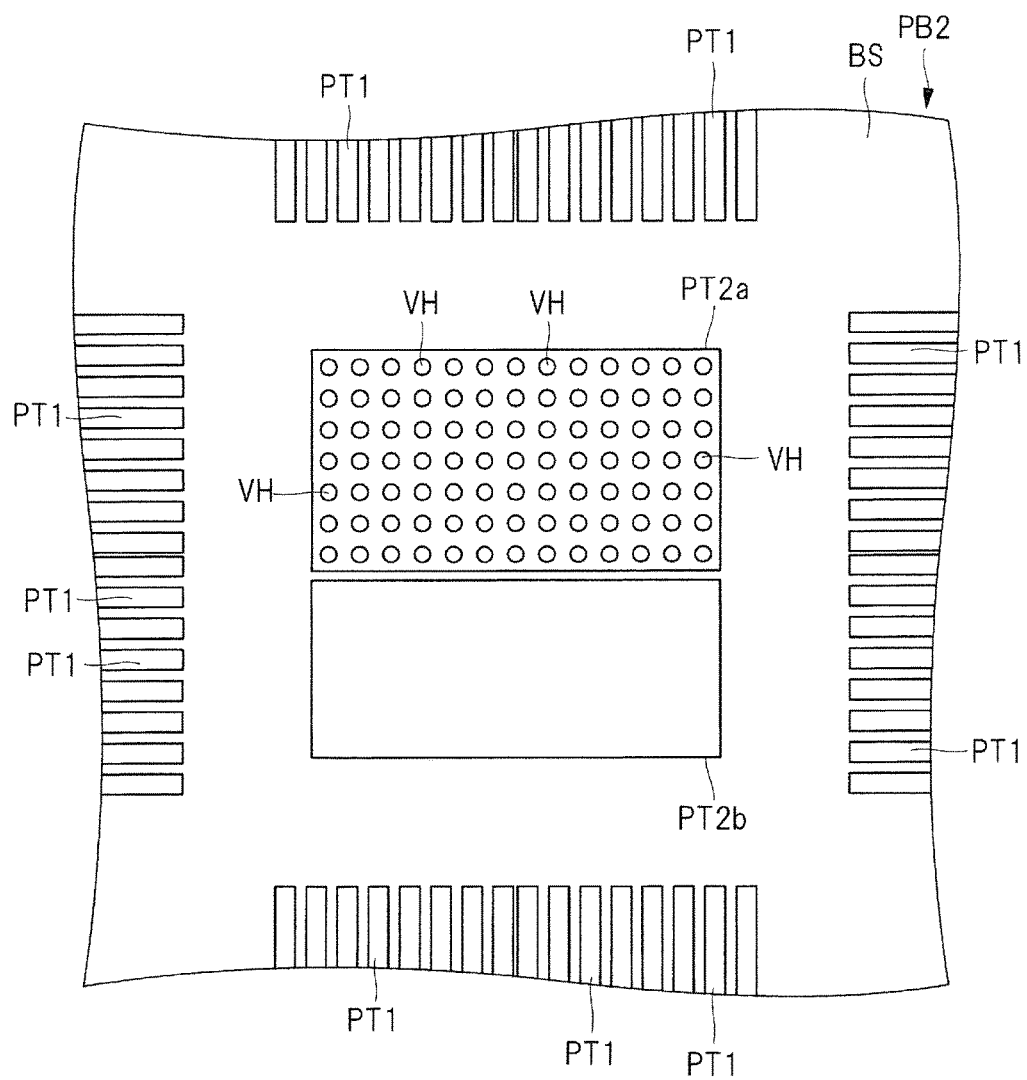
FIG. 30 is a plan view of the upper surface of the wiring substrate, which is for showing the positions where via portions are formed.

FIG. 27 is a plan view showing the wiring substrate (mounting substrate) PB2 for mounting the semiconductor device PKG in the present embodiment, which shows a plan view of the upper surface of the wiring substrate PB2. FIG. 28 is a cross-sectional view of the wiring substrate PB2. A cross-sectional view at the position along the line E-E in FIG. 27 corresponds to FIG. 28. FIG. 29 is a cross-sectional view showing a structure in which the semiconductor device PKG is mounted (implemented) over the wiring substrate PB2, which shows a cross section (cross-sectional view at the position along the line E-E in FIG. 27) corresponding to FIG. 28. FIGS. 27 to 29 correspond to FIGS. 24 to 26 described above. Note that, in FIG. 27, the wiring substrate PB2 is viewed through the resist layer RS1 over the upper surface of the wiring substrate PB2 (the resist layer RS1 is omitted) and the positions of the opening OP1 and openings OP2a and OP2b in the resist layer RS1 are shown by the broken lines. Also, in FIG. 27, the two-dimensional positions of the semiconductor chips CP1 and CP2 embedded in the semiconductor device PKG are shown by the two-dot-dash lines. That is, in the state (state in FIG. 29) where the semiconductor device PKG is mounted over the wiring substrate PB2, the semiconductor chips CP1 and CP2 embedded in the semiconductor device PKG are present at the positions shown by the two-dot-dash lines in FIG. 27 in plan view. FIG. 30 is a plan view of the upper surface of the wiring substrate PB2, which is for showing the positions where the via portions VH are formed. FIG. 30 shows the conductor pattern PT1 and conductor patterns PT2a and PT2b viewed through the resist layer RS1 (by omitting the resist layer RS1) and also shows the positions where the via portions VH are formed.

First, a description will be given of a structure of the wiring substrate PB2 shown in FIGS. 27 and 28.

The wiring substrate PB2 is mainly different from the foregoing wiring substrate PB1 in that the conductor pattern PT2 over the upper surface of the foregoing wiring substrate PB1 is divided into the conductor patterns PT2a and PT2b over the wiring substrate PB2.

The wiring substrate PB2 has the insulating base layer (insulating substrate) BS, a conductor pattern formed over the upper surface of the base layer BS, the resist layer (solder resist layer) RS1 formed over the upper surface of the base layer BS so as to cover the conductor pattern, a conductor pattern formed over the lower surface of the base layer BS, and the resist layer (solder resist layer) RS2 formed over the lower surface of the base layer BS so as to cover the conductor pattern. Each of the resist layers RS1 and RS2 can be regarded as an insulating layer.

The conductor pattern formed over the upper surface of the base layer BS, i.e., the conductor pattern over the upper surface of the wiring substrate PB2 includes the conductor pattern PT1 for coupling the leads LD of the semiconductor device PKG and the conductor patterns PT2a and PT2b for bonding the die pad DP of the semiconductor device PKG. Of the conductor pattern PT1, the portions bonded to the leads LD of the semiconductor device PKG are exposed from the openings OP1 of the resist layer RS1 and the other portion is covered with the resist layer RS1. With regard to the conductor pattern PT1 and the openings OP1, the wiring substrate PB2 is also the same as the foregoing wiring substrate PB1 so that a repeated description thereof is omitted.

The conductor patterns PT2a and PT2b are not connected but are isolated from each other. That is, the conductor patterns PT2a and PT2b are separate and independent conductor patterns. Of the conductor pattern PT2a, the outer peripheral portion is covered with the resist layer RS1 and the portion other than the outer peripheral portion is exposed from the opening OP2a of the resist layer RS1. On the other hand, of the conductor pattern PT2b, the outer peripheral portion is covered with the resist layer RS1 and the portion other than the outer peripheral portion is exposed from the opening OP2b of the resist layer RS1. The opening OP2a is included in the conductor pattern PT2a in plan view. The opening OP2b is included in the conductor pattern PT2b in plan view. The openings OP2a and OP2b are not connected.

The portion of the conductor pattern PT2a which is exposed from the opening OP2a of the resist layer RS1 can be regarded as an electrode (pad electrode) for bonding the die pad DP of the semiconductor device PKG. Also, the portion of the conductor pattern PT2b which is exposed from the opening OP2b of the resist layer RS1 can be regarded as an electrode (pad electrode) for bonding the die pad DP of the semiconductor device PKG. The following will refer to the portion of the conductor pattern PT2a which is exposed from the opening OP2a of the resist layer RS1 as an electrode (pad electrode) PE1a. The following will also refer to the portion of the conductor pattern PT2b which is exposed from the opening OP2b of the resist layer RS1 as an electrode (pad electrode) PE1b. The electrode PE1a is uncovered with the resist layer RS1 and exposed. The electrode PE1a and the opening OP2a coincide with each other in plan view. The electrode PE1b is uncovered with the resist layer RS1 and exposed. The electrode PE1b and the opening OP2b coincide with each other in plan view.

The conductor pattern formed over the lower surface of the base layer BS, i.e., the conductor pattern over the lower surface of the wiring substrate PB2 includes the conductor pattern PT3 occupying a large area. The conductor pattern PT3 includes the conductor pattern PT2 in plan view. The conductor pattern PT3 is, e.g., a power supply pattern to which a power supply potential is supplied or a ground pattern to which a ground potential is supplied. When the potential supplied to the back surface electrode BE of the semiconductor chip CP2 is the power supply potential, the conductor pattern PT3 is the power supply pattern. When the potential supplied to the back surface electrode BE of the semiconductor chip CP2 is the ground potential, the conductor pattern PT3 is the ground pattern. The conductor pattern PT3 can also be formed over substantially the entire lower surface of the base layer BS.

The conductor pattern PT2a over the upper surface of the wiring substrate PB2 is electrically coupled to the conductor pattern PT3 over the lower surface of the wiring substrate PB2 via the plurality of via portions VH. Each of the via portions VH is formed of a through hole (through bore) formed in the base layer BS and the conductor body (conductor film) embedded therein. The plurality of via portions VH which couple the conductor pattern PT2 over the upper surface of the wiring substrate PB2 to the conductor pattern PT3 over the lower surface of the wiring substrate PB2 are provided in the regions where the conductor patterns PT2a and PT3 overlap each other in plan view. The via portions VH couple the conductor pattern PT2a over the upper surface of the wiring substrate PB2 to the conductor pattern PT3 over the lower surface of the wiring substrate PB2 both electrically and thermally and can function as thermal vias.

Next, a description will be given of a structure in which the semiconductor device PKG is mounted (implemented) over the wiring substrate PB2.

When the semiconductor device PKG is mounted (implemented) over the wiring substrate PB2, as shown in FIG. 29, the lower surfaces of the outer lead portions of the individual leads LD of the semiconductor device PKG are bonded to the bonding lead portions of the conductor pattern PT1 (the portions of the conductor pattern PT1 which are exposed from the openings OP1 of the resist layer RS1) of the wiring substrate PB1 via the conductive bonding material (bonding material layer, bonding layer, or adhesion layer) BD4. Thus, the individual leads LD of the semiconductor device PKG are electrically coupled to the bonding lead portions of the conductor pattern PT1 of the wiring substrate PB1 via the conductive bonding material BD4. In this point, the case where the wiring substrate PB2 (case in FIG. 29) is used is the same as the case where the foregoing wiring substrate PB1 is used (case in FIG. 26).

However, with regard to the bonding of the die pad DP to the conductor pattern of the wiring substrate, the case where the wiring substrate PB2 is used (case in FIG. 29) is different from the case where the foregoing wiring substrate PB1 is used (case in FIG. 26).

That is, in the case of mounting (implementing) the semiconductor device PKG over the wiring substrate PB2, as shown in FIG. 29, a part of the lower surface of the die pad DP of the semiconductor device PKG is bonded to the electrode PE1a (the portion of the conductor pattern PT2a which is exposed from the opening OP2a of the resist layer RS1) of the wiring substrate PB2 via a conductive bonding material (bonding material layer, bonding layer, or adhesion layer) BD3a. Also, another part of the lower surface of the die pad DP of the semiconductor device PKG is bonded to the electrode PE1b (the portion of the conductor pattern PT2b which is exposed from the opening OP2b of the resist layer RS1) of the wiring substrate PB2 via a conductive bonding material (bonding material layer, bonding layer, or adhesion layer) BD3b. Thus, the die pad DP of the semiconductor device PKG is electrically coupled to the electrode PE1a (conductor pattern PT2a) of the wiring substrate PB2 via the conductive bonding material BD3a and also electrically coupled to the electrode PE1b (conductor pattern PT2b) of the wiring substrate PB2 via the conductive bonding material BD3b. The electrode PE1a (conductor pattern PT2a) and the electrode PE1b (conductor pattern PT2b) are not connected but are isolated from each other. Consequently, the bonding material BD3a bonding the electrode PE1a to the die pad DP and the bonding material BD3b bonding the electrode PE1b to the die pad DP are not connected but are isolated from each other. In the case in FIG. 29, the thinner portion DP1 of the die pad DP is bonded to the electrode PE1a via the bonding material BD3a and the thicker portion DP2 of the die pad DP is bonded to the electrode PE1b via the bonding material BD3b. Preferably, each of the bonding materials BD3a, BD3b, and BD4 is a solder.

Thus, the semiconductor device PKG is mounted over the wiring substrate PB2 and fixed thereto.

For example, the step of mounting the semiconductor device PKG over the wiring substrate PB2 can be performed as follows. That is, first, the semiconductor device PKG and the wiring substrate PB2 are provided. Then, to the upper surfaces of the electrodes PE1a and PE1b of the wiring substrate PB2 and to the upper surfaces of the bonding lead portions of the conductor pattern PT1, a solder paste or the like is supplied as a conductive bonding material. Subsequently, over the wiring substrate PB2, the semiconductor device PKG is placed (mounted) and then a solder reflow process is performed. As a result, the solder paste is melted and solidified to serve as the foregoing bonding materials BD3a, BD3b, and BD4 and fix the semiconductor device PKG to the wiring substrate PB2.

Next, a description will be given of the main characteristic features and effects of a structure in which the semiconductor device PKG is mounted over the wiring substrate PB2.

The wiring substrate PB2 has the electrode PE1a (first electrode) and the electrode PE1b (second electrode) which are formed over the upper surface thereof and isolated from each other. The semiconductor chip CP1 (first semiconductor chip) is mounted over the portion (first portion) of the chip mounting portion which is bonded to the electrode PE1a via the bonding material BD3a (first conductive bonding layer). On the other hand, the semiconductor chip CP2 (second semiconductor chip) is mounted over the portion (second portion) of the chip mounting portion which is bonded to the electrode PE1 via the bonding material BD3b (second conductive bonding layer). That is, the first portion of the die pad DP1 is bonded to the electrode PE1a via the bonding material BD3a and, over the first portion of the die pad DP, the semiconductor chip CP1 is mounted. On the other hand, the second portion of the die pad DP is bonded to the electrode PE1b via the bonding material BD3b and, over the second portion of the die pad DP, the semiconductor chip CP2 is mounted.

As a result, the heat generated in the semiconductor chip CP1 in the semiconductor device PKG is transferred to the die pad DP (thinner portion DP1) via the foregoing bonding material BD1 and transferred from the die pad DP (thinner portion DP1) to the electrode PE1a (conductor pattern PT2a) over the upper surface of the wiring substrate PB2 via the bonding material BD3a. That is, the heat generated in the semiconductor chip CP1 of the semiconductor device PKG is transferred to the conductor pattern PT2a over the upper surface of the wiring substrate PB2 along the foregoing transfer path HK1 and dissipated. The electrode PE1a (conductor pattern PT2a) is not connected to the electrode PE1b (conductor pattern PT2b) and is isolated therefrom. Accordingly, the bonding materials BD3a and BD3 are also not connected but are isolated from each other. Consequently, the heat transferred from the die pad DP to the bonding material BD3a and the electrode PE1a (conductor pattern PT2a) is not transferred to the bonding material BD3b or to the electrode PE1b (conductor pattern PT2b). Therefore, it is possible to prevent the heat generated in the semiconductor chip CP1 from being conducted to the semiconductor chip CP2 along the foregoing transfer path HK3.

That is, when the foregoing wiring substrate PB1 is used, the conductor pattern PT2 and the bonding material BD3 undesirably serve as a heat transfer path along which the heat generated in the semiconductor chip CP1 is transferred to the semiconductor chip CP2. By contrast, when the wiring substrate PB2 is used, the electrode PE1a (conductor pattern PT2a) and the electrode PE1b (conductor pattern PT2b) are isolated from each other. Accordingly, the electrode PE1a (conductor pattern PT2a), the electrode PE1b (conductor pattern PT2b), and the bonding materials BD3a and BD3b do not serve as a heat transfer path along which the heat generated in the semiconductor chip CP1 is transferred to the semiconductor chip CP2. This can reduce the amount of heat generated in the semiconductor chip CP1 and conducted to the die pad DP (thicker portion DP2) immediately under the semiconductor chip CP2 and thus reduce the amount of heat conducted from the semiconductor chip CP1 to the semiconductor chip CP2. Accordingly, it is possible to further suppress the temperature rise of the semiconductor chip CP2 resulting from the heat generated in the semiconductor chip CP1. Thus, it is possible to improve the reliability and performance of the electronic device including the wiring substrate and the semiconductor device mounted over the wiring substrate.

In a structure in which the semiconductor device PKG is mounted over the wiring substrate PB2, the two-dimensional positional relationships between the semiconductor chips CP1 and CP2 and the electrodes PE1a and PE1b are preferably as follows.

That is, in plan view, the semiconductor chip CP1 preferably has at least a part thereof overlapping the electrode PE1a and does not overlap the electrode PE1b. On the other hand, in plan view, the semiconductor chip CP2 preferably has at least a part thereof overlapping the electrode PE1b and does not overlap the electrode PE1a. More preferably, the semiconductor chip CP1 is included in the electrode PE1 in plan view and the semiconductor chip CP2 is included in the electrode PE1b in plan view.

This can cause the heat generated in the semiconductor chip CP1 to be reliably transferred to the electrode PE1a (conductor pattern PT2a) of the wiring substrate PB2 through the die pad DP immediately under the semiconductor chip CP1 and also reduce the likelihood of the heat generated in the semiconductor chip CP1 to be transferred to the electrode PE1b (conductor pattern PT2b). This can also reduce the likelihood of the heat transferred to the electrode PE1a (conductor pattern PT2a) of the wiring substrate PB2 to be transferred to the semiconductor chip CP2. Therefore, it is possible to more reliably suppress the temperature rise of the semiconductor chip CP2 resulting from the heat generated in the semiconductor chip CP1.

Preferably, the two-dimensional size (area) of the electrode PE1a (conductor pattern PT2a) is larger than the two-dimensional size (area) of the electrode PE1b (conductor pattern PT2b). This increases the likelihood of the heat generated in the semiconductor chip CP1 to be transferred to the electrode PE1b (conductor pattern PT2b) of the wiring substrate PB2 along the foregoing transfer path HK1.

It is also preferable to provide the plurality of via portions VH under the electrode PE1a (conductor pattern PT2a) and electrically couple the electrode PE1a (conductor pattern PT2a) to the conductor pattern PT3 in the layer located below that of the electrode PE1a (conductor pattern PT2a). This allows the plurality of via portions VH under the electrode PE1a (conductor pattern PT2a) to function as thermal vias and thus allows the heat transferred from the die pad DP to the electrode PE1a (conductor pattern PT2a) over the upper surface of the wiring substrate PB2 to be transferred to the conductor pattern PT3 in the layer located below that of the electrode PE1a (conductor pattern PT2a) via the plurality of via portions VH. Thus, it is possible to transfer the heat transferred from the semiconductor chip CP1 to the electrode PE1a (conductor pattern PT2a) of the wiring substrate PB2 along the foregoing transfer path HK1 to the lower side of the wiring substrate PB2 and thereby accelerate the heat transfer along the foregoing transfer path HK1. As a result, the heat transfer along the foregoing transfer path HK2 is more easily suppressed and accordingly the temperature rise of the semiconductor chip CP2 resulting from the heat generation in the semiconductor chip CP1 can further be suppressed. In the case where the semiconductor chip CP1 has the back surface electrode BE, an intended potential (e.g., the power supply potential or the ground potential) can be supplied from the conductor pattern PT3 to the back surface electrode BE of the semiconductor chip CP1 via the plurality of via portions VH, the electrode PE1a (conductor pattern PT2a), the bonding material BD3a, the die pad DP, and the foregoing bonding material BD1.

Also, as shown in FIG. 30, it is preferable to provide a large number of (plurality of) the via portions VH under the conductor pattern PT2a. The large number of (plurality of) via portions VH can be arranged in an array over substantially the entire conductor pattern PT2a in plan view. As can be seen with reference to FIGS. 27 and 30, it is preferable to provide the plurality of via portions VH at positions overlapping the semiconductor chip CP1 in plan view. This increases the likelihood of the heat transferred from the semiconductor chip CP1 to the electrode PE1a (conductor pattern PT2a) of the wiring substrate PB2 along the foregoing transfer path HK1 to be transferred to the lower side of the wiring substrate PB2 through the via portions VH.

The amount of heat generated in the semiconductor chip CP2 is smaller than the amount of heat generated in the semiconductor chip CP1. Accordingly, under the electrode PE1b (conductor pattern PT2b) in the wiring substrate PB2, the via portions (VH) electrically coupling the electrode PE1b (conductor pattern PT2b) to the conductor pattern PT3 need not be formed. FIGS. 27 to 30 show the case where the via portions (VH) are not provided under the electrode PE1b (conductor pattern PT2b). In this case, the number of the via portions (VH) provided in the wiring substrate PB2 can be reduced to facilitate the production of the wiring substrate PB2.

However, in terms of maximally suppressing the temperature rise of the semiconductor chip CP2, it is also possible to provide the plurality of via portions VH under the electrode PE1*b* (conductor pattern PT2*b*) and electrically couple the electrode PE1*b* (conductor pattern PT2*b*) to the conductor pattern PT3 in the layer located below that of the electrode PE1*b* (conductor pattern PT2*b*) via the plurality of via portions VH. This allows the plurality of via portions VH under the electrode PE1*b* (conductor pattern PT2*b*) to function as thermal vias. Therefore, the heat transferred from the die pad DP to the electrode PE1*b* (conductor pattern PT2*b*) over the upper surface of the wiring substrate PB2 via the bonding material BD3*b* can further be transferred to the lower-layer conductor pattern PT3 via the plurality of via portions VH.

Figure 31:
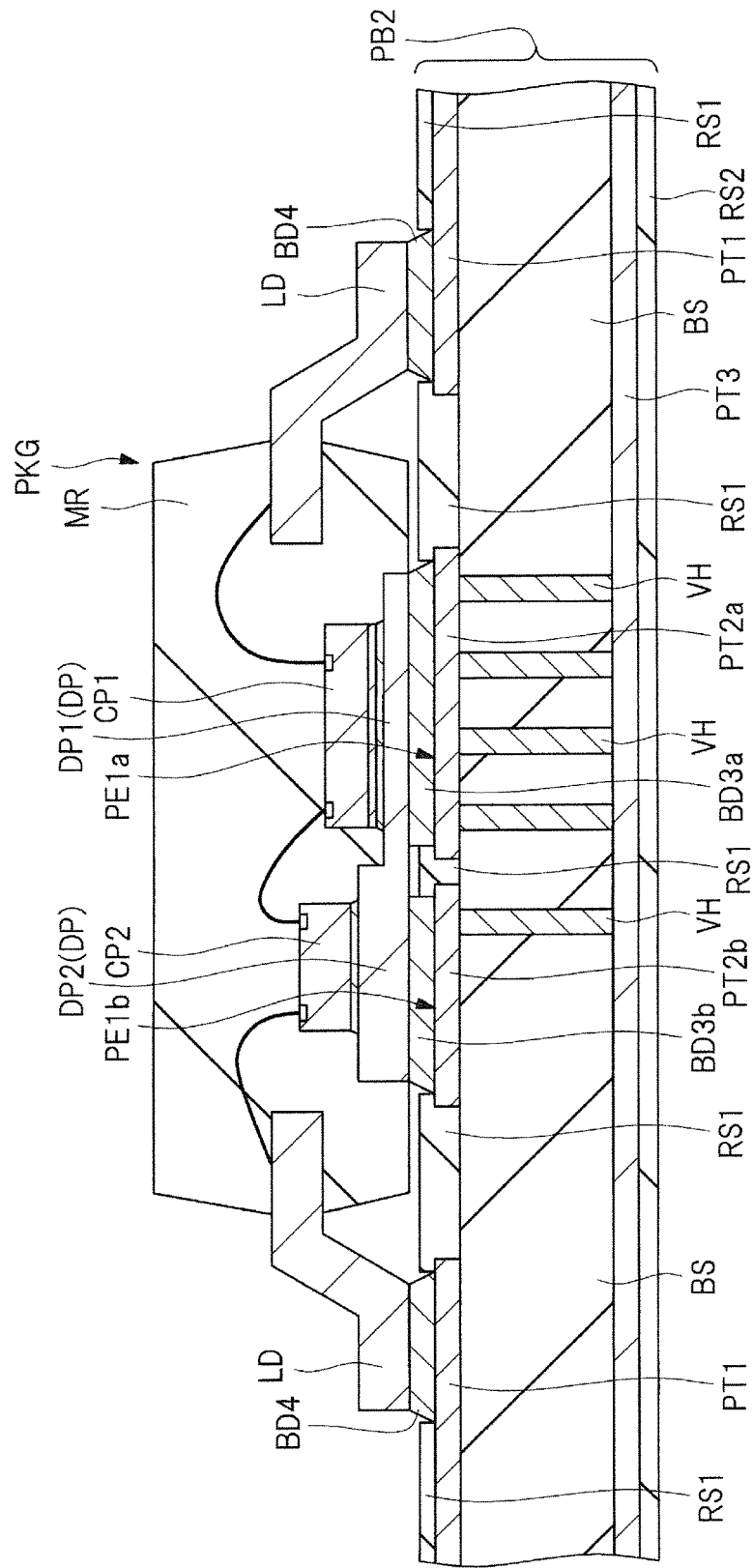
FIG. 31 is a cross-sectional view showing a structure in which the semiconductor device is mounted over the wiring substrate.
Figure 32:
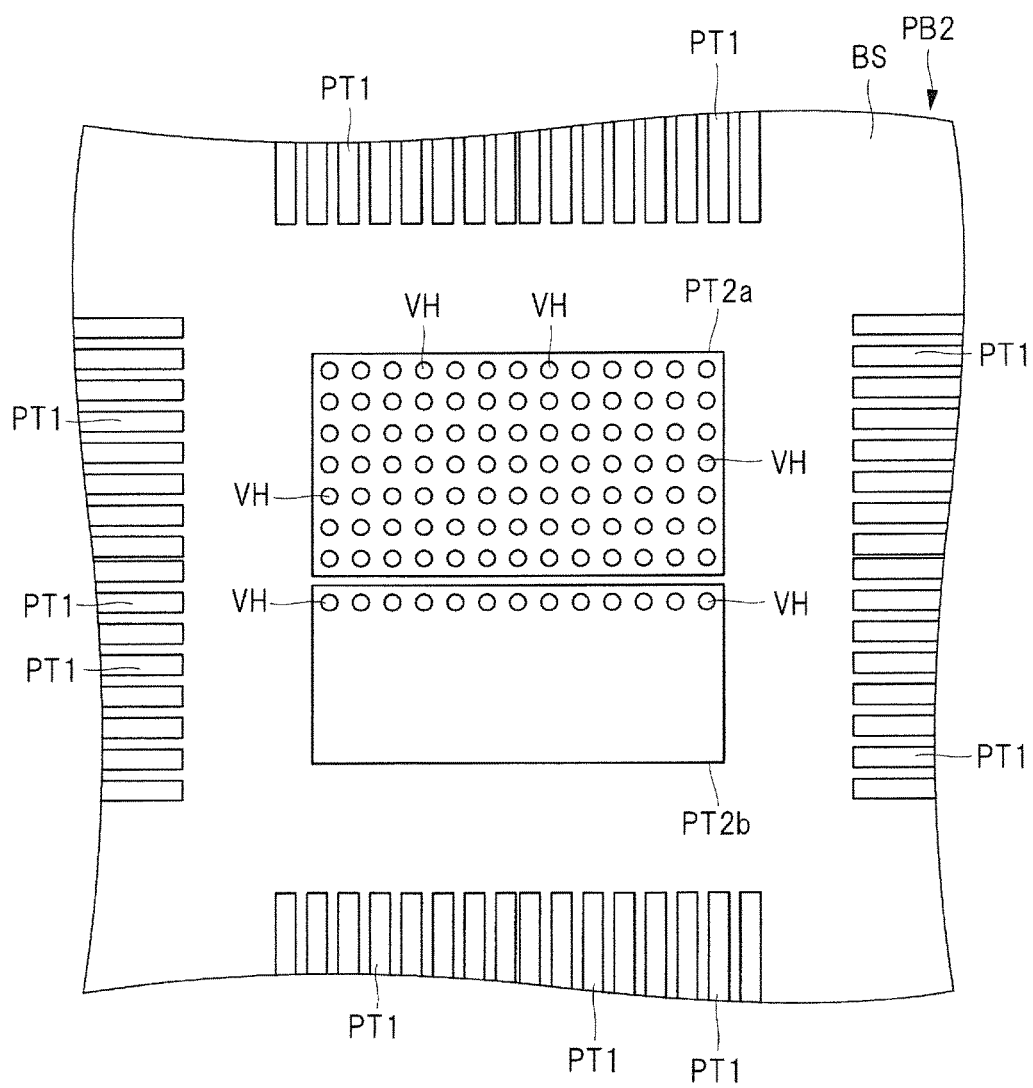
FIG. 32 is a plan view of the upper surface of the wiring substrate, which is for showing the positions where the via portions are formed.

FIGS. 31 and 32 show the case where the plurality of via portions VH are provided under the electrode PE1*b* (conductor pattern PT2*b*). FIG. 31 is a cross-sectional view showing a structure in which the semiconductor device PKG is mounted (implemented) over the wiring substrate PB2, which corresponds to FIG. 29 described above. FIG. 32 is a plan view of the upper surface of the wiring substrate PB2 for showing the positions where the via portions VH are formed, which corresponds to FIG. 30 described above. FIG. 32 shows the conductor patterns PT1, PT2*a*, and PT2*b* viewed through the resist layer RS1 (by omitting the resist layer RS1) and also shows the positions where the via portions VH are formed.

In plan view, the plurality of via portions VH provided under the conductor pattern PT2*b* can be arranged in an array substantially throughout the entire conductor pattern PT2*b*. However, as shown in FIG. 32, the plurality of via portions VH provided under the conductor pattern PT2*b* can also be arranged in only one row. Since the amount of heat generated in the semiconductor chip CP2 is smaller than the amount of heat generated in the semiconductor chip CP1, the number of the via portions VH provided under the conductor pattern PT2*b* may appropriately be smaller than the number of the via portions VH provided under the conductor pattern PT2*a*.

Note that, in the case of FIG. 32, in plan view, the via portions VH (via portions VH provided under the conductor pattern PT2*b*) are arranged in such a manner as to be aligned along the side of the conductor pattern PT2*b* which faces the conductor pattern PT2*a* in plan view. This is because, by doing so, even when the number of the via portions VH is reduced, the heat transferred along the foregoing transfer path HK2 is more likely to be transferred to the lower-layer conductor pattern PT3 via the bonding material BD3*b*, the conductor pattern PT2*b*, and the via portions VH disposed thereunder.

Also, in the case of FIGS. 27 to 30 described above, the conductor pattern PT2*a* over the upper surface of the wiring substrate PB2 is electrically and thermally coupled to the conductor pattern PT3 over the lower surface of the wiring substrate PB2 via the via portions VH. In another form, the conductor pattern PT2*a* over the upper surface of the wiring substrate PB2 can also be electrically and thermally coupled to a conductor pattern in the inner layer of the wiring substrate PB2 via the via portions VH. Such a case will be described with reference to FIGS. 33 and 34.

Figure 33:
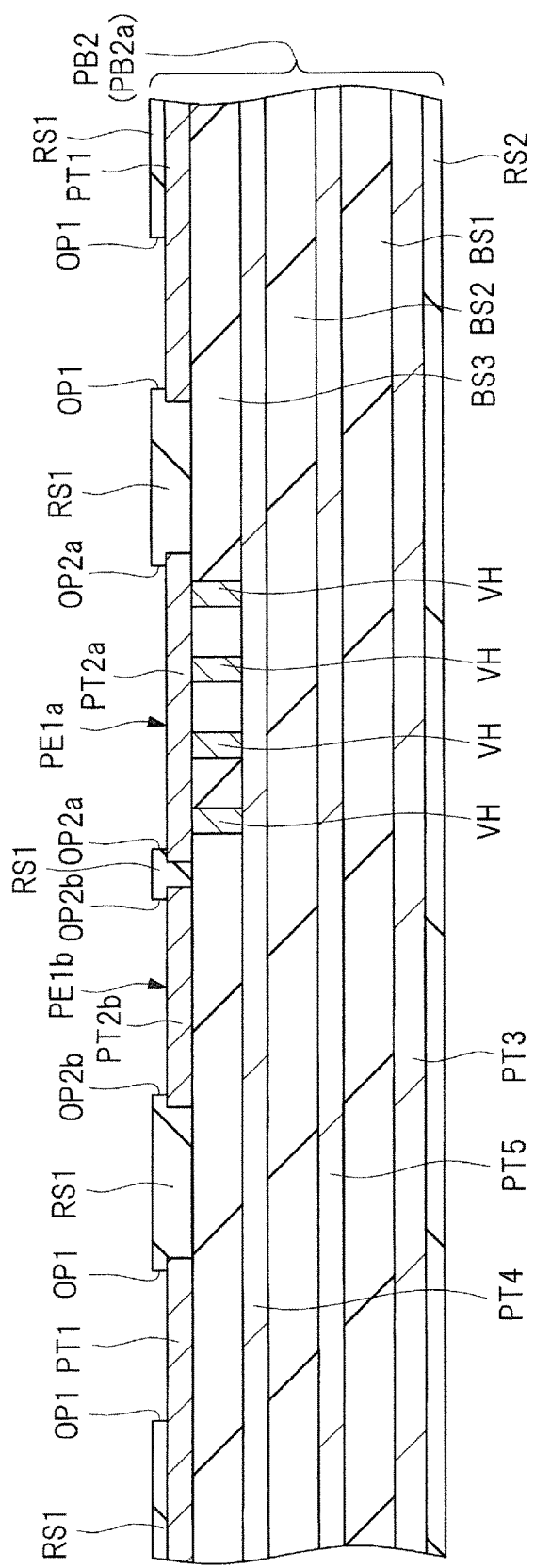
FIG. 33 is a cross-sectional view showing a modification of the wiring substrate.
Figure 34:
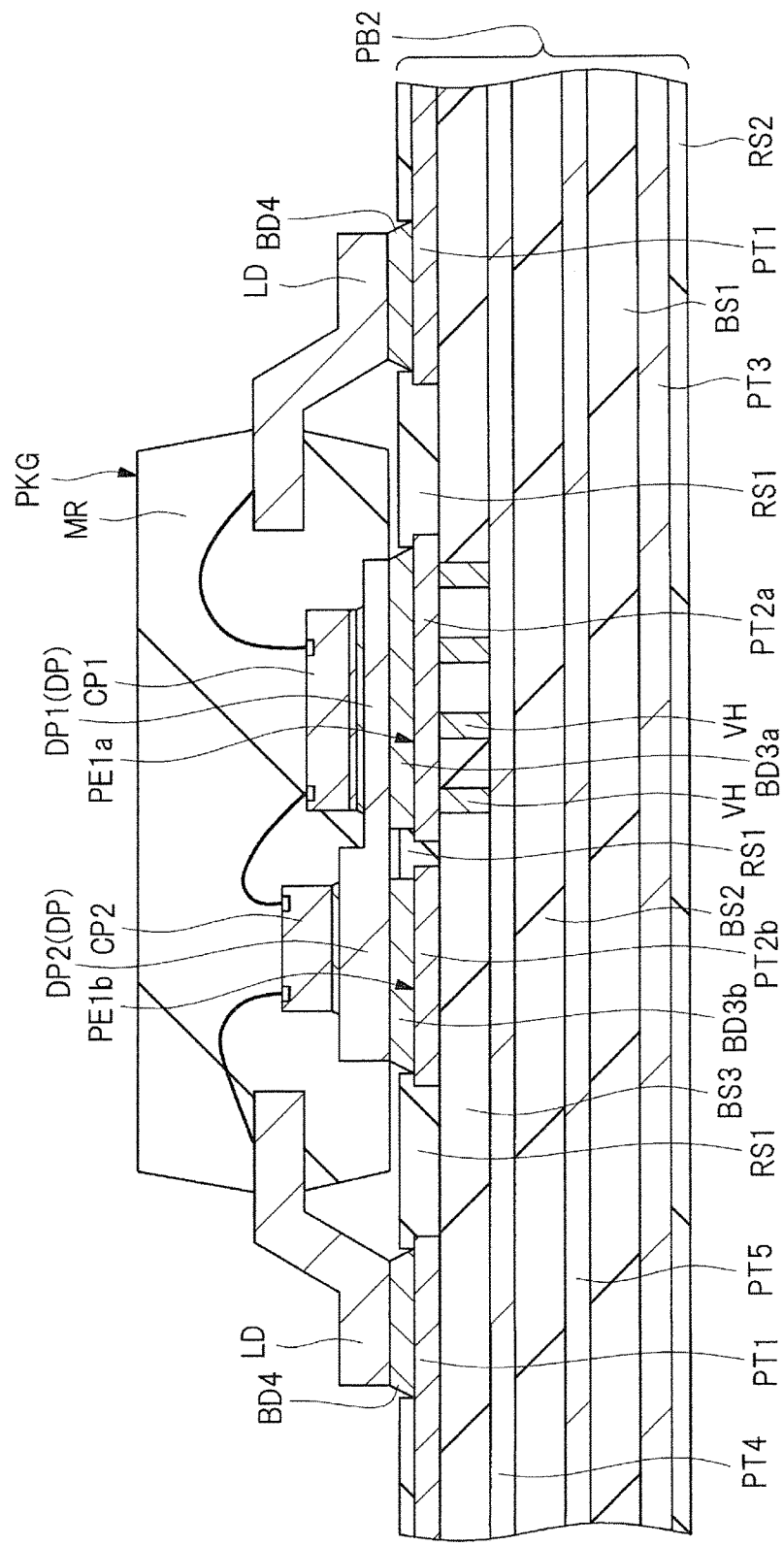
FIG. 34 is a cross-sectional view showing a structure in which the semiconductor device is mounted over the wiring substrate in FIG. 33.

FIG. 33 is a cross-sectional view showing a modification of the wiring substrate PB2 and corresponds to FIG. 28 described above. FIG. 34 is a cross-sectional view showing a structure in which the semiconductor device PKG is mounted (implemented) over the wiring substrate PB2 in FIG. 33 and corresponds to FIG. 29 described above. The wiring substrate PB2 in the modification shown in FIG. 33 will be referred to as a wiring substrate PB2*a* using the reference numeral PB2*a*.

The wiring substrate PB2*a* shown in FIGS. 33 and 34 is different from the wiring substrate PB2 shown in FIGS. 28 and 29 described above in the following point.

That is, the wiring substrate PB2*a* in FIG. 33 has the conductor patterns (PT1, PT2*a*, and PT2*b*) over the upper surface of the wiring substrate PB2*a*, the conductor pattern (PT3) over the lower surface of the wiring substrate PB2*a*, and the conductor patterns (PT4 and PT5) in the inner layers of the wiring substrate PB2*a*. Specifically, the wiring substrate PB2*a* has insulating layers BS1, BS2, and BS3 stacked successively in ascending order, the conductor pattern formed over the upper surface of the insulating layer BS3, the resist layer RS1 formed over the upper surface of the insulating layer BS3 so as to cover the conductor pattern, the conductor pattern formed under the lower surface of the insulating layer BS1, and the resist layer RS2 formed over the lower surface of the insulating layer BS1 so as to cover the conductor pattern. Also, the wiring substrate PB2*a* further has the conductor pattern formed between the insulating layers BS1 and BS2 and the conductor pattern formed between the insulating layers BS2 and BS3.

The conductor pattern formed over the upper surface of the insulating layer BS3, i.e., the conductor patterns over the upper surface of the wiring substrate PB2*a* include the foregoing conductor patterns PT1, PT2*a*, and PT2*b*. The conductor pattern formed over the lower surface of the insulating layer BS, i.e., the conductor pattern over the lower surface of the wiring substrate PB2*a* includes the foregoing conductor pattern PT3. The conductor pattern formed between the insulating layers BS1 and BS2 includes the conductor pattern PT5. The conductor pattern formed between the insulating layers BS2 and BS3 includes the conductor pattern PT4.

In the wiring substrate PB2*a* shown in FIGS. 33 and 34, the conductor pattern PT2*a* over the upper surface of the wiring substrate PB2*a* is electrically coupled to the conductor pattern PT4 in the inner layer of the wiring substrate PB2 via the plurality of via portions VH. Each of the via portions VH is formed of the through hole (through bore) formed in the insulating layer BS 3 and the conductor (conductor film) embedded therein. The plurality of via portions VH which couple the conductor pattern PT2*a* over the upper surface of the wiring substrate PB2*a* to the conductor pattern PT4 in the inner layer of the wiring substrate PB2*a* are provided in the region where the conductor patterns PT2*a* and PT4 overlap each other in plan view. The via portions VH couple the conductor pattern PT2*a* over the upper surface of the wiring substrate PB2*a* to the conductor pattern PT4 in the inner layer of the wiring substrate PB2*a* both electrically and thermally and can function as thermal vias.

The configuration of the wiring substrate PB2*a* shown in FIGS. 33 and 34 is otherwise substantially the same as that of the wiring substrate PB2 shown in FIGS. 28 and 29 described above so that a repeated description thereof is omitted herein. The mounting structure of the semiconductor device PKG shown in FIG. 34 is also substantially the same as that in the case in FIG. 29 described above so that a repeated description thereof is omitted herein.

In the case in FIGS. 33 and 34, the conductor pattern PT2*a* over the upper surface of the wiring substrate PB2 is electrically coupled to the conductor pattern PT4 in the inner layer of the wiring substrate PB2 via the via portions VH. This allows the plurality of via portions VH under the electrode PE1a (conductor pattern PT2a) to function as thermal vias and thus allows the heat transferred from the die pad DP to the electrode PE1a (conductor pattern PT2a) over the upper surface of the wiring substrate PB2 to be transferred to the conductor pattern PT4 in the layer located below that of the electrode PE1a (conductor pattern PT2a) via the plurality of via portions VH. Thus, it is possible to transfer the heat transferred from the semiconductor chip CP1 to the electrode PE1a (conductor pattern PT2a) of the wiring substrate PB2 along the foregoing transfer path HK1 to the lower side of the wiring substrate PB2 and thereby accelerate the heat transfer along the foregoing transfer path HK1. As a result, the heat transfer along the foregoing transfer path HK2 is easily suppressed and accordingly the temperature rise of the semiconductor chip CP2 resulting from the heat generation in the semiconductor chip CP1 can be suppressed. In the case where the semiconductor chip CP1 has the back surface electrode BE, an intended potential (e.g., the power supply potential or the ground potential) can be supplied from the conductor pattern PT4 to the back surface electrode BE of the semiconductor chip CP1 via the plurality of via portions VH, the electrode PE1a (conductor pattern PT2a), the bonding material BD3a, the die pad DP, and the foregoing bonding material BD1. The conductor pattern PT4 can be, e.g., a power supply pattern to which a power supply potential is supplied or a ground pattern to which a ground potential is supplied.

Also, in the case in FIGS. 33 and 34, the conductor pattern PT2a over the upper surface of the wiring substrate PB2a is electrically and thermally coupled to the conductor pattern PT4 in the inner layer of the wiring substrate PB2. In still another form, the conductor pattern PT2a over the upper surface of the wiring substrate PB2a can also be electrically and thermally coupled to the conductor pattern PT5 in the inner layer of the wiring substrate PB2 or to the conductor pattern PT3 in the lowermost layer thereof via the plurality of via portions VH.

Therefore, the coupling provided by the via portions VH in the case in FIGS. 28 and 29 described above and the coupling provided by the via portions VH in the case in FIGS. 33 and 34 can be expressed comprehensively as follows. That is, the electrode PE1a (conductor pattern PT2a) over the upper surface of the wiring substrate (PB2 or PB2a) is electrically coupled to the conductor patterns (PT3 and PT4) in the layers located below that of the electrode PE1a (conductor pattern PT2a) via the plurality of via portions VH disposed under the electrode PE1a (conductor pattern PT2a).

Figure 35:
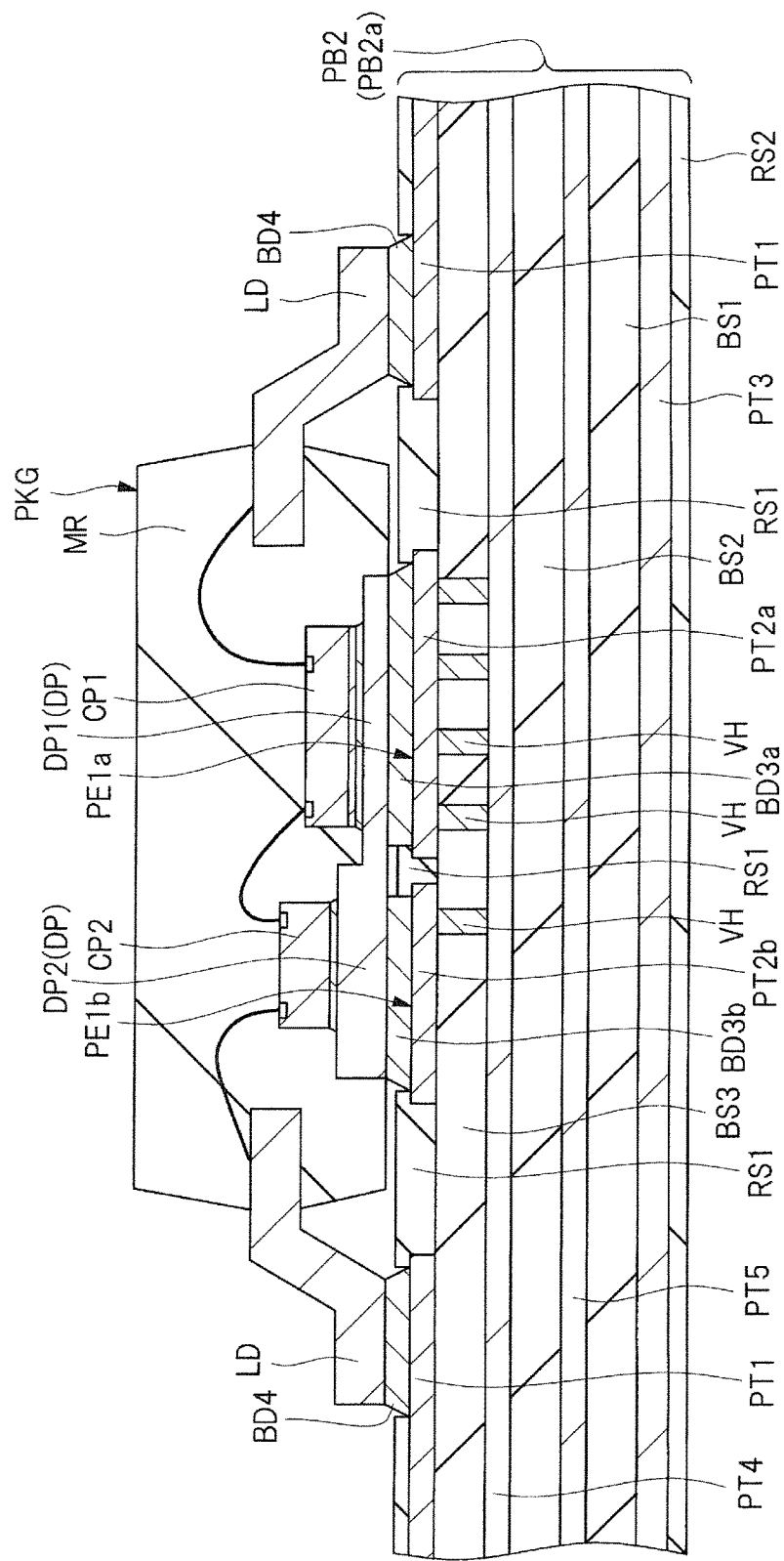
FIG. 35 is a cross-sectional view showing a structure in which the semiconductor device is mounted over the wiring substrate.

FIG. 35 shows the case where, in the structure in FIG. 34, the plurality of via portions VH are provided under the electrode PE1b (conductor pattern PT2b). Note that FIG. 35 is a cross-sectional view showing a structure in which the semiconductor device PKG is mounted (implemented) over the wiring substrate PB2a, which corresponds to FIG. 34 described above.

In the case in FIG. 35, in the wiring substrate PB2a, the plurality of via portions VH are provided under the electrode PE1b (conductor pattern PT2b) and the electrode PE1b (conductor pattern PT2b) is electrically coupled to the conductor pattern PT4 in the layer located below that of the electrode PE1b (conductor pattern PT2b) via the plurality of via portions VH. This allows the plurality of via portions VH under the electrode PE1b (conductor pattern PT2b) to function as the thermal vias. Therefore, it is possible to further transfer the heat transferred from the die pad DP to the electrode PE1b (conductor pattern PT2b) over the upper surface of the wiring substrate PB2 via the bonding material BD3b to the lower-layer conductor pattern PT4 via the plurality of via portions VH.

While the invention achieved by the present inventors has been specifically described heretofore on the basis of the embodiment thereof, the present invention is not limited to the foregoing embodiment. It will be appreciated that various changes and modifications can be made in the invention within the scope not departing from the gist thereof.

For example, the foregoing wiring substrates PB2 and PB2a exert particularly significant effects when applied to the case where the foregoing semiconductor device PKG (including also the semiconductor devices PKG1 and PKG2 in the modifications) is mounted thereover. However, the foregoing wiring substrates PB2 and PB2a are also effective even when applied to the case where the semiconductor device PKG201 in the second studied example in FIG. 20 described above is mounted thereover. The heat transfer from the semiconductor chip CP201 to the semiconductor chip CP202 via the wiring substrate can more reliably be suppressed or inhibited in the case where the semiconductor device PKG201 is mounted over the foregoing wiring substrate PB2 or PB2a than in the case where the semiconductor device PKG201 is mounted over the foregoing wiring substrate PB1. Therefore, it is possible to suppress the temperature rise of the semiconductor chip CP202 resulting from the heat generation in the semiconductor chip CP201.

Additionally, a part of the content of the description of the foregoing embodiment is shown below.

(Note 1)

An electronic device including: a wiring substrate; and a semiconductor device mounted over a first main surface of the wiring substrate, wherein the semiconductor device includes:

a conductive chip mounting portion having a second main surface and a third main surface opposite to the second main surface;

a first semiconductor chip mounted over the second main surface of the chip mounting portion;

a second semiconductor chip mounted over the second main surface of the chip mounting portion; and a sealing body sealing therein the first and second semiconductor chips and at least a part of the chip mounting portion, wherein an amount of heat generated in the first semiconductor chip during an operation thereof is larger than an amount of heat generated in the second semiconductor chip during an operation thereof, wherein the third main surface of the chip mounting portion of the semiconductor device is exposed from the sealing body, wherein the wiring substrate has first and second electrodes formed over the first main surface and isolated from each other, wherein a first portion of the chip mounting portion is bonded to the first electrode via a first conductive bonding layer, wherein a second portion of the chip mounting portion is bonded to the second electrode via a second conductive bonding layer, wherein the first semiconductor chip is mounted over the first portion of the chip mounting portion, and wherein the second semiconductor chip is mounted over the second portion of the chip mounting portion.

What is claimed is:

1. A semiconductor device, comprising:
a chip mounting portion;
a first semiconductor chip mounted over the chip mounting portion and including a power transistor;
a second semiconductor chip mounted over the chip mounting portion to control the first semiconductor chip; and
a sealing body sealing therein the first and second semiconductor chips and at least a part of the chip mounting portion,
wherein a first thickness of a first portion of the chip mounting portion over which the first semiconductor chip is mounted is smaller than a second thickness of a second portion of the chip mounting portion over which the second semiconductor chip is mounted,
wherein the first semiconductor chip is mounted over the chip mounting portion via a first junction layer, and
wherein the second semiconductor chip is mounted over the chip mounting portion via a second junction layer.

2. The semiconductor device according to claim 1, further comprising:
a plurality of leads; and
a plurality of wires,
wherein the sealing body seals therein the wires and a part of each of the leads, and
wherein the wires include a plurality of first wires electrically coupling a plurality of first pad electrodes of the first semiconductor chip to a plurality of first leads which are among the leads and a plurality of second wires electrically coupling a plurality of second pad electrodes of the second semiconductor chip to a plurality of second leads which are among the leads.

3. The semiconductor device according to claim 2,
wherein the second thickness of the second portion is equal to a third thickness of each of the leads.

4. The semiconductor device according to claim 1,
wherein a fourth thickness of the first semiconductor chip is smaller than a fifth thickness of the second semiconductor chip.

5. The semiconductor device according to claim 1,
wherein a sixth thickness of the first junction layer between the chip mounting portion and the first semiconductor chip is smaller than a seventh thickness of the second junction layer between the chip mounting portion and the second semiconductor chip.

6. The semiconductor device according to claim 1,
wherein a heat conductivity of the first junction layer is higher than a heat conductivity of the second junction layer.

7. The semiconductor device according to claim 2,
wherein each of the plurality of leads passes through a respective side surface of the sealing body such that said part of each lead is embedded within the sealing body and such that a second part of each lead extends from the respective side surface of the sealing body.

8. A semiconductor device, comprising:
a chip mounting portion;
a first semiconductor chip mounted over the chip mounting portion;
a second semiconductor chip mounted over the chip mounting portion; and
a sealing body sealing therein the first and second semiconductor chips and at least a part of the chip mounting portion,
wherein an amount of heat generated in the first semiconductor chip during an operation thereof is larger than an amount of heat generated in the second semiconductor chip during an operation thereof,
wherein a thickness of a first portion of the chip mounting portion over which the first semiconductor chip is mounted is smaller than a thickness of a second portion of the chip mounting portion over which the second semiconductor chip is mounted,
wherein the first semiconductor chip is mounted over the chip mounting portion via a first junction layer, and
wherein the second semiconductor chip is mounted over the chip mounting portion via a second junction layer.

9. The semiconductor device according to claim 8, further comprising:
a plurality of leads; and
a plurality of wires,
wherein the sealing body seals therein a part of each of the leads and the wires, and
wherein the wires include a plurality of first wires electrically coupling a plurality of first pad electrodes of the first semiconductor chip to a plurality of first leads which are among the leads and a plurality of second wires electrically coupling a plurality of second pad electrodes of the second semiconductor chip to a plurality of second leads which are among the leads.

10. The semiconductor device according to claim 9,
wherein the thickness of the second portion is equal to a thickness of each of the leads.

11. The semiconductor device according to claim 9,
wherein each of the plurality of leads passes through a respective side surface of the sealing body such that said part of each lead is embedded within the sealing body and such that a second part of each lead extends from the respective side surface of the sealing body.

12. An electronic device, comprising:
a wiring substrate; and
a semiconductor device mounted over a first main surface of the wiring substrate,
wherein the semiconductor device includes:
a chip mounting portion having a second main surface and a third main surface opposite to the second main surface;
a first semiconductor chip mounted over the second main surface of the chip mounting portion and including a power transistor;
a second semiconductor chip mounted over the second main surface of the chip mounting portion to control the first semiconductor chip; and
a sealing body sealing therein the first and second semiconductor chips and at least a part of the chip mounting portion,
wherein the third main surface of the chip mounting portion of the semiconductor device is exposed from the sealing body,
wherein the wiring substrate has first and second electrodes formed over the first main surface and isolated from each other,
wherein a first portion of the chip mounting portion is bonded to the first electrode via a first conductive bonding layer,
wherein a second portion of the chip mounting portion is bonded to the second electrode via a second conductive bonding layer,
wherein the first semiconductor chip is mounted over the first portion of the chip mounting portion,
wherein the second semiconductor chip is mounted over the second portion of the chip mounting portion, wherein the wiring substrate further has a conductor pattern in a layer located below that of each of the first and second electrodes, and wherein the first electrode is electrically coupled to the conductor pattern via a plurality of first via portions disposed under the first electrode.

13. The electronic device according to claim 12, wherein, in plan view, the first semiconductor chip has at least a part thereof overlapping the first electrode and does not overlap the second electrode, and wherein, in plan view, the second semiconductor chip has at least a part thereof overlapping the second electrode and does not overlap the first electrode.

14. The electronic device according to claim 12, wherein, in plan view, the first semiconductor chip is within a perimeter of the first electrode, and wherein, in plan view, the second semiconductor chip is within a perimeter of the second electrode.

15. The electronic device according to claim 12, wherein a first thickness of the chip mounting portion immediately under the first semiconductor chip is smaller than a second thickness of the chip mounting portion immediately under the second semiconductor chip.

16. The electronic device according to claim 15, wherein the semiconductor device further includes:

a plurality of leads; and a plurality of wires, wherein the sealing body seals therein at least a part of each of the leads and the wires, wherein the wires include a plurality of first wires electrically coupling a plurality of first pad electrodes of the first semiconductor chip to a plurality of first leads which are among the leads and a plurality of second wires electrically coupling a plurality of second pad electrodes of the second semiconductor chip to a plurality of second leads which are among the leads, wherein the wiring substrate further has a plurality of third electrodes formed over the first main surface, and wherein the leads are bonded individually to the third electrodes.

17. The electronic device according to claim 16, wherein the second thickness of the second portion is equal to a third thickness of each of the leads.

18. The electronic device according to claim 12, wherein, under the second electrode, a via portion which electrically couples the second electrode to the conductor pattern is not formed.

19. The electronic device according to claim 12, wherein the second electrode is electrically coupled to the conductor pattern via a plurality of second via portions disposed under the second electrode.

20. The semiconductor device according to claim 12, wherein the chip mounting portion is a metal die pad, wherein the first semiconductor chip is mounted over a first region of an upper surface of the metal die pad, wherein the second semiconductor chip is mounted over a second region of the upper surface of the metal die pad, and wherein the first and second regions are adjacent in plan view.

* * * * *